US012573817B2

(12) United States Patent
Fujii et al.

(10) Patent No.:    US 12,573,817 B2
(45) Date of Patent:        Mar. 10, 2026

(54) EXPOSURE SYSTEM, EXPOSURE METHOD, AND ELECTRONIC DEVICE MANUFACTURING METHOD

(71) Applicant: Gigaphoton Inc., Tochigi (JP)

(72) Inventors: Koichi Fujii, Oyama (JP); Osamu Wakabayashi, Oyama (JP)

(73) Assignee: Gigaphoton Inc., Tochigi (JP)

( * ) Notice:  Subject to any disclaimer, the term of this patent is extended or adjusted under 35 U.S.C. 154(b) by 634 days.

(21) Appl. No.: 18/061,857

(22) Filed: Dec. 5, 2022

(65) Prior Publication Data

US 2023/0098685 A1     Mar. 30, 2023

Related U.S. Application Data

(63) Continuation of application No. PCT/JP2020/026018, filed on Jul. 2, 2020.

(51) Int. Cl.
*G03F 7/20*        (2006.01)
*G03F 7/00*        (2006.01)
        (Continued)

(52) U.S. Cl.
CPC ............ *H01S 5/12* (2013.01); *G03F 7/70025* (2013.01); *G03F 7/70575* (2013.01);
        (Continued)

(58) Field of Classification Search
CPC ... H01S 5/12; H01S 3/225; H01S 5/50; H01S 3/139; H01S 3/1392; G03F 7/70025;
        (Continued)

(56) References Cited

U.S. PATENT DOCUMENTS

2005/0083983 A1    4/2005  Sandstrom et al.
2005/0286598 A1    12/2005  Sandstrom et al.
        (Continued)

FOREIGN PATENT DOCUMENTS

CN        110249261 A      9/2019
JP        H07-58393 A      3/1995
        (Continued)

OTHER PUBLICATIONS

An Office Action mailed by China National Intellectual Property Administration on Mar. 21, 2025, which corresponds to Chinese Patent Application No. 202080101965.3 and is related to U.S. Appl. No. 18/061,857; with English language translation.
        (Continued)

*Primary Examiner* — Mesfin T Asfaw
(74) *Attorney, Agent, or Firm* — Studebaker Brackett PLLC

(57)        ABSTRACT

An exposure method includes reading data indicating a relation between parameters and a wavelength difference between a first pulse laser beam and a second pulse laser beam, the parameters being related to exposure conditions under which a semiconductor wafer is exposed to a plurality of pulse laser beams including the first and second pulse laser beams, determining a target value of the wavelength difference based on the data and command values of the parameters; determining a first wavelength of the first pulse laser beam and a second wavelength of the second pulse laser beam based on the target value; outputting a wavelength setting signal to a laser apparatus to cause emission of the pulse laser beams including the first pulse laser beam having the first wavelength and the second pulse laser beam having the second wavelength; and exposing the semiconductor wafer to the pulse laser beams.

20 Claims, 29 Drawing Sheets

210 EXPOSURE CONTROL PROCESSOR
CPU 211    MEMORY 212
201 ILLUMINATION OPTICAL SYSTEM
RT RETICLE STAGE
202 PROJECTION OPTICAL SYSTEM
WT WORKPIECE TABLE
LASER CONTROL PROCESSOR 130
PULSE LASER BEAM
200 EXPOSURE APPARATUS
100 LASER APPARATUS

(51) Int. Cl.
| | |
|---|---|
| *H01S 3/225* | (2006.01) |
| *H01S 5/12* | (2021.01) |
| *H01S 5/50* | (2006.01) |

(52) U.S. Cl.
CPC .......... *G03F 7/70641* (2013.01); *H01S 3/225* (2013.01); *H01S 5/50* (2013.01)

(58) Field of Classification Search
CPC ............. G03F 7/70575; G03F 7/70641; G03F 7/70041; G03F 7/20
See application file for complete search history.

(56) References Cited

U.S. PATENT DOCUMENTS

| | | | |
|---|---|---|---|
| 2013/0137050 A1* | 5/2013 | Takahashi | G03F 7/2022 |
| | | | 702/182 |
| 2013/0215916 A1 | 8/2013 | Kakizaki et al. | |
| 2015/0070673 A1 | 3/2015 | Lalovic et al. | |
| 2017/0338619 A1 | 11/2017 | Onose et al. | |
| 2019/0006817 A1 | 1/2019 | Onose et al. | |
| 2019/0363504 A1 | 11/2019 | Onose | |

FOREIGN PATENT DOCUMENTS

| | | | |
|---|---|---|---|
| JP | 2003-086497 A | 3/2003 |
| JP | 2007-005538 A | 1/2007 |
| JP | 2013-062484 A | 4/2013 |
| JP | 2019-091064 A | 6/2019 |
| WO | 2016/142996 A1 | 9/2016 |
| WO | 2017/175561 A1 | 10/2017 |
| WO | 2019/079010 A1 | 4/2019 |

OTHER PUBLICATIONS

International Search Report issued in PCT/JP2020/026018; mailed Sep. 8, 2020.

International Preliminary Report On Patentability issued in PCT/JP2020/026018; issued Dec. 13, 2022.

Hongwei, G.; "Fundamentals of Electronic Packaging Process and Equipment Technology"; Jul. 31, 2017; pp. 128-131.

An Office Action mailed by China National Intellectual Property Administration on Sep. 26, 2025, which corresponds to Chinese Patent Application No. 202080101965.3 and is related to U.S. Appl. No. 18/061,857; with English language translation.

* cited by examiner

Figure 6:
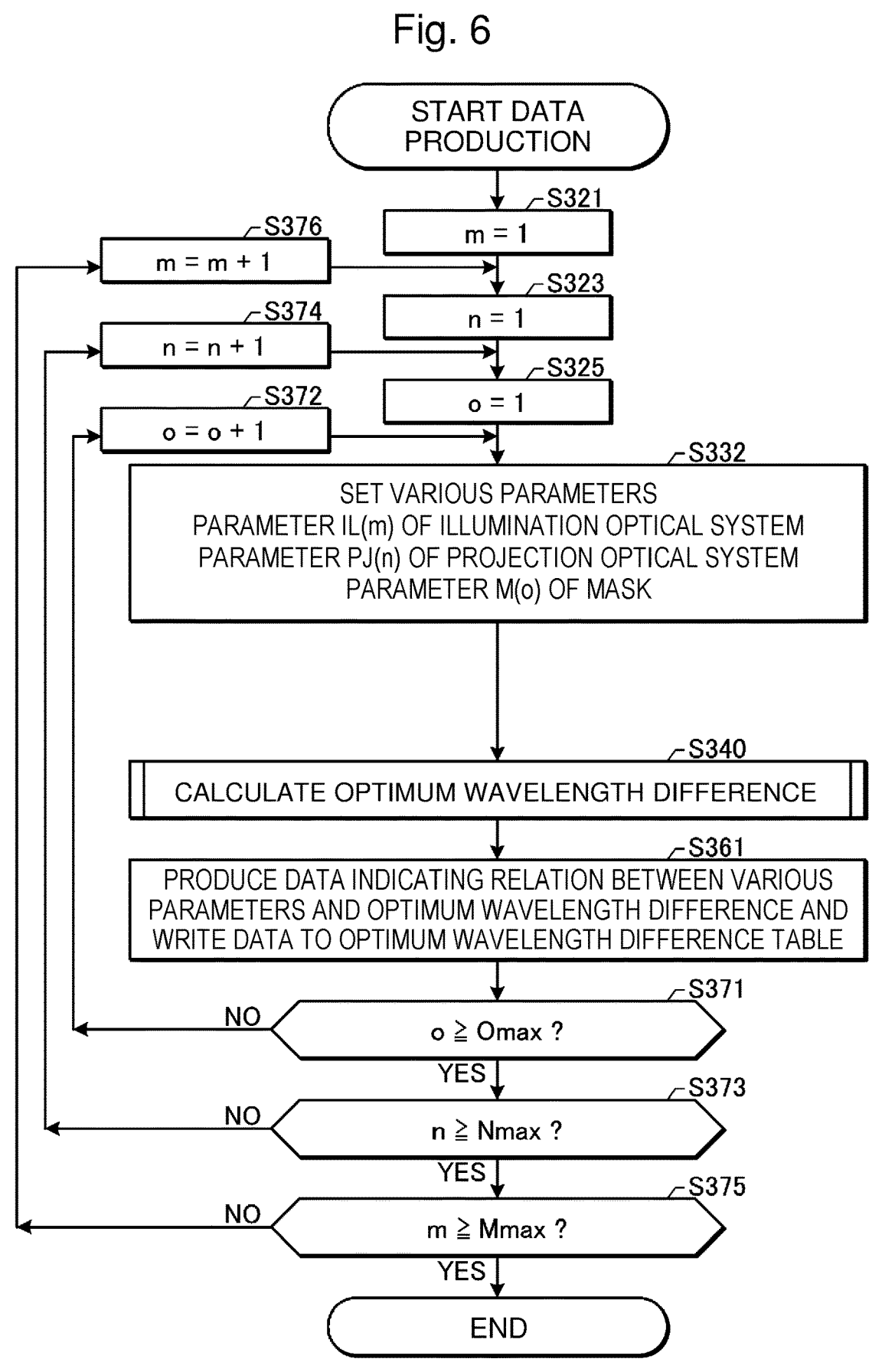

START DATA PRODUCTION

S321
m = 1

S376
m = m + 1

S323
n = 1

S374
n = n + 1

S325
o = 1

S372
o = o + 1

S332
SET VARIOUS PARAMETERS
PARAMETER IL(m) OF ILLUMINATION OPTICAL SYSTEM
PARAMETER PJ(n) OF PROJECTION OPTICAL SYSTEM
PARAMETER M(o) OF MASK

S340
CALCULATE OPTIMUM WAVELENGTH DIFFERENCE

S361
PRODUCE DATA INDICATING RELATION BETWEEN VARIOUS
PARAMETERS AND OPTIMUM WAVELENGTH DIFFERENCE AND
WRITE DATA TO OPTIMUM WAVELENGTH DIFFERENCE TABLE

S371
NO     $o \geqq Omax$ ?
YES

S373
NO     $n \geqq Nmax$ ?
YES

S375
NO     $m \geqq Mmax$ ?
YES

END

Fig. 7

OPTIMUM WAVELENGTH DIFFERENCE TABLE

| VARIOUS PARAMETERS | | | OPTIMUM WAVELENGTH DIFFERENCE $\delta\lambda b(m,n,o)$ | MAXIMUM FOCAL POINT DEPTH DOFmax(m,n,o) |
|---|---|---|---|---|
| IL(m) | PJ(n) | M(o) | | |
| IL(1) | PJ(1) | M(1) | $\delta\lambda b(1,1,1)$ | DOFmax(1,1,1) |
| IL(1) | PJ(1) | M(2) | $\delta\lambda b(1,1,2)$ | DOFmax(1,1,2) |
| ... | ... | ... | ... | ... |
| IL(1) | PJ(1) | M(Omax) | $\delta\lambda b(1,1,Omax)$ | DOFmax(1,1,Omax) |
| IL(1) | PJ(2) | M(1) | $\delta\lambda b(1,2,1)$ | DOFmax(1,2,1) |
| IL(1) | PJ(2) | M(2) | $\delta\lambda b(1,2,2)$ | DOFmax(1,2,2) |
| ... | ... | ... | ... | ... |
| IL(1) | PJ(2) | M(Omax) | $\delta\lambda b(1,2,Omax)$ | DOFmax(1,2,Omax) |
| ... | ... | ... | ... | ... |
| IL(1) | PJ(Nmax) | M(1) | $\delta\lambda b(1,Nmax,1)$ | DOFmax(1,Nmax,1) |
| IL(1) | PJ(Nmax) | M(2) | $\delta\lambda b(1,Nmax,2)$ | DOFmax(1,Nmax,2) |
| ... | ... | ... | ... | ... |
| IL(1) | PJ(Nmax) | M(Omax) | $\delta\lambda b(1,Nmax, Omax)$ | DOFmax(1,Nmax, Omax) |
| ... | ... | ... | ... | ... |
| IL(Mmax) | PJ(Nmax) | M(Omax) | $\delta\lambda b(Mmax,Nmax, Omax)$ | DOFmax(Mmax,Nmax, Omax) |

Fig. 8

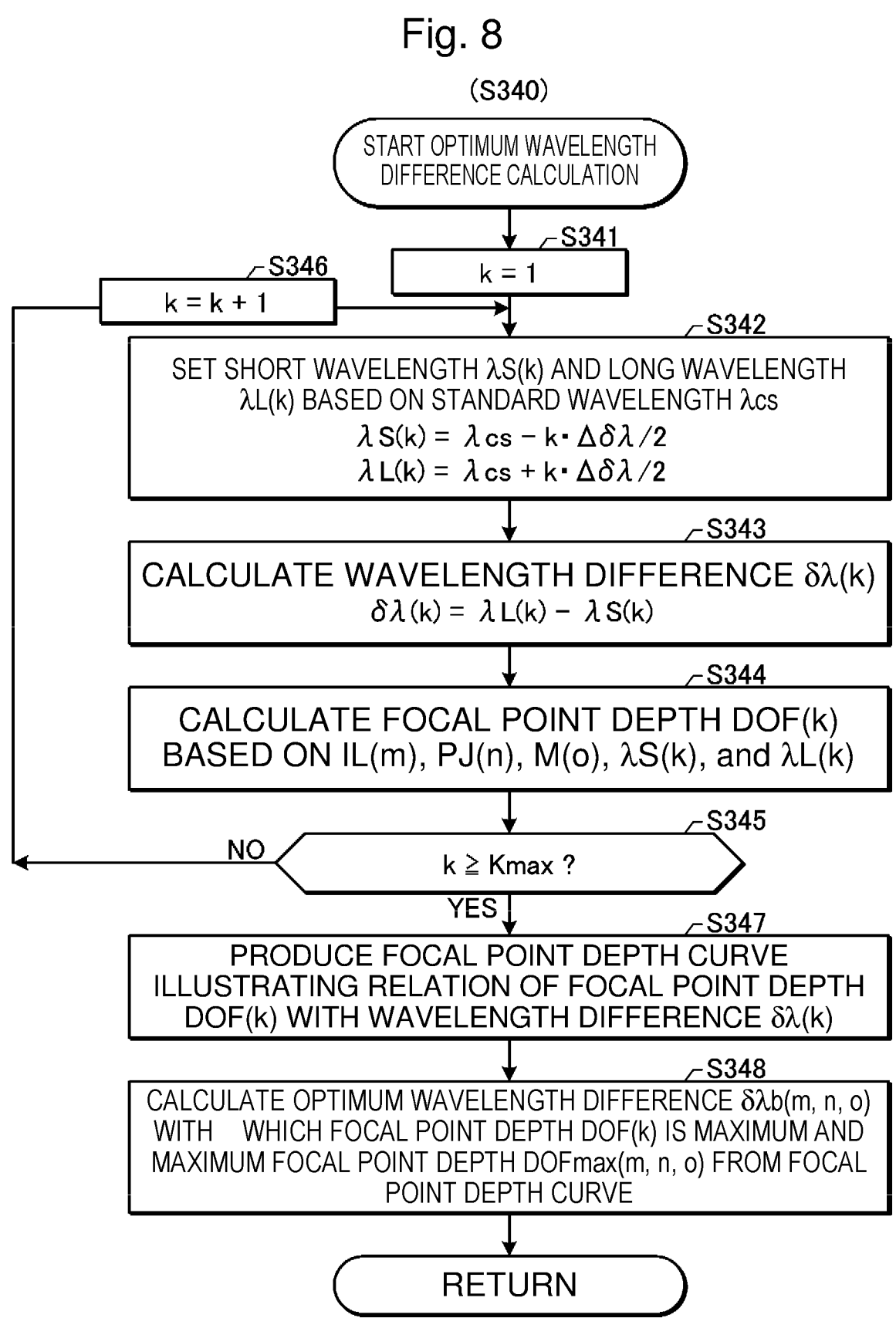

(S340)

START OPTIMUM WAVELENGTH
DIFFERENCE CALCULATION

S341 k = 1

S346 k = k + 1

S342

SET SHORT WAVELENGTH $\lambda S(k)$ AND LONG WAVELENGTH
$\lambda L(k)$ BASED ON STANDARD WAVELENGTH $\lambda cs$ $$\lambda S(k) = \lambda cs - k \cdot \Delta \delta \lambda / 2$$
$$\lambda L(k) = \lambda cs + k \cdot \Delta \delta \lambda / 2$$

S343

CALCULATE WAVELENGTH DIFFERENCE $\delta \lambda (k)$
$$\delta \lambda (k) = \lambda L(k) - \lambda S(k)$$

S344

CALCULATE FOCAL POINT DEPTH DOF(k)
BASED ON IL(m), PJ(n), M(o), $\lambda S(k)$, and $\lambda L(k)$

S345

NO          $k \geq Kmax$ ?

YES

S347

PRODUCE FOCAL POINT DEPTH CURVE
ILLUSTRATING RELATION OF FOCAL POINT DEPTH
DOF(k) WITH WAVELENGTH DIFFERENCE $\delta \lambda (k)$

S348

CALCULATE OPTIMUM WAVELENGTH DIFFERENCE $\delta \lambda b(m, n, o)$
WITH   WHICH FOCAL POINT DEPTH DOF(k) IS MAXIMUM AND
MAXIMUM FOCAL POINT DEPTH DOFmax(m, n, o) FROM FOCAL
POINT DEPTH CURVE

RETURN

Fig. 13

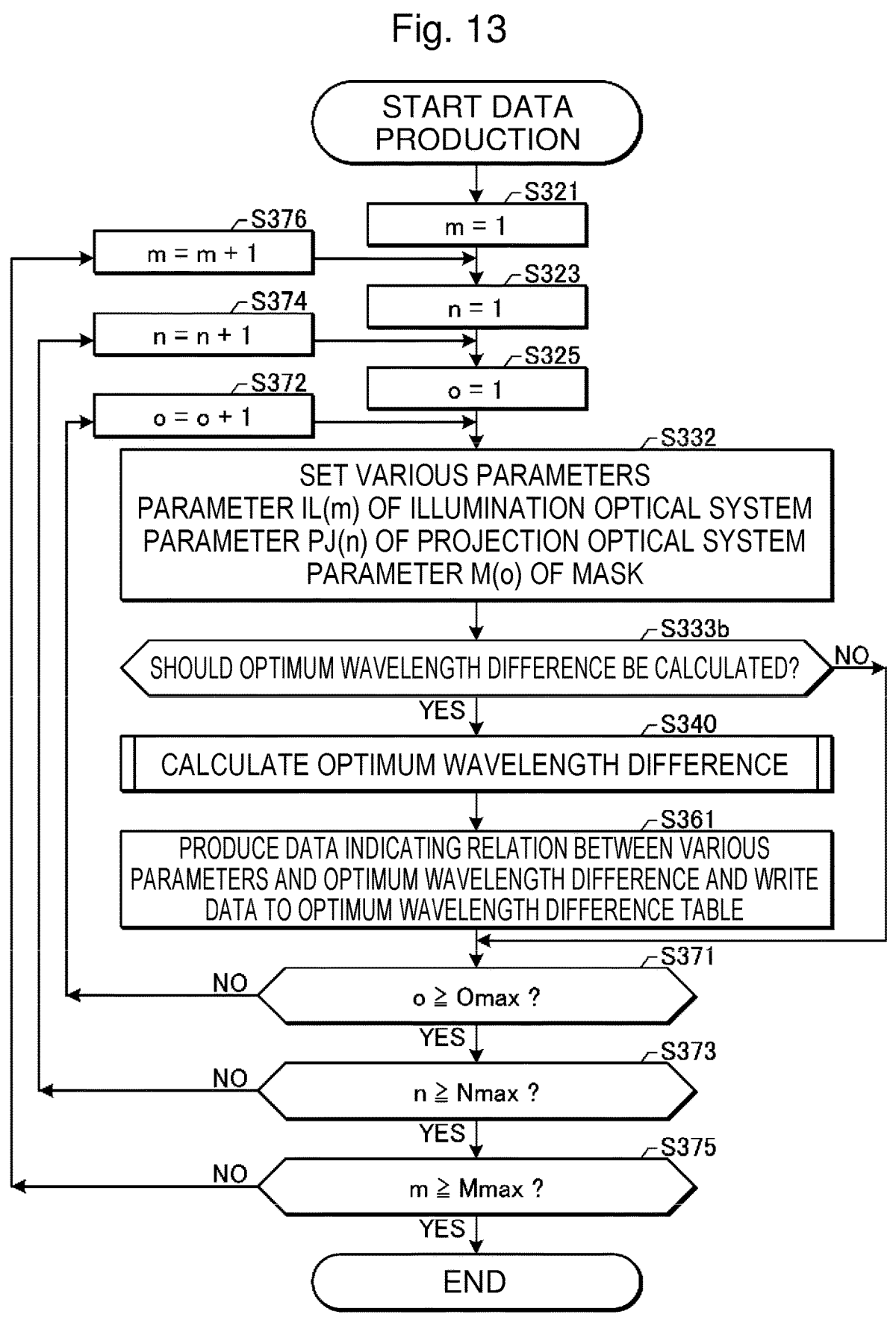

START DATA PRODUCTION

S321
m = 1

S376
m = m + 1

S323
n = 1

S374
n = n + 1

S325
o = 1

S372
o = o + 1

S332
SET VARIOUS PARAMETERS
PARAMETER IL(m) OF ILLUMINATION OPTICAL SYSTEM
PARAMETER PJ(n) OF PROJECTION OPTICAL SYSTEM
PARAMETER M(o) OF MASK

S333b
SHOULD OPTIMUM WAVELENGTH DIFFERENCE BE CALCULATED? —NO

YES

S340
CALCULATE OPTIMUM WAVELENGTH DIFFERENCE

S361
PRODUCE DATA INDICATING RELATION BETWEEN VARIOUS
PARAMETERS AND OPTIMUM WAVELENGTH DIFFERENCE AND WRITE
DATA TO OPTIMUM WAVELENGTH DIFFERENCE TABLE

S371
NO ← o ≥ Omax ?

YES

S373
NO ← n ≥ Nmax ?

YES

S375
NO ← m ≥ Mmax ?

YES

END

Fig. 14

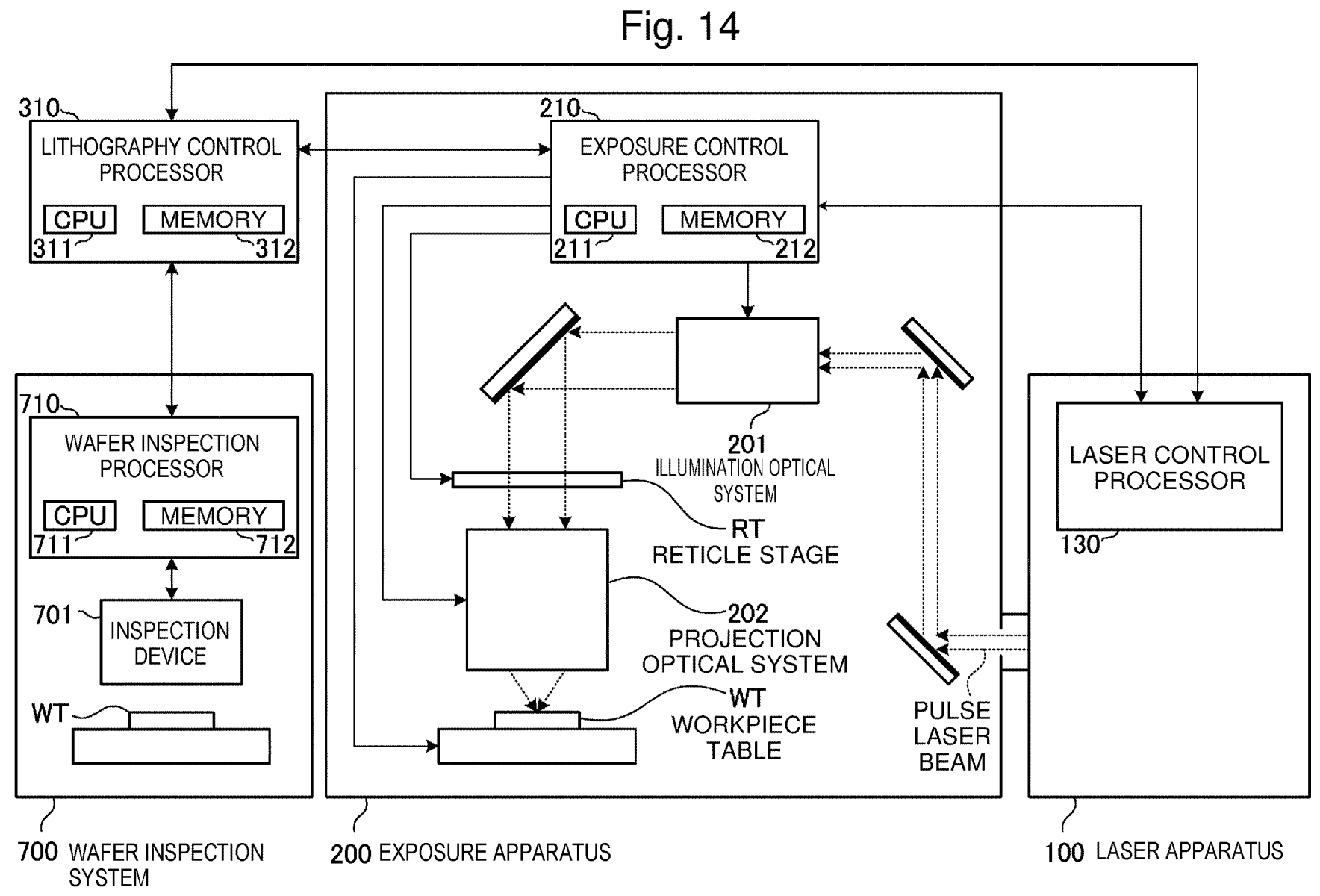

100 LASER APPARATUS

LASER CONTROL PROCESSOR

130

PULSE LASER BEAM

201 ILLUMINATION OPTICAL SYSTEM

RT RETICLE STAGE

202 PROJECTION OPTICAL SYSTEM

WT WORKPIECE TABLE

210 EXPOSURE CONTROL PROCESSOR

CPU 211

MEMORY 212

200 EXPOSURE APPARATUS

310 LITHOGRAPHY CONTROL PROCESSOR

CPU 311

MEMORY 312

710 WAFER INSPECTION PROCESSOR

CPU 711

MEMORY 712

701 INSPECTION DEVICE

WT

700 WAFER INSPECTION SYSTEM

Figure 16:
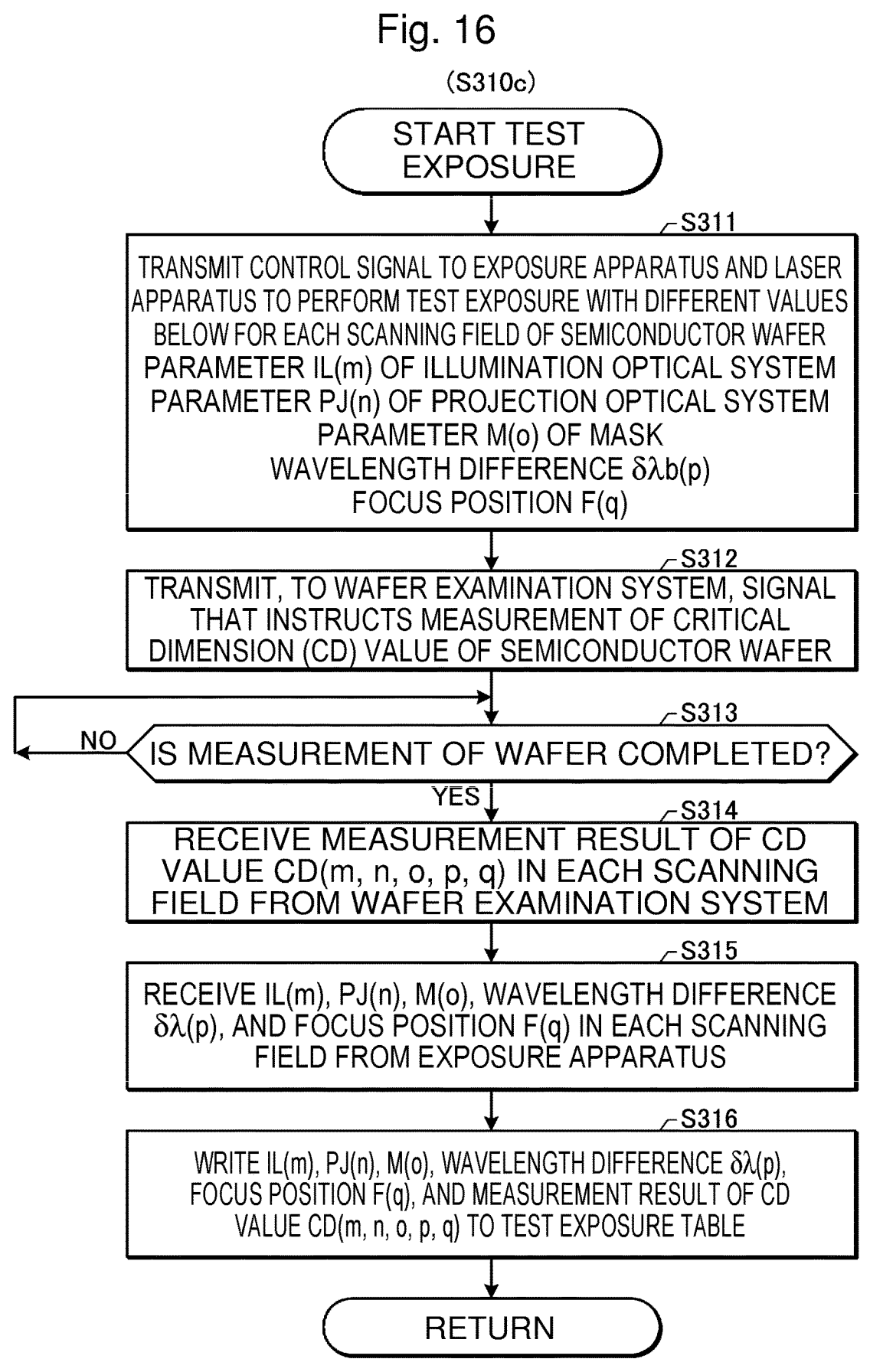

```
┌─────────────────────┐
│    START TEST       │
│    EXPOSURE         │
└─────────────────────┘
```

S311

TRANSMIT CONTROL SIGNAL TO EXPOSURE APPARATUS AND LASER APPARATUS TO PERFORM TEST EXPOSURE WITH DIFFERENT VALUES BELOW FOR EACH SCANNING FIELD OF SEMICONDUCTOR WAFER
PARAMETER IL(m) OF ILLUMINATION OPTICAL SYSTEM
PARAMETER PJ(n) OF PROJECTION OPTICAL SYSTEM
PARAMETER M(o) OF MASK
WAVELENGTH DIFFERENCE $\delta\lambda b(p)$
FOCUS POSITION F(q)

S312

TRANSMIT, TO WAFER EXAMINATION SYSTEM, SIGNAL THAT INSTRUCTS MEASUREMENT OF CRITICAL DIMENSION (CD) VALUE OF SEMICONDUCTOR WAFER

S313

NO ← IS MEASUREMENT OF WAFER COMPLETED?

YES

S314

RECEIVE MEASUREMENT RESULT OF CD VALUE CD(m, n, o, p, q) IN EACH SCANNING FIELD FROM WAFER EXAMINATION SYSTEM

S315

RECEIVE IL(m), PJ(n), M(o), WAVELENGTH DIFFERENCE $\delta\lambda(p)$, AND FOCUS POSITION F(q) IN EACH SCANNING FIELD FROM EXPOSURE APPARATUS

S316

WRITE IL(m), PJ(n), M(o), WAVELENGTH DIFFERENCE $\delta\lambda(p)$, FOCUS POSITION F(q), AND MEASUREMENT RESULT OF CD VALUE CD(m, n, o, p, q) TO TEST EXPOSURE TABLE

```
┌─────────────────────┐
│      RETURN         │
└─────────────────────┘
```

Fig. 17

TEST EXPOSURE TABLE

| VARIOUS PARAMETERS | | | WAVELENGTH DIFFERENCE $\delta\lambda(p)$ | FOCUS POSITION $F(q)$ | CD VALUE $CD(m,n,o,p,q)$ |
|---|---|---|---|---|---|
| $IL(m)$ | $PJ(n)$ | $M(o)$ | | | |
| $IL(1)$ | $PJ(1)$ | $M(1)$ | $\delta\lambda(1)$ | $F(1)$ | $CD(1,1,1,1,1)$ |
| $IL(1)$ | $PJ(1)$ | $M(1)$ | $\delta\lambda(1)$ | $F(2)$ | $CD(1,1,1,1,2)$ |
| $\cdots$ | $\cdots$ | $\cdots$ | $\cdots$ | $\cdots$ | $\cdots$ |
| $IL(1)$ | $PJ(1)$ | $M(1)$ | $\delta\lambda(1)$ | $F(Qmax)$ | $CD(1,1,1,1,Qmax)$ |
| $IL(1)$ | $PJ(1)$ | $M(1)$ | $\delta\lambda(2)$ | $F(1)$ | $CD(1,1,1,2,1)$ |
| $IL(1)$ | $PJ(1)$ | $M(1)$ | $\delta\lambda(2)$ | $F(2)$ | $CD(1,1,1,2,2)$ |
| $\cdots$ | $\cdots$ | $\cdots$ | $\cdots$ | $\cdots$ | $\cdots$ |
| $IL(1)$ | $PJ(1)$ | $M(1)$ | $\delta\lambda(2)$ | $F(Qmax)$ | $CD(1,1,1,2,Qmax)$ |
| $\cdots$ | $\cdots$ | $\cdots$ | $\cdots$ | $\cdots$ | $\cdots$ |
| $IL(1)$ | $PJ(1)$ | $M(1)$ | $\delta\lambda(Pmax)$ | $F(1)$ | $CD(1,1,1,Pmax,1)$ |
| $IL(1)$ | $PJ(1)$ | $M(1)$ | $\delta\lambda(Pmax)$ | $F(2)$ | $CD(1,1,1,Pmax,2)$ |
| $\cdots$ | $\cdots$ | $\cdots$ | $\cdots$ | $\cdots$ | $\cdots$ |
| $IL(1)$ | $PJ(1)$ | $M(1)$ | $\delta\lambda(Pmax)$ | $F(Qmax)$ | $CD(1,1,1,Pmax,Qmax)$ |
| $\cdots$ | $\cdots$ | $\cdots$ | $\cdots$ | $\cdots$ | $\cdots$ |
| $IL(Mmax)$ | $PJ(Nmax)$ | $M(Omax)$ | $\delta\lambda(Pmax)$ | $F(Qmax)$ | $CD(Mmax,Nmax,Omax,Pmax,Qmax)$ |

FOCUS CURVE

Fig. 22

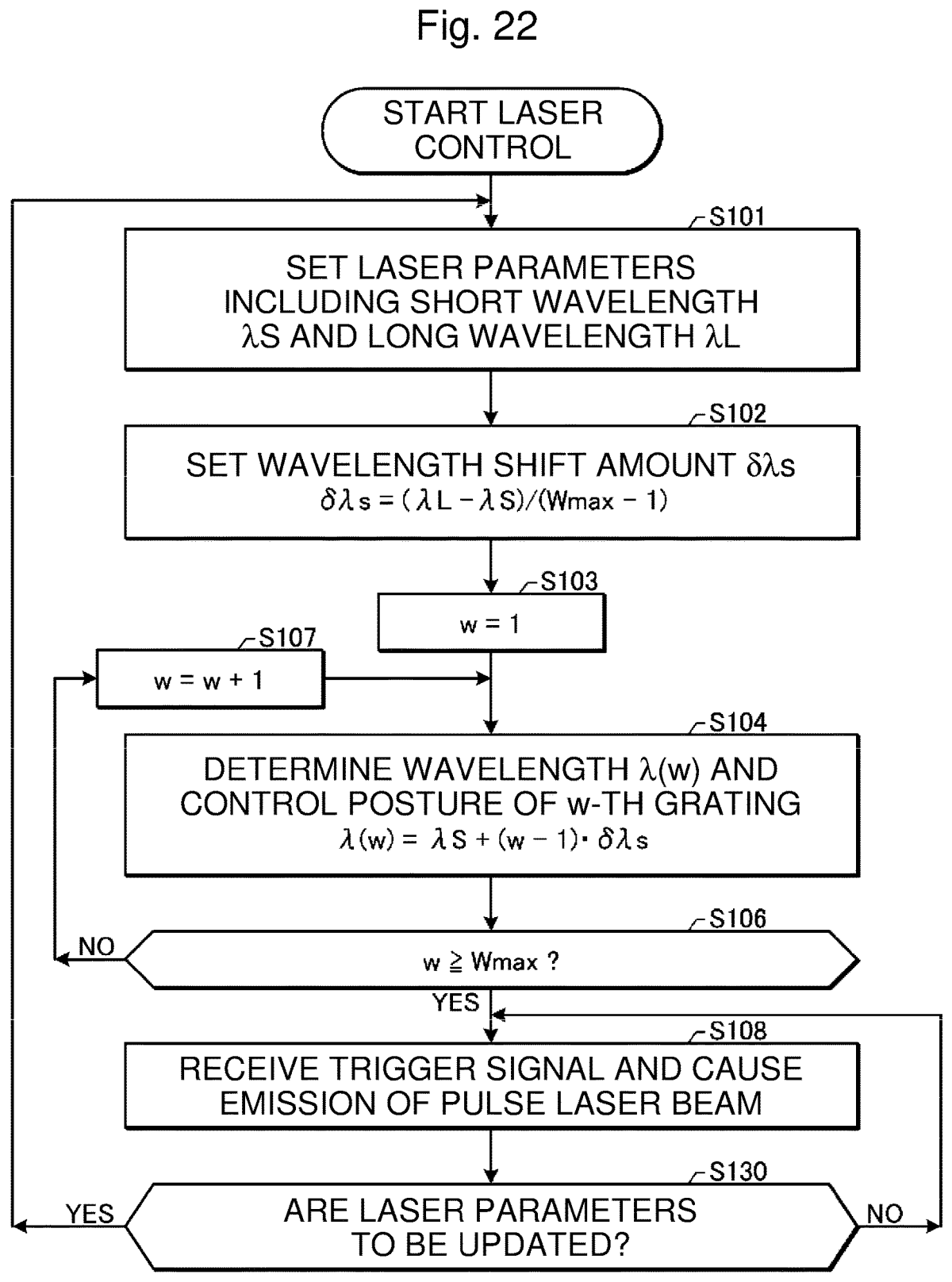

START LASER CONTROL

S101

SET LASER PARAMETERS
INCLUDING SHORT WAVELENGTH
λS AND LONG WAVELENGTH λL

S102

SET WAVELENGTH SHIFT AMOUNT $\delta\lambda s$
$$\delta\lambda s = (\lambda L - \lambda S)/(Wmax - 1)$$

S103 w = 1

S107 w = w + 1

S104

DETERMINE WAVELENGTH λ(w) AND
CONTROL POSTURE OF w-TH GRATING
$$\lambda(w) = \lambda S + (w - 1) \cdot \delta\lambda s$$

S106

NO    w ≥ Wmax ?

YES

S108

RECEIVE TRIGGER SIGNAL AND CAUSE
EMISSION OF PULSE LASER BEAM

S130

YES    ARE LASER PARAMETERS
TO BE UPDATED?    NO

Fig. 26
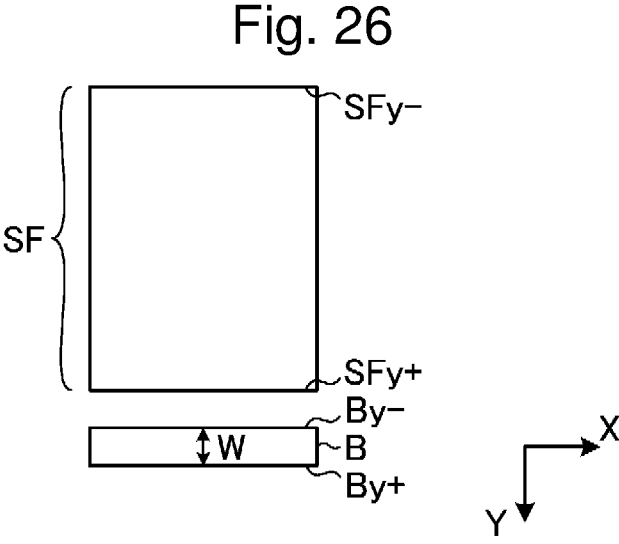
Fig. 27
Fig. 28
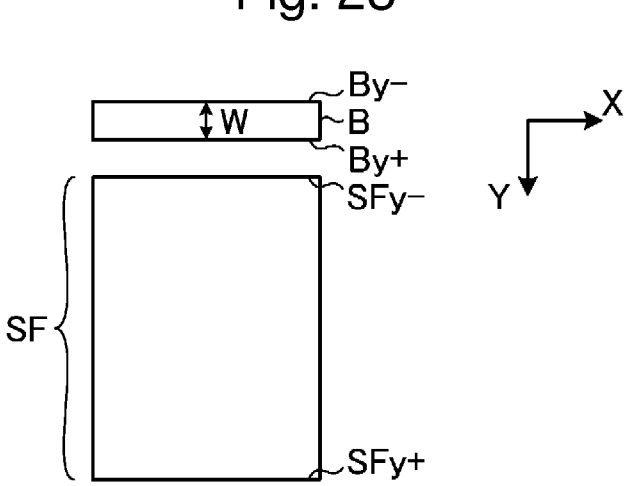

Fig. 29

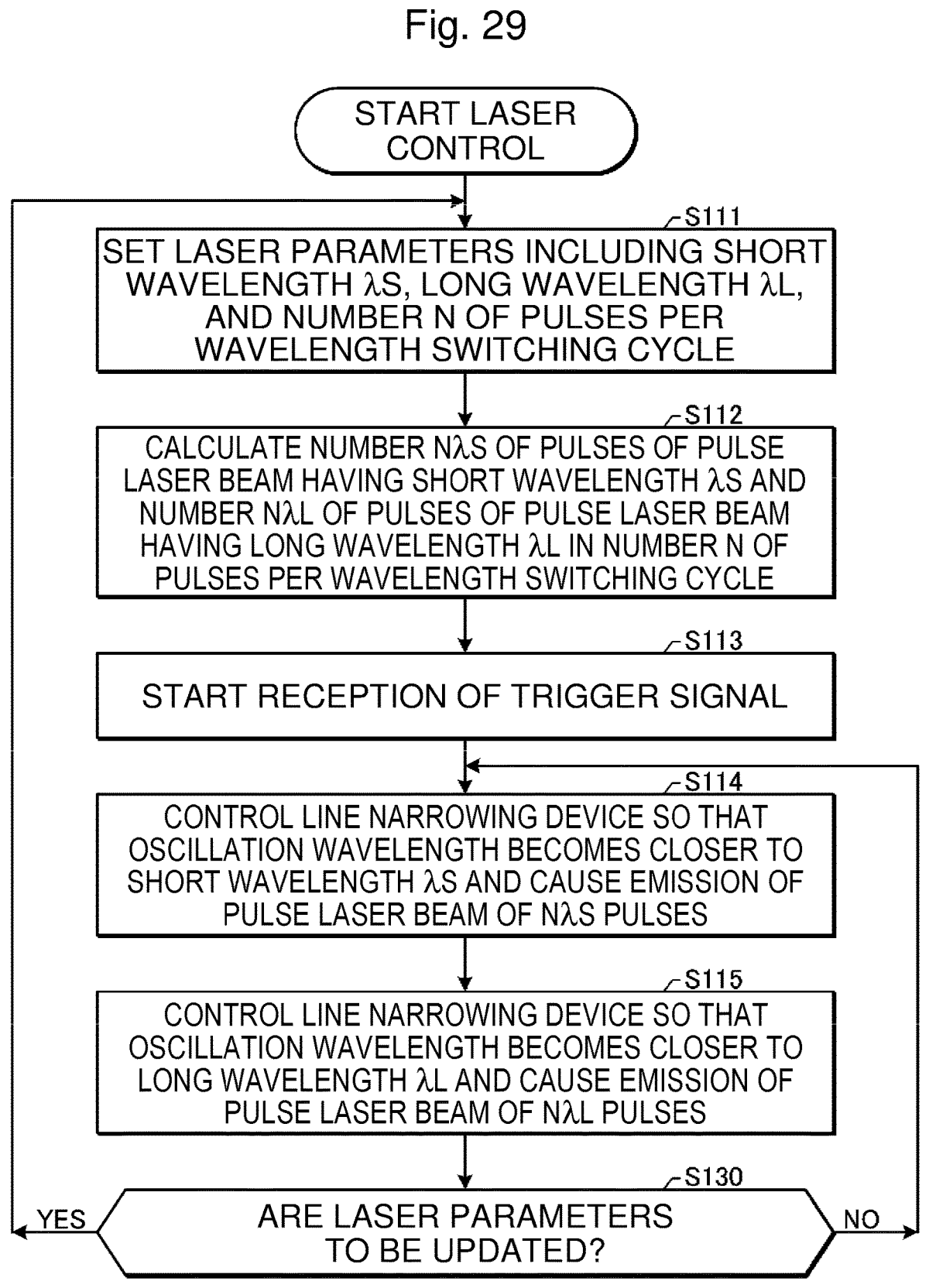

START LASER
CONTROL

S111

SET LASER PARAMETERS INCLUDING SHORT
WAVELENGTH λS, LONG WAVELENGTH λL,
AND NUMBER N OF PULSES PER
WAVELENGTH SWITCHING CYCLE

S112

CALCULATE NUMBER NλS OF PULSES OF PULSE
LASER BEAM HAVING SHORT WAVELENGTH λS AND
NUMBER NλL OF PULSES OF PULSE LASER BEAM
HAVING LONG WAVELENGTH λL IN NUMBER N OF
PULSES PER WAVELENGTH SWITCHING CYCLE

S113

START RECEPTION OF TRIGGER SIGNAL

S114

CONTROL LINE NARROWING DEVICE SO THAT
OSCILLATION WAVELENGTH BECOMES CLOSER TO
SHORT WAVELENGTH λS AND CAUSE EMISSION OF
PULSE LASER BEAM OF NλS PULSES

S115

CONTROL LINE NARROWING DEVICE SO THAT
OSCILLATION WAVELENGTH BECOMES CLOSER TO
LONG WAVELENGTH λL AND CAUSE EMISSION OF
PULSE LASER BEAM OF NλL PULSES

S130

YES     ARE LASER PARAMETERS
TO BE UPDATED?     NO

Figure 32:
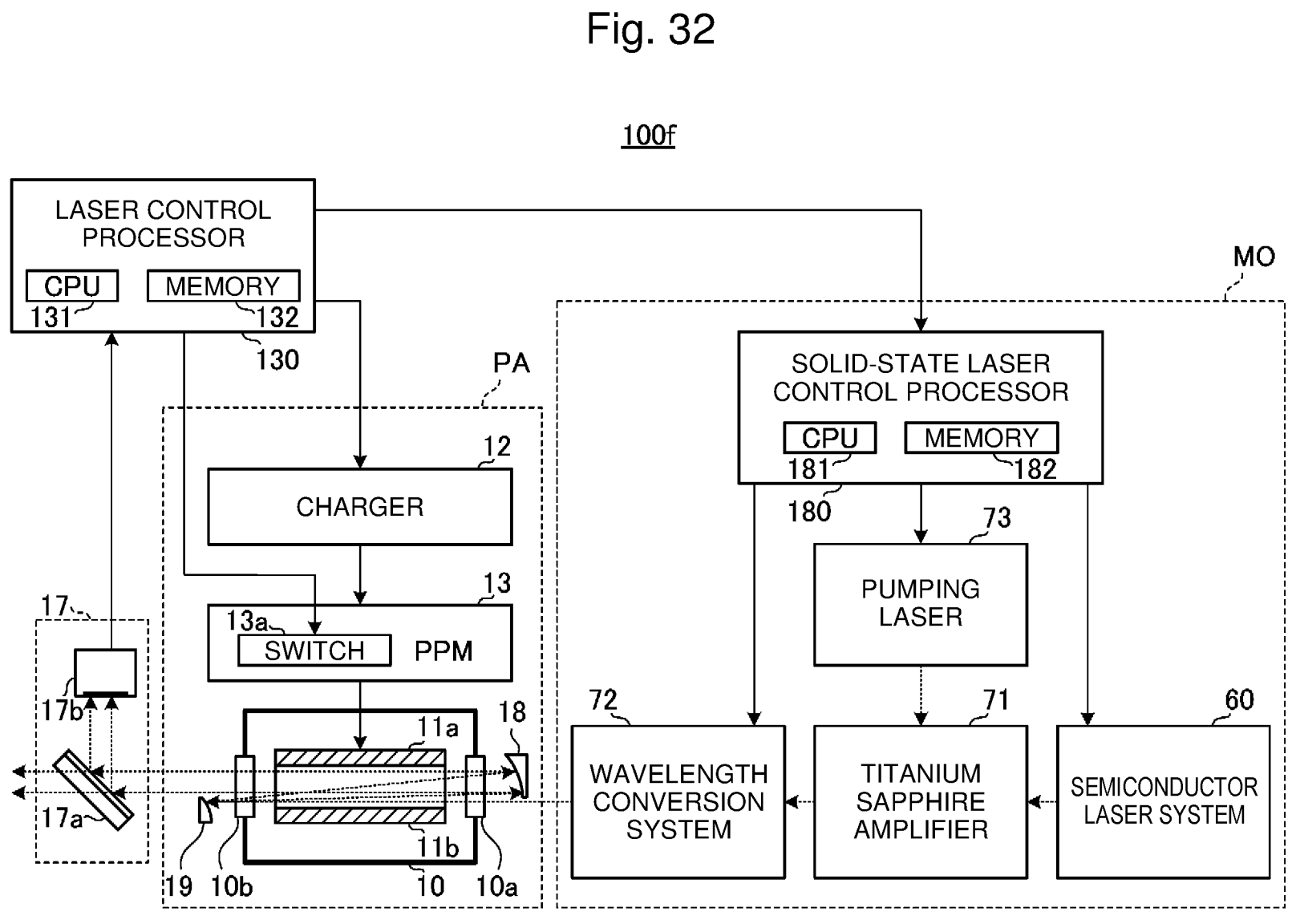

SOLID-STATE LASER CONTROL PROCESSOR 180

CPU 181

MEMORY 182

SEMICONDUCTOR LASER SYSTEM 60

PUMPING LASER 73

TITANIUM SAPPHIRE AMPLIFIER 71

WAVELENGTH CONVERSION SYSTEM 72

PA

LASER CONTROL PROCESSOR 130

CPU 131

MEMORY 132

CHARGER 12

PPM 13

SWITCH 13a 11a  11b  10a  10b  10

18  19

17  17a  17b

1

EXPOSURE SYSTEM, EXPOSURE METHOD, AND ELECTRONIC DEVICE MANUFACTURING METHOD

CROSS-REFERENCE TO RELATED APPLICATIONS

The present application is a continuation application of International Application No. PCT/JP2020/026018, filed on Jul. 2, 2020, the entire contents of which are hereby incorporated by reference.

BACKGROUND

1. Technical Field

The present disclosure relates to an exposure system, an exposure method, and an electronic device manufacturing method.

2. Related Art

Recently, in a semiconductor exposure apparatus, resolving power improvement has been requested along with miniaturization and high integration of a semiconductor integrated circuit. Hereinafter, a semiconductor exposure apparatus is simply referred to as "exposure apparatus". Thus, the wavelength of light output from an exposure light source has been shortened. Examples of a gas laser apparatus for exposure include a KrF excimer laser apparatus configured to output a laser beam having a wavelength of 248 nm approximately and an ArF excimer laser apparatus configured to output a laser beam having a wavelength of 193 nm approximately.

The KrF excimer laser apparatus and the ArF excimer laser apparatus each have a wide spectrum line width of 350 pm to 400 pm for spontaneous oscillation light. Thus, chromatic aberration occurs in some cases due to a projection lens of an exposure apparatus. This can lead to resolving power decrease. Thus, the spectrum line width of a laser beam output from the gas laser apparatus needs to be narrowed so that chromatic aberration becomes negligible. To narrow the spectrum line width, a line narrowing module including a line narrowing element is provided in a laser resonator of the gas laser apparatus in some cases. The line narrowing element includes, for example, an etalon or a grating. A gas laser apparatus that achieves narrowing of the spectrum line width in this manner is referred to as a line narrowing gas laser apparatus.

LIST OF DOCUMENTS

Patent Documents
  Patent Document 1: US Patent Application Publication No. 2005/0083983
  Patent Document 2: US Patent Application Publication No. 2005/0286598
  Patent Document 3: International Publication No. WO 2019/079010

SUMMARY

An exposure method according to an aspect of the present disclosure includes reading data indicating a relation between parameters and a wavelength difference between a first pulse laser beam and a second pulse laser beam, the parameters being related to exposure conditions under which a semiconductor wafer is exposed to a plurality of pulse laser beams including the first pulse laser beam and the second pulse laser beam, determining a target value of the wavelength difference based on the data and command values of the parameters, determining a first wavelength of the first pulse laser beam and a second wavelength of the second pulse laser beam based on the target value of the wavelength difference, outputting a wavelength setting signal to a laser apparatus to cause emission of the pulse laser beams including the first pulse laser beam having the first wavelength and the second pulse laser beam having the second wavelength, and exposing the semiconductor wafer to the pulse laser beams.

An exposure system according to an aspect of the present disclosure includes a processor and an optical system, the processor being configured to read data indicating a relation between parameters and a wavelength difference between a first pulse laser beam and a second pulse laser beam, the parameters being related to exposure conditions under which a semiconductor wafer is exposed to a plurality of pulse laser beams including the first pulse laser beam and the second pulse laser beam, determine a target value of the wavelength difference based on the data and command values of the parameters, determine a first wavelength of the first pulse laser beam and a second wavelength of the second pulse laser beam based on the target value of the wavelength difference, and output a wavelength setting signal to a laser apparatus to cause emission of the pulse laser beams including the first pulse laser beam having the first wavelength and the second pulse laser beam having the second wavelength, the optical system being configured to expose the semiconductor wafer to the pulse laser beams.

An electronic device manufacturing method according to an aspect of the present disclosure includes reading data indicating a relation between parameters and a wavelength difference between a first pulse laser beam and a second pulse laser beam, the parameters being related to exposure conditions under which a semiconductor wafer is exposed to a plurality of pulse laser beams including the first pulse laser beam and the second pulse laser beam, determining a target value of the wavelength difference based on the data and command values of the parameters, determining a first wavelength of the first pulse laser beam and a second wavelength of the second pulse laser beam based on the target value of the wavelength difference, outputting a wavelength setting signal to a laser apparatus to cause emission of the pulse laser beams including the first pulse laser beam having the first wavelength and the second pulse laser beam having the second wavelength to an exposure apparatus, and exposing the semiconductor wafer to the pulse laser beams in the exposure apparatus to manufacture an electronic device.

BRIEF DESCRIPTION OF THE DRAWINGS

Embodiments of the present disclosure will be described below merely as examples with reference to the accompanying drawings.

FIG. 2 schematically illustrates the configuration of the exposure system in the comparative example.

FIG. 5 schematically illustrates the configuration of an exposure system in a first embodiment.

FIG. 6 is a flowchart illustrating processing of data production by a lithography control processor of the first embodiment.

FIG. 7 illustrates an exemplary optimum wavelength difference table.

FIG. 8 is a flowchart illustrating processing of optimum wavelength difference calculation in the first embodiment.

FIG. 10 illustrates another exemplary focal point depth curve for optimum wavelength difference calculation.

FIG. 13 is a flowchart illustrating processing of data production by a lithography control processor of a second modification.

FIG. 14 schematically illustrates the configuration of an exposure system in a second embodiment.

FIG. 16 is a flowchart illustrating processing of test exposure in the second embodiment.

FIG. 17 illustrates an exemplary test exposure table.

FIG. 22 is a flowchart illustrating processing of laser control by a laser control processor of the third embodiment.

FIG. 26 illustrates a situation in which the position of a scanning field SF of a semiconductor wafer changes relative to the position of a beam section B of a pulse laser beam.

FIG. 27 illustrates a situation in which the position of the scanning field SF of the semiconductor wafer changes relative to the position of the beam section B of the pulse laser beam.

FIG. 28 illustrates a situation in which the position of the scanning field SF of the semiconductor wafer changes relative to the position of the beam section B of the pulse laser beam.

FIG. 29 is a flowchart illustrating processing of laser control by a laser control processor of the fourth embodiment.

FIG. 32 schematically illustrates the configuration of a laser apparatus in a sixth embodiment.

DESCRIPTION OF EMBODIMENTS

Figure 1:
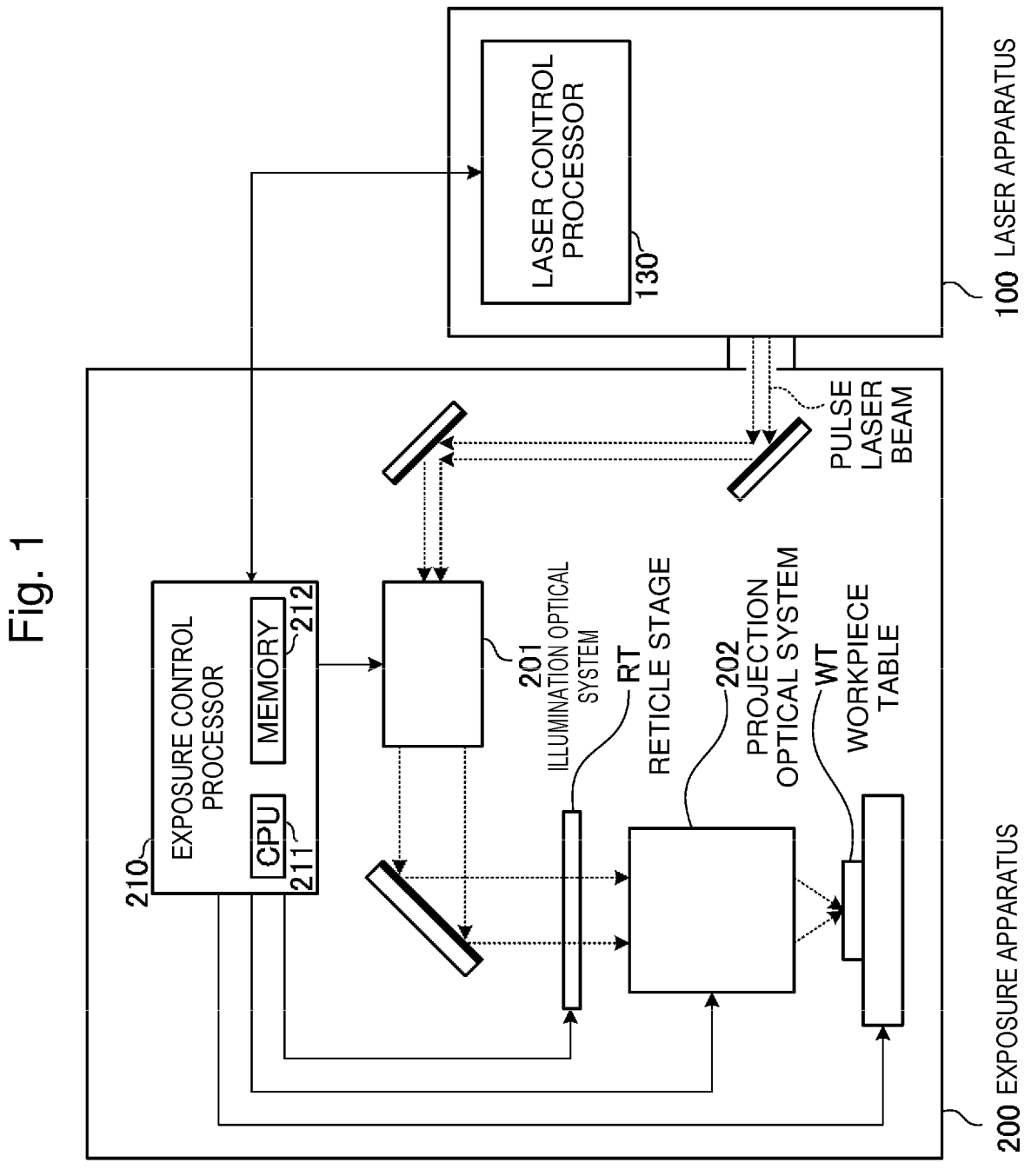
FIG. 1 schematically illustrates the configuration of an exposure system in a comparative example.

<Contents>
1. Comparative example
  1.1 Exposure system
  1.2 Exposure apparatus 200
    1.2.1 Configuration
    1.2.2 Operation
  1.3 Laser apparatus 100
    1.3.1 Configuration
    1.3.2 Operation
  1.4 Line narrowing device 14
    1.4.1 Configuration
      1.4.1.1 First and second prisms 41 and 42
      1.4.1.2 Grating system 50
    1.4.2 Operation
  1.5 Problem with comparative example
2. Exposure system configured to set wavelength difference with which focal point depth is maximum
  2.1 Configuration
  2.2 Operation
    2.2.1 Data production by lithography control processor 310
    2.2.2 Optimum wavelength difference calculation
    2.2.3 Exposure control by exposure control processor 210
  2.3 Modifications
    2.3.1 Example in which various parameters are set based on exposure process information
    2.3.2 Example in which whether to calculate optimum wavelength difference is determined
  2.4 Effect
3. Exposure system configured to calculate optimum wavelength difference based on test exposure result
  3.1 Configuration
  3.2 Operation
    3.2.1 Data production by lithography control processor 310
    3.2.2 Test exposure
    3.2.3 Optimum wavelength difference calculation
  3.3 Effect
4. Line narrowing device 14d configured to perform wavelength selection of three wavelengths or more
  4.1 Configuration
  4.2 Operation 4.2.1 Operation of laser apparatus 100

4.2.2 Operation of laser control processor 130

4.3 Other exemplary configurations 4.4 Effect

5. Line narrowing device 14e configured to switch selection wavelength in the units of pulses 5.1 Configuration 5.2 Operation 5.2.1 Operation of laser apparatus 100

5.2.2 Operation of laser control processor 130

5.3 Other exemplary configurations 5.4 Effect

6. Line narrowing device 14e configured to perform wavelength switching of three wavelengths or more 6.1 Operation 6.1.1 Operation of laser apparatus 100

6.1.2 Operation of laser control processor 130

6.2 Other exemplary configurations 6.3 Effect

7. Master oscillator MO including solid-state laser 7.1 Configuration 7.1.1 Master oscillator MO 7.1.2 Amplifier PA 7.1.3 Optical detector 17 and laser control processor 130

7.2 Operation 7.3 Semiconductor laser system 60

7.3.1 Configuration 7.3.2 Operation 7.4 Other exemplary configurations 7.5 Effect 8. Semiconductor laser system 60g including a plurality of distributed-feedback semiconductor lasers DFB 8.1 Configuration 8.2 Operation 8.3 Other exemplary configurations 8.4 Effect 9. Other Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Comparative Example

1.1 Exposure System

Figure 2:
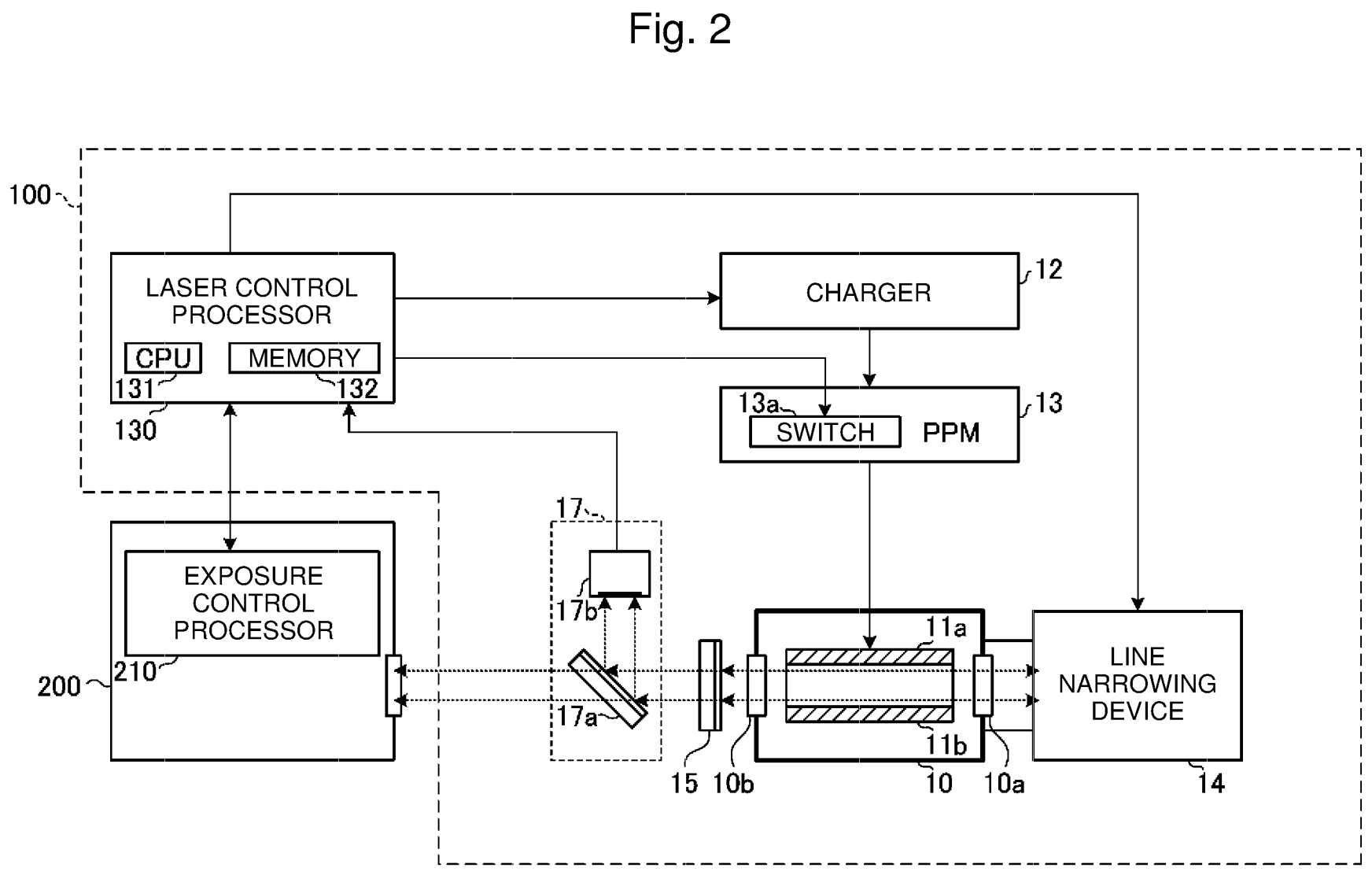

FIGS. 1 and 2 schematically illustrate the configuration of an exposure system in a comparative example. The comparative example of the present disclosure is an example that the applicant recognizes as known only by the applicant, but is not a publicly known example that is recognized by the applicant.

The exposure system includes a laser apparatus 100 and an exposure apparatus 200. In FIG. 1, the laser apparatus 100 is illustrated in a simplified manner. In FIG. 2, the exposure apparatus 200 is illustrated in a simplified manner.

The laser apparatus 100 includes a laser control processor 130. The laser apparatus 100 is configured to output a pulse laser beam toward the exposure apparatus 200.

1.2 Exposure Apparatus 200

1.2.1 Configuration

As illustrated in FIG. 1, the exposure apparatus 200 includes an illumination optical system 201, a projection optical system 202, and an exposure control processor 210.

The illumination optical system 201 illuminates, with a pulse laser beam incident from the laser apparatus 100, the reticle pattern of a non-illustrated reticle disposed on a reticle stage RT.

The pulse laser beam having transmitted through the reticle is subjected to reduced projection through the projection optical system 202 and imaged on a non-illustrated workpiece disposed on a workpiece table WT. The workpiece is a photosensitive substrate such as a semiconductor wafer to which a resist film is applied.

The exposure control processor 210 is a processing device including a memory 212 in which a control program is stored and a central processing unit (CPU) 211 configured to execute the control program. The exposure control processor 210 is specially configured or programmed to execute various kinds of processing included in the present disclosure. The exposure control processor 210 collectively controls the exposure apparatus 200 and transmits and receives various kinds of data and various signals to and from the laser control processor 130.

1.2.2 Operation

The exposure control processor 210 sets various parameters related to exposure conditions and controls the illumination optical system 201 and the projection optical system 202.

The exposure control processor 210 transmits data of a wavelength target value, data of a pulse energy target value, and a trigger signal to the laser control processor 130. The laser control processor 130 controls the laser apparatus 100 in accordance with those data and the signal.

The exposure control processor 210 translates the reticle stage RT and the workpiece table WT in directions opposite to each other in synchronization. Accordingly, the workpiece is exposed to the pulse laser beam on which the reticle pattern is reflected.

Through such an exposure process, the reticle pattern is transferred onto the semiconductor wafer. Thereafter, an electronic device can be manufactured through a plurality of processes.

1.3 Laser Apparatus 100

1.3.1 Configuration

As illustrated in FIG. 2, the laser apparatus 100 includes a laser chamber 10, a charger 12, a pulse power module (PPM) 13, a line narrowing device 14, an output coupling mirror 15, and an optical detector 17 in addition to the laser control processor 130. The line narrowing device 14 and the output coupling mirror 15 constitute an optical resonator.

The laser chamber 10 is disposed on the optical path of the optical resonator. The laser chamber 10 is provided with windows 10a and 10b.

The laser chamber 10 includes a pair of electrodes 11a and 11b and houses laser gas as a laser medium. The laser medium is, for example, $F_2$, ArF, KrF, XeCl, or XeF.

The charger 12 holds electric energy to be supplied to the pulse power module 13. The pulse power module 13 includes a switch 13a.

The line narrowing device 14 includes wavelength selection elements such as first and second prisms 41 and 42 and gratings 51 and 52 to be described later.

The output coupling mirror 15 is configured as a partially reflective mirror.

The optical detector 17 includes a beam splitter 17a and a sensor unit 17b. The beam splitter 17a is disposed on the optical path of a pulse laser beam output from the output coupling mirror 15. The beam splitter 17a is configured to transmit part of the pulse laser beam at high transmittance and to reflect the other part of the pulse laser beam to the sensor unit 17b. The sensor unit 17b includes a spectroscopic sensor and an energy sensor not illustrated. The spectroscopic sensor is an etalon spectrometer including a diffusion plate, an etalon, a light condensing lens, and an image sensor and can output wavelength measurement data. The energy sensor includes a photodiode having sensitivity in the wavelength band of ultraviolet light and can output pulse energy measurement data.

The laser control processor 130 is a processing device including a memory 132 in which a control program is stored and a CPU 131 configured to execute the control program. The laser control processor 130 is specially configured or programmed to execute various kinds of processing included in the present disclosure.

1.3.2 Operation

The laser control processor 130 acquires data of the wavelength target value from the exposure control processor 210. The laser control processor 130 transmits an initial setting signal to the line narrowing device 14 based on the wavelength target value. After emission of a pulse laser beam is started, the laser control processor 130 receives wavelength measurement data from the optical detector 17 and transmits a feedback control signal to the line narrowing device 14 based on the wavelength target value and the wavelength measurement data.

The laser control processor 130 acquires data of the pulse energy target value from the exposure control processor 210. The laser control processor 130 transmits a charging voltage initial setting signal to the charger 12 based on the pulse energy target value. After emission of a pulse laser beam is started, the laser control processor 130 receives pulse energy measurement data from the optical detector 17 and transmits a charging voltage feedback control signal to the charger 12 based on the pulse energy target value and the pulse energy measurement data.

The laser control processor 130 receives the trigger signal from the exposure control processor 210. The laser control processor 130 transmits an oscillation trigger signal based on the trigger signal to the switch 13a of the pulse power module 13.

The switch 13a is switched on upon reception of the oscillation trigger signal from the laser control processor 130. After the switch 13a is switched on, the pulse power module 13 generates high voltage in pulses from the electric energy held at the charger 12. The pulse power module 13 applies the high voltage to the electrodes 11a and 11b.

When the high voltage is applied to the electrodes 11a and 11b, discharge occurs between the electrodes 11a and 11b. The laser gas in the laser chamber 10 is excited by energy of the discharge and transitions to a higher energy level. Thereafter, when transitioning to a lower energy level, the excited laser gas discharges light having a wavelength in accordance with the energy level difference.

The light generated in the laser chamber 10 is output from the laser chamber 10 through the windows 10a and 10b. The light output through the window 10a is incident as an optical beam on the line narrowing device 14. Light near a desired wavelength in the light incident on the line narrowing device 14 is returned into the laser chamber 10 by the line narrowing device 14.

The output coupling mirror 15 transmits and outputs part of the light output through the window 10b and reflects the other part back to the laser chamber 10.

In this manner, the light from the laser chamber 10 is reciprocated between the line narrowing device 14 and the output coupling mirror 15. The light is amplified each time the light passes through a discharge space between the electrodes 11a and 11b. The light subjected to laser oscillation and line narrowing in this manner is output as a pulse laser beam from the output coupling mirror 15.

The pulse laser beam output from the laser apparatus 100 is incident on the exposure apparatus 200.

1.4 Line Narrowing Device 14

1.4.1 Configuration

Figure 3:
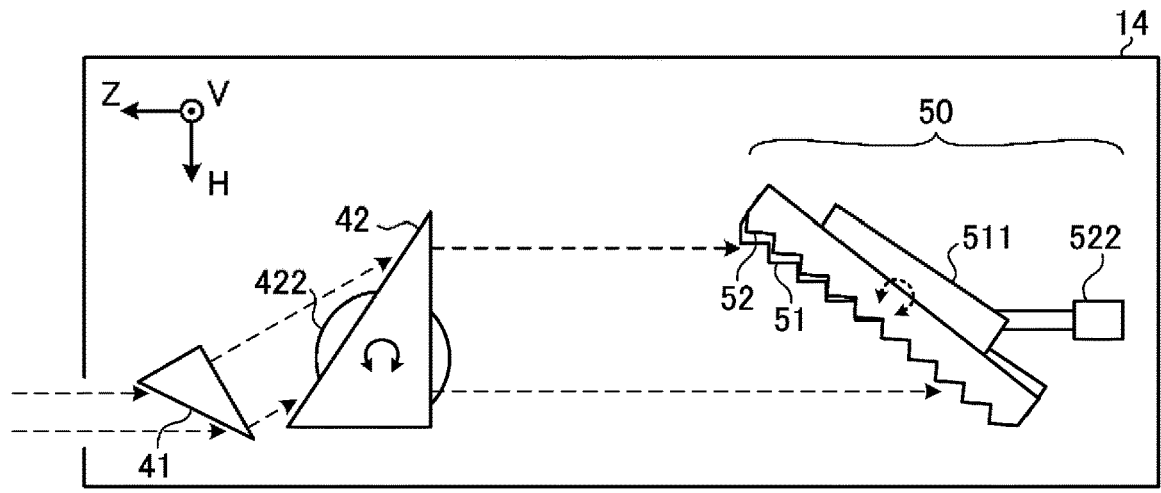
FIG. 3 schematically illustrates the configuration of a line narrowing device in the comparative example.
Figure 4:
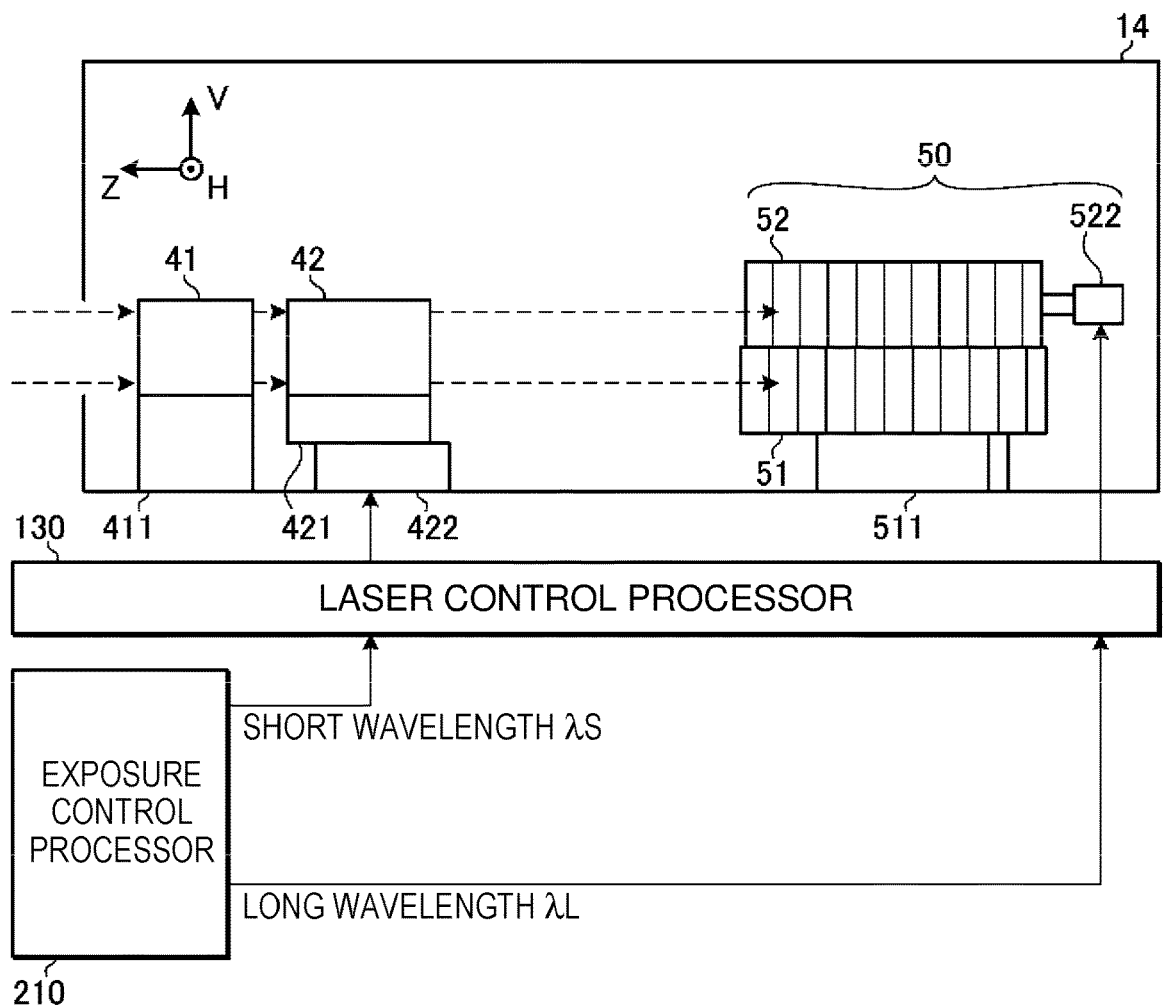
FIG. 4 schematically illustrates the configuration of the line narrowing device in the comparative example.

FIGS. 3 and 4 schematically illustrate the configuration of the line narrowing device 14 in the comparative example. A V axis, an H axis, and a Z axis that are orthogonal to each other are illustrated in each of FIGS. 3 and 4. FIG. 3 illustrates the line narrowing device 14 when viewed in the negative V direction, and FIG. 4 illustrates the line narrowing device 14 when viewed in the negative H direction. The negative V direction and the positive V direction align with the direction in which the electrodes 11a and 11b (refer to FIG. 2) face. The negative Z direction aligns with the traveling direction of an optical beam output through the window 10a. The positive Z direction aligns with the traveling direction of a pulse laser beam output through the window 10b and the output coupling mirror 15.

The line narrowing device 14 includes the first and second prisms 41 and 42 and a grating system 50.

1.4.1.1 First and Second Prisms 41 and 42

The first prism 41 is disposed on the optical path of an optical beam output through the window 10a. The first prism 41 is supported by a holder 411.

The second prism 42 is disposed on the optical path of an optical beam having passed through the first prism 41. The second prism 42 is supported by a holder 421.

The first and second prisms 41 and 42 are made of a material such as calcium fluoride or synthetic quartz, which has a high transmittance for a wavelength selected through the line narrowing device 14.

The first and second prisms 41 and 42 are disposed such that a surface of each of the first and second prisms 41 and 42 through which an optical beam is input and output is parallel to the V axis. The second prism 42 is rotatable about an axis parallel to the V axis by a rotation stage 422.

1.4.1.2 Grating System 50

The grating system 50 includes the gratings 51 and 52. The gratings 51 and 52 are disposed at positions different from each other in the direction of the V axis on the optical path of an optical beam having passed through the second prism 42. The directions of grooves of the gratings 51 and 52 align with the direction of the V axis. The positions of the gratings 51 and 52 are set such that an optical beam having passed through the second prism 42 is incident over the gratings 51 and 52.

The gratings 51 and 52 are supported by a holder 511. The grating 51 is supported to maintain a constant posture, and the grating 52 is rotatable about an axis parallel to the V axis by a rotation mechanism 522.

1.4.2 Operation

The traveling direction of an optical beam output through the window 10a is changed in a plane parallel to an HZ surface orthogonal to the V axis by each of the first and second prisms 41 and 42, and the beam width thereof is expanded in the plane parallel to the HZ surface by each of the first and second prisms 41 and 42. The traveling direction of an optical beam having passed through both the first and second prisms 41 and 42 and traveling toward the gratings 51 and 52 substantially aligns with the negative Z direction, for example.

Light incident on the gratings 51 and 52 from the second prism 42 is reflected by the grooves of each of the gratings 51 and 52 and is diffracted in a direction in accordance with the wavelength of the light. Accordingly, the light reflected by the grooves of each of the gratings 51 and 52 is dispersed in a plane parallel to the HZ surface. The grating 51 is disposed in Littrow arrangement such that the incident angle of an optical beam incident on the grating 51 from the second prism 42 matches the diffracting angle of a diffracted light of a desired short wavelength $\lambda S$. The grating 52 is disposed in Littrow arrangement such that the incident angle of an optical beam incident on the grating 52 from the second prism 42 matches the diffracting angle of a diffracted light of a desired long wavelength $\lambda L$. When the incident angles of the optical beams incident on the gratings 51 and 52 from the second prism 42 are different from each other, a wavelength difference is generated between the short wavelength $\lambda S$, which is the Wavelength of the diffracted light returned from the grating 51 to the second prism 42, and the long wavelength $\lambda L$, which is the wavelength of the diffracted light returned from the grating 52 to the second prism 42. The short wavelength $\lambda S$ corresponds to a first wavelength in the present disclosure, and the long wavelength $\lambda L$ corresponds to a second wavelength in the present disclosure.

Although a dashed line arrow illustrating an optical beam indicates only a direction from the first prism 41 toward the gratings 51 and 52 in FIGS. 3 and 4, an optical beam having a wavelength selected through the line narrowing device 14 travels from the gratings 51 and 52 toward the first prism 41 through a path opposite to the dashed line arrow.

The second prism 42 and the first prism 41 reduce, in a plane parallel to the HZ surface, the beam width of light returned from the gratings 51 and 52, and return the light into the laser chamber 10 through the window 10a.

The rotation stage 422 and the rotation mechanism 522 are controlled by the laser control processor 130.

As the rotation stage 422 slightly rotates the second prism 42, the traveling direction of an optical beam output from the second prism 42 toward the gratings 51 and 52 slightly changes in a plane parallel to the HZ surface. Accordingly, the incident angle of the optical beam incident on the gratings 51 and 52 from the second prism 42 slightly changes. Thus, the short wavelength $\lambda S$ and the long wavelength $\lambda L$ both change.

As the rotation mechanism 522 slightly rotates the grating 52, the incident angle of an optical beam incident on the grating 51 from the second prism 42 does not change but the incident angle of an optical beam incident on the grating 52 from the second prism 42 slightly changes. Accordingly, the wavelength difference between the short wavelength $\lambda S$ and the long wavelength $\lambda L$ changes.

The exposure control processor 210 transmits the values of the short wavelength $\lambda S$ and the long wavelength $\lambda L$ to the laser control processor 130. The short wavelength $\lambda S$ and the long wavelength $\lambda L$ are, for example, wavelengths with which an image is formed at two positions on the upper and bottom surfaces, respectively, of the resist film applied to the semiconductor wafer.

The laser control processor 130 controls the rotation stage 422 based on the value of the short wavelength $\lambda S$. Accordingly, the rotation stage 422 changes the posture of the second prism 42 to adjust the incident angle (first incident angle) of an optical beam on the grating 51 and the incident angle (second incident angle) of an optical beam on the grating 52.

The laser control processor 130 controls the rotation mechanism 522 based on the value of the long wavelength $\lambda L$. Accordingly, the rotation mechanism 522 changes the posture of the grating 52 to adjust the second incident angle of an optical beam on the grating 52.

Through the above-described configuration and operation, optical beams having the short wavelength $\lambda S$ and the long wavelength $\lambda L$ are selected from among optical beams output through the window 10a of the laser chamber 10 and are returned into the laser chamber 10. Accordingly, the laser apparatus 100 can perform two-wavelength oscillation. The short wavelength $\lambda S$ and the long wavelength $\lambda L$ can be separately set by controlling the rotation stage 422 and the rotation mechanism 522.

A pulse laser beam subjected to two-wavelength oscillation and output from the laser apparatus 100 includes two wavelength components of the short wavelength $\lambda S$ and the long wavelength $\lambda L$. The pulse laser beam includes a pulse for which a first pulse laser beam having the short wavelength $\lambda S$ and a second pulse laser beam having the long wavelength $\lambda L$ temporally and spatially overlap. Alternatively, the first pulse laser beam having the short wavelength $\lambda S$ and the second pulse laser beam having the long wavelength $\lambda L$ may temporally overlap but not spatially overlap.

A focal length in the exposure apparatus 200 (refer to FIG. 1) depends on the wavelength of a pulse laser beam. A pulse laser beam subjected to two-wavelength oscillation and output from the laser apparatus 100 can form an image at two different positions in the direction along the optical path axis of the pulse laser beam on the workpiece table WT of the exposure apparatus 200, and the focal point depth thereof can be increased in effect. For example, when a resist film having a large film thickness is exposed, it is possible to maintain imaging performance in the thickness direction of the resist film.

1.5 Problem with Comparative Example

According to the comparative example, it is possible to increase the focal point depth in effect by outputting a pulse laser beam through two-wavelength oscillation, but it has been unclear how to specifically set the two wavelengths.

In some embodiments describes below, data indicating the relation between parameters related to exposure conditions and a wavelength difference with which a focal point depth when a semiconductor wafer is exposed by using the parameters is maximum is produced. The exposure control processor 210 determines a target value of the wavelength difference based on the data and command values of the parameters and determines the short wavelength $\lambda S$ and the long wavelength $\lambda L$.

2. Exposure System Configured to Set Wavelength Difference with which Focal Point Depth is Maximum

2.1 Configuration

Figure 5:
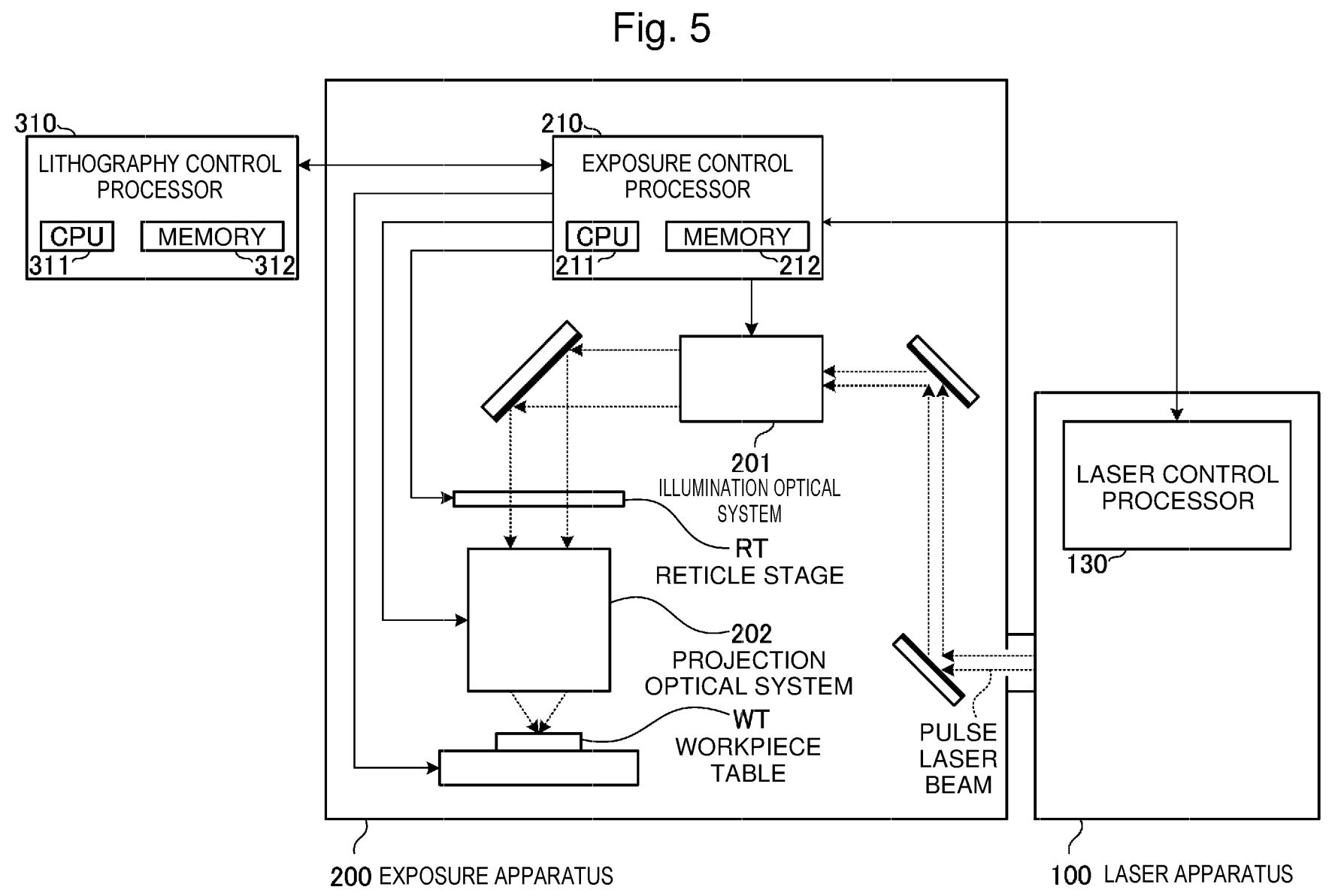

FIG. 5 schematically illustrates the configuration of an exposure system in a first embodiment. The exposure system includes a lithography control processor 310 in addition to the laser apparatus 100 and the exposure apparatus 200. The lithography control processor 310 is a processing device including a memory 312 in which a control program is stored and a CPU 311 configured to execute the control program. The lithography control processor 310 is specially configured or programmed to execute various kinds of processing included in the present disclosure. The lithography control processor 310 is connected to the exposure control processor 210 and transmits and receives various kinds of data and various signals to and from the exposure control processor 210. The lithography control processor 310 may be connected to a plurality of exposure control processors 210 included in a plurality of exposure apparatuses 200 installed at a semiconductor factory.

2.2 Operation

2.2.1 Data Production by Lithography Control Processor 310

FIG. 6 is a flowchart illustrating processing of data production by the lithography control processor 310 of the first embodiment. Through processing described below, the lithography control processor 310 produces data indicating a relation between parameters related to exposure conditions and a wavelength difference with which a focal point depth when a semiconductor wafer is exposed by using the parameters is maximum.

At S321, S323, and S325, the lithography control processor 310 sets one to each of counters m, n, and o for specifying the individual values of parameters IL(m), PJ(n), and M(o) to be described later.

At S332, the lithography control processor 310 sets the parameters IL(m), PJ(n), and M(o) to values specified by the counters m, n, and o, respectively. In the present disclosure, the parameters IL(m), PJ(n), and M(o) are also collectively referred to as "various parameters". The various parameters will be described below.

(1) Parameter IL(m)

The parameter IL(m) includes a plurality of parameters of the illumination optical system 201 with which the exposure control processor 210 controls the illumination optical system 201. The parameter IL(m) is set in accordance with the beam pattern type of a secondary light source such as normal illumination, annular illumination, or quadrupole illumination. The parameter IL(m) includes, for example, the type of a polarization pattern, the value of $\sigma$ that is the numerical aperture ratio of an optical system, the ratio of the inner and outer diameters of annular illumination, and the shape of quadrupole illumination. In addition, the intensity distribution of light in an illumination pupil may be set as the parameter IL(m) when a beam pattern is set by source mask optimization (SMO). The number of values of the parameter IL(m) is Mmax, and m is an integer of one to Mmax. The illumination optical system 201 includes, for example, a control optical system, a fly-eye lens, and a condenser lens not illustrated. The beam pattern of a laser beam incident on the fly-eye lens can be controlled by using a control optical system including a diffracting optical element (DOE) and an axicon lens.

(2) Parameter PJ(n)

The parameter PJ(n) includes a plurality of parameters of the projection optical system 202 with which the exposure control processor 210 controls the projection optical system 202. The parameter PJ(n) may include set positions of a synthetic quartz lens and a calcium fluoride lens for performing chromatic aberration correction or may include a numerical aperture adjusted by an aperture diameter. The number of values of the parameter PJ(n) is Nmax, and n is an integer of one to Nmax.

(3) Parameter M(o)

The parameter M(o) includes a plurality of parameters of a mask that are defined by the property of the mask or the reticle. The parameter M(o) is defined by the kind of a mask such as a binary mask, a phase shift mask, or a halftone phase shift mask, or by the material, pattern position, shape, dimension, or the like of the mask. The number of values of the parameter M(o) is Omax, and o is an integer of one to Omax.

At S340, the lithography control processor 310 calculates an optimum wavelength difference $\delta\lambda b(m, n, o)$. The optimum wavelength difference $\delta\lambda b(m, n, o)$ is a wavelength difference with which the focal point depth is maximum. The lithography control processor 310 also calculates a maximum focal point depth DOFmax(m, n, o). Details of S340 will be described later with reference to FIG. 8.

At S361, the lithography control processor 310 produces data indicating the relation between the parameters IL(m), PJ(n), and M(o) and the optimum wavelength difference $\delta\lambda b(m, n, o)$, and writes the data to an optimum wavelength difference table.

FIG. 7 illustrates an example of the optimum wavelength difference table. The optimum wavelength difference table is stored in the memory 312. The optimum wavelength difference table associates a combination of the values of the parameters IL(m), PJ(n), and M(o) with the optimum wavelength difference $\delta\lambda b(m, n, o)$ and the maximum focal point depth DOFmax(m, n, o). Data of the maximum focal point depth DOFmax(m, n, o) may be omitted. The optimum wavelength difference $\delta\lambda b(m, n, o)$ and the maximum focal point depth DOFmax(m, n, o) are calculated for each combination of the values of the parameters IL(m), PJ(n), and M(o). When C1 represents the number of combinations of the values of the parameters IL(m), PJ(n), and M(o), C1 is given by an expression below.

$$C1 = M\,\text{max} \times N\,\text{max} \times O\,\text{max}$$

The lithography control processor 310 calculates C1 patterns of the optimum wavelength difference $\delta\lambda b(m, n, o)$ and the maximum focal point depth DOFmax(m, n, o) by repeating determination and increment of the counters m, n, and o as described below.

At S371, the lithography control processor 310 determines whether the value of the counter o is equal to or larger than Omax. When the value of the counter o is smaller than Omax (NO at S371), the lithography control processor 310 advances processing to S372. At S372, the lithography control processor 310 adds one to the value of the counter o and thereafter, returns processing to S332. When the value of the counter o is equal to or larger than Omax (YES at S371), the lithography control processor 310 advances processing to S373.

At S373, the lithography control processor 310 determines whether the value of the counter n is equal to or larger than Nmax. When the value of the counter n is smaller than Nmax (NO at S373), the lithography control processor 310 advances processing to S374. At S374, the lithography control processor 310 adds one to the value of the counter n and thereafter, returns processing to S325. When the value of the counter n is equal to or larger than Nmax (YES at S373), the lithography control processor 310 advances processing to S375.

At S375, the lithography control processor 310 determines whether the value of the counter m is equal to or larger than Mmax. When the value of the counter m is smaller than Mmax (NO at S375), the lithography control processor 310 advances processing to S376. At S376, the lithography control processor 310 adds one to the value of the counter m and thereafter, returns processing to S323. When the value of the counter m is equal to or larger than Mmax (YES at S375), the lithography control processor 310 ends processing of the present flowchart.

2.2.2 Optimum Wavelength Difference Calculation

FIG. 8 is a flowchart illustrating processing of calculation of the optimum wavelength difference δλb(m, n, o) in the first embodiment. The processing illustrated in FIG. 8 corresponds to a subroutine of S340 in FIG. 6. The lithography control processor 310 calculates, in accordance with a combination of the values of the parameters IL(m), PJ(n), and M(o) related to exposure conditions, a wavelength difference with which the focal point depth when a semiconductor wafer is exposed is maximum, as the optimum wavelength difference δλb(m, n, o).

At S341, the lithography control processor 310 sets, to one, a counter k for specifying an individual value of a wavelength difference used for simulation.

At S342, the lithography control processor 310 sets a short wavelength λS(k) and a long wavelength λL(k) based on a standard wavelength λcs and the value of the counter k as described below.

$$\lambda S(k)=\lambda cs-k\cdot\Delta\delta\lambda/2$$

$$\lambda L(k)=\lambda cs+k\cdot\Delta\delta\lambda/2$$

The standard wavelength λcs is a typical wavelength of the laser apparatus 100. The standard wavelength λcs may be the wavelength of a pulse laser beam in standard air. For example, in an ArF excimer laser apparatus or a KrF excimer laser apparatus, the standard wavelength λcs may be 193.35 nm or 248.35 nm, which is a wavelength near the center of the oscillation wavelength range of the laser apparatus.

The number Δδλ is a positive number determined as the change amount of a wavelength difference used for simulation. Different wavelength differences can be set in accordance with the value of the counter k by multiplying the value of the counter k and the wavelength difference change amount Δδλ.

The short wavelength λS(k) and the long wavelength λL(k) are obtained by subtracting and adding k·Δδλ/2 to and from the standard wavelength λcs, respectively.

The wavelength of a pulse laser beam used for semiconductor wafer exposure does not necessarily need to have a central wavelength at the standard wavelength λcs. However, the oscillation wavelength ranges of an ArF excimer laser apparatus and a KrF excimer laser apparatus are the range of 193.2 nm to 193.4 nm and the range of 248.2 nm to 248.5 nm, respectively. Within these ranges, the optimum wavelength difference δλb(m, n, o) and the maximum focal point depth DOFmax(m, n, o) do not largely change when the central wavelength changes. Thus, when calculation is performed by using the standard wavelength λcs, it is possible to reduce work of performing calculation by using another wavelength as the central wavelength.

At S343, the lithography control processor 310 calculates a wavelength difference δλ(k) by an expression below.

$$\delta\lambda(k)=\lambda L(k)-\lambda S(k)$$

At S344, the lithography control processor 310 calculates a focal point depth DOF(k) by performing simulation based on the parameters IL(m), PJ(n), and M(o), the short wavelength λS(k), and the long wavelength λL(k).

At S345, the lithography control processor 310 determines whether the value of the counter k is equal to or larger than Kmax. When the value of the counter k is smaller than Kmax (NO at S345), the lithography control processor 310 advances processing to S346. At S346, the lithography control processor 310 adds one to the value of the counter k and thereafter, returns processing to S342. When the value of the counter k is equal to or larger than Kmax (YES at S345), the lithography control processor 310 advances processing to S347. Accordingly, Kmax pieces of the wavelength difference δλ(k) are set and Kmax pieces of the focal point depth DOF(k) are calculated for one combination of the values of the parameters IL(m), PJ(n), and M(o).

At S347, the lithography control processor 310 produces a graph of a focal point depth curve illustrating the relation of the focal point depth DOF(k) with the wavelength difference δλ(k).

Figure 9:
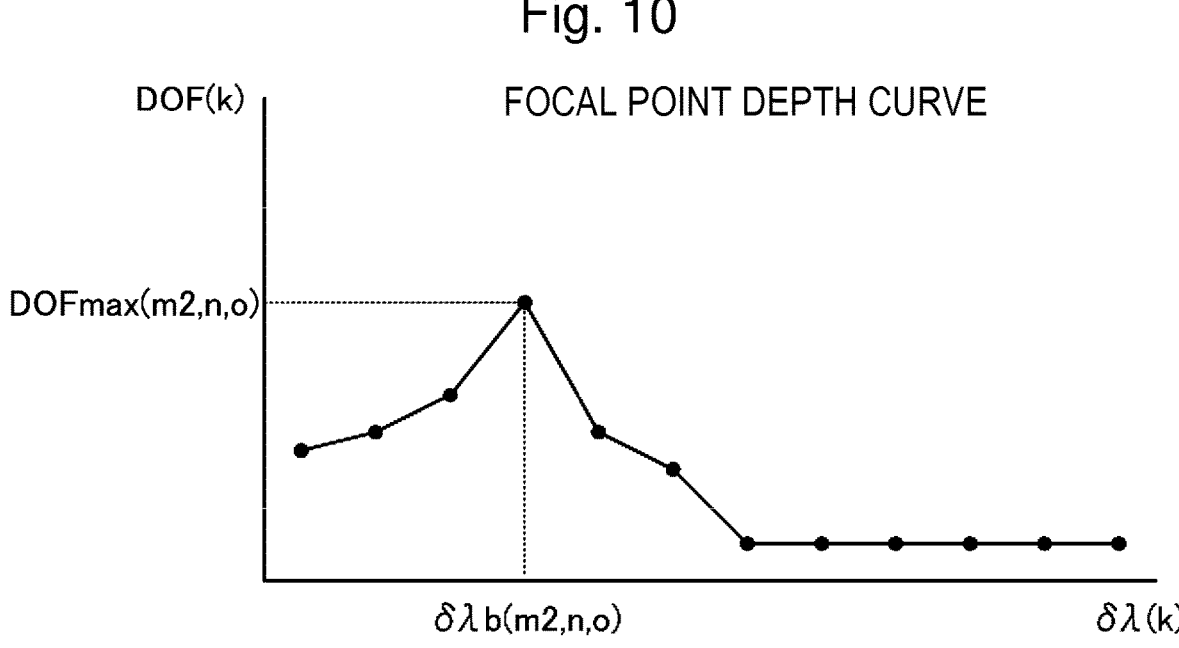
FIG. 9 illustrates an exemplary focal point depth curve for optimum wavelength difference calculation.

FIGS. 9 and 10 each illustrate an exemplary focal point depth curve for calculating the optimum wavelength difference δλb(m, n, o). In each of FIGS. 9 and 10, the horizontal axis represents the wavelength difference δλ(k), and the vertical axis represents the focal point depth DOF(k). The focal point depth curve may be illustrated as a broken line graph as illustrated in FIGS. 9 and 10 or may be illustrated as an approximate curve.

The parameter IL(m) of the illumination optical system 201 is different between FIGS. 9 and 10. A parameter IL(m1) specified with a counter m1 is used in FIG. 9. A parameter IL(m2) specified with a counter m2 is used in FIG. 10.

At S348 in FIG. 8, from the focal point depth curve, the lithography control processor 310 calculates, as the optimum wavelength difference δλb(m, n, o), a wavelength difference with which the focal point depth DOF(k) is maximum, and calculates the maximum focal point depth DOFmax(m, n, o).

After S348, the lithography control processor 310 ends processing of the present flowchart and returns to the processing illustrated in FIG. 6.

As illustrated in each of FIGS. 9 and 10, the optimum wavelength difference δλb(m, n, o) is a value on the horizontal axis at the peak of the focal point depth curve, and the maximum focal point depth DOFmax(m, n, o) is the value on the vertical axis at the peak. As illustrated in these diagrams, the optimum wavelength difference δλb(m, n, o) and the maximum focal point depth DOFmax(m, n, o) are different in some cases when the parameter IL(m) of the illumination optical system 201 is different while the other parameters PJ(n) and M(o) are the same. Similarly, the optimum wavelength difference δλb(m, n, o) and the maximum focal point depth DOFmax(m, n, o) are different in some cases when the parameter PJ(n) is different while the other parameters IL(m) and M(o) are the same. The optimum wavelength difference δλb(m, n, o) and the maximum focal point depth DOFmax(m, n, o) are different in some cases when the parameter M(o) is different while the other parameters IL(m) and PJ(n) are the same.

2.2.3 Exposure Control by Exposure Control Processor 210

Figure 11:
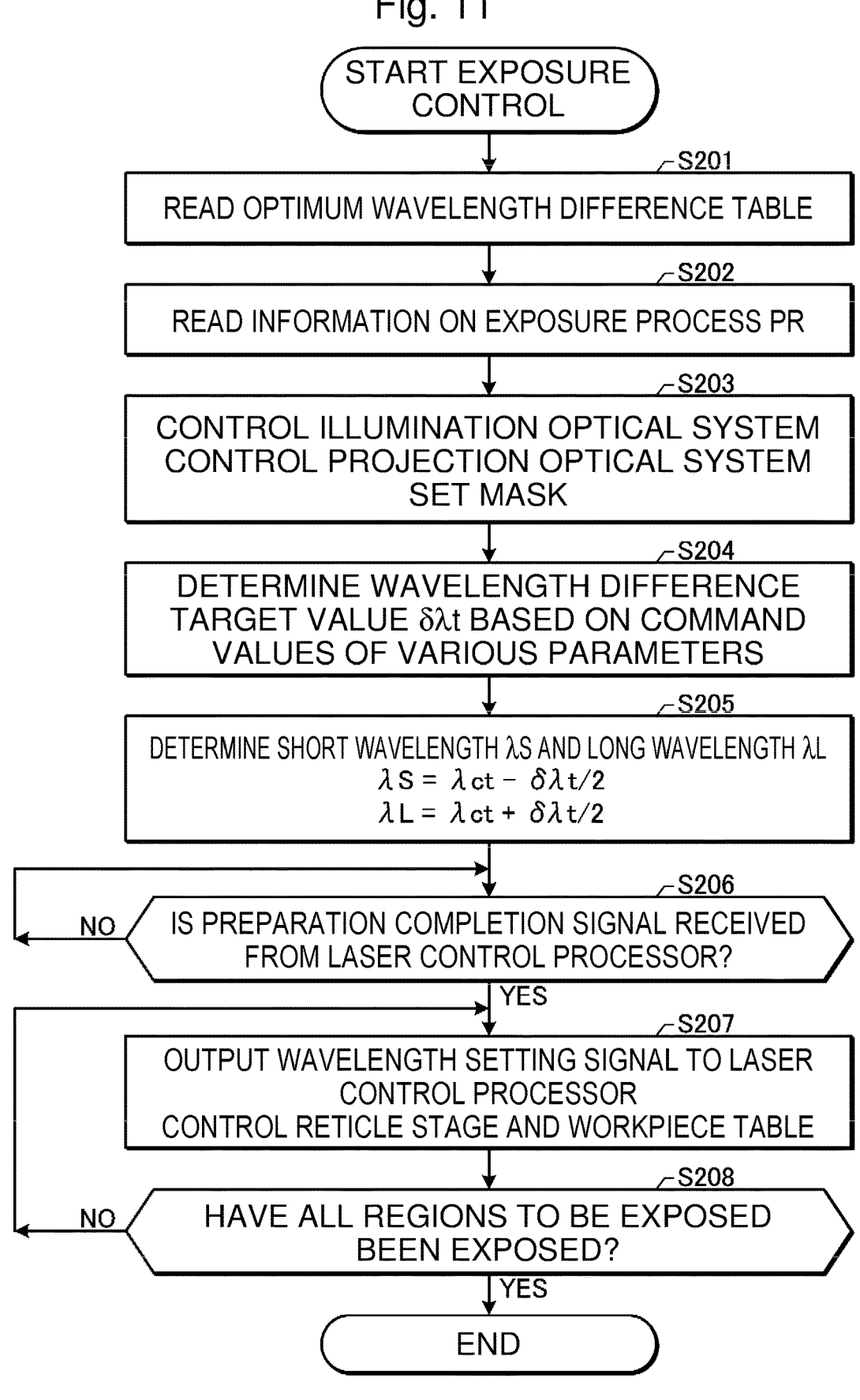
FIG. 11 is a flowchart illustrating processing of exposure control by an exposure control processor of the first embodiment.

FIG. 11 is a flowchart illustrating processing of exposure control by the exposure control processor 210 of the first embodiment. Through processing described below, the exposure control processor 210 reads the optimum wavelength difference table (refer to FIG. 7), determines a wavelength difference target value δλt, and exposes a semiconductor wafer.

At S201, the exposure control processor 210 receives and reads the optimum wavelength difference table from the lithography control processor 310. The optimum wavelength difference table indicates the relation between the optimum wavelength difference $\delta\lambda b(m, n, o)$ and the parameters IL(m), PJ(n), and M(o) related to exposure conditions as described above.

At S202, the exposure control processor 210 reads information on an exposure process PR. The information on the exposure process PR includes command values of the various parameters related to exposure conditions. The information on the exposure process PR is set and input by a user of the exposure apparatus 200. Alternatively, the information on the exposure process PR is transmitted from the lithography control processor 310.

At S203, the exposure control processor 210 controls the illumination optical system 201 and the projection optical system 202 in accordance with the command values of the various parameters included in the information on the exposure process PR, and sets a mask.

At S204, the exposure control processor 210 searches the optimum wavelength difference table and determines the wavelength difference target value $\delta\lambda t$ based on the command values of the various parameters included in the information on the exposure process PR.

At S205, the exposure control processor 210 determines the short wavelength $\lambda S$ and the long wavelength $\lambda L$ by expressions below based on the wavelength difference target value $\delta\lambda t$.

$$\lambda S = \lambda ct - \delta\lambda t/2$$

$$\lambda L = \lambda ct + \delta\lambda t/2$$

In the expressions, $\lambda ct$ represents a central wavelength target value. The central wavelength target value $\lambda ct$ is set based on, for example, the standard wavelength $\lambda cs$ and the change amount of atmospheric pressure or temperature with respect to standard air.

At S206, the exposure control processor 210 waits for reception of a preparation completion signal of the laser apparatus 100 from the laser control processor 130. When having received the preparation completion signal from the laser control processor 130, the exposure control processor 210 advances processing to S207.

At S207, the exposure control processor 210 outputs a wavelength setting signal to the laser control processor 130 and controls the reticle stage RT and the workpiece table WT to expose the semiconductor wafer. The wavelength setting signal transmitted to the laser control processor 130 includes the short wavelength $\lambda S$ and the long wavelength $\lambda L$. Operation of the laser apparatus 100 having received the wavelength setting signal is the same as operation in the comparative example described above with reference to FIGS. 3 and 4.

At S208, the exposure control processor 210 determines whether all regions to be exposed on the semiconductor wafer have been exposed. When not all regions to be exposed have been exposed (NO at S208), the exposure control processor 210 returns processing to S207. When all regions to be exposed have been exposed (YES at S208), the exposure control processor 210 ends processing of the present flowchart.

The description with reference to FIG. 11 is made on the case in which the exposure control processor 210 determines the short wavelength $\lambda S$ and the long wavelength $\lambda L$ based on the wavelength difference target value $\delta\lambda t$ and the central wavelength target value $\lambda ct$, but the present disclosure is not limited thereto. The exposure control processor 210 may transmit the wavelength difference target value $\delta\lambda t$ and the central wavelength target value $\lambda ct$ to the laser control processor 130, and the laser control processor 130 may determine the short wavelength $\lambda S$ and the long wavelength $\lambda L$.

2.3 Modifications

Figure 12:
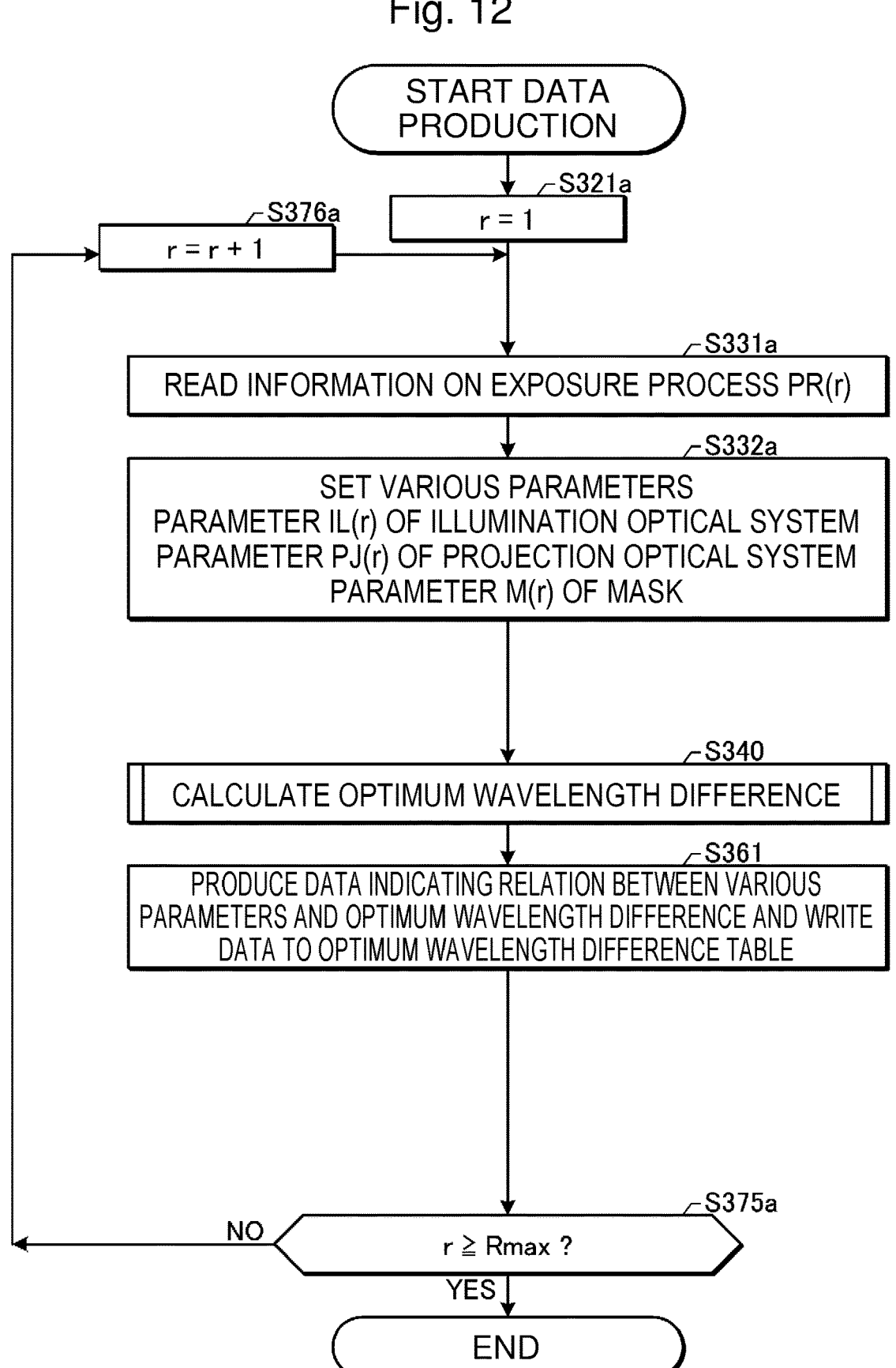
FIG. 12 is a flowchart illustrating processing of data production by a lithography control processor of a first modification.

2.3.1 Example in which Various Parameters are Set Based on Exposure Process Information FIG. 12 is a flowchart illustrating processing of data production by the lithography control processor 310 of a first modification. In FIG. 6, the optimum wavelength difference $\delta\lambda b(m, n, o)$ is calculated for all combinations of the values of the parameters IL(m), PJ(n), and M(o), but the present disclosure is not limited thereto. In FIG. 12, an optimum wavelength difference $\delta\lambda b(r)$ is calculated for parameters IL(r), PJ(r), and M(r) used in an exposure process.

At S321a, the lithography control processor 310 sets, to one, a counter r for specifying an exposure process.

At S331a, the lithography control processor 310 reads information on an exposure process PR(r). The information on the exposure process PR(r) includes set values of the various parameters related to an exposure process PR(r) specified with the counter r among a plurality of exposure processes. The number of exposure processes PR(r) is Rmax, and r is an integer of one to Rmax.

At S332a, the lithography control processor 310 sets the parameters IL(r), PJ(r), and M(r) to respective values specified with the counter r. One combination of values of the parameters IL(r), PJ(r), and M(r) is specified for one exposure process PR(r).

The lithography control processor 310 performs optimum wavelength difference calculation at S340 and performs writing to the optimum wavelength difference table at S361. These processes are the same as the corresponding processes in FIG. 6. However, the optimum wavelength difference $\delta\lambda b(m, n, o)$ is calculated not for all combinations of the values of the parameters IL(m), PJ(n), and M(o), but the optimum wavelength difference $\delta\lambda b(r)$ is calculated for the parameters IL(r), PJ(r), and M(r).

At S375a, the lithography control processor 310 determines whether the value of the counter r is equal to or larger than Rmax. When the value of the counter r is smaller than Rmax (NO at S375a), the lithography control processor 310 advances processing to S376a. At S376a, the lithography control processor 310 adds one to the value of the counter r and thereafter, returns processing to S331a. When the value of the counter r is equal to or larger than Rmax (YES at S375a), the lithography control processor 310 ends processing of the present flowchart.

2.3.2 Example in which Whether to Calculate Optimum Wavelength Difference is Determined FIG. 13 is a flowchart illustrating processing of data production by the lithography control processor 310 of a second modification. In FIG. 13, whether to calculate the optimum wavelength difference $\delta\lambda b(m, n, o)$ is determined for each combination of the values of the parameters IL(m), PJ(n), and M(o).

Processes at S321 to S332 are the same as the corresponding processes in FIG. 6.

At S333b, the lithography control processor 310 determines whether to calculate the optimum wavelength difference $\delta\lambda b(m, n, o)$. When the optimum wavelength difference $\delta\lambda b(m, n, o)$ is not to be calculated (NO at S333b), the lithography control processor 310 skips S340 and S361 and advances processing to S371. When the optimum wavelength difference $\delta\lambda b(m, n, o)$ is to be calculated (YES at S333b), the lithography control processor 310 advances processing to S340. Processes at S340 and the following steps are the same as the corresponding processes in FIG. 6.

2.4 Effect

According to the first embodiment, an exposure method includes;

> reading data indicating the relation between parameters IL(m), PJ(n), and M(o) and the optimum wavelength difference $\delta\lambda$b(m, n, o) between the first pulse laser beam and the second pulse laser beam, the parameters being related to exposure conditions under which a semiconductor wafer is exposed to a plurality of pulse laser beams including the first pulse laser beam and the second pulse laser beam (S201),
>
> determining the wavelength difference target value $\delta\lambda$t based on the data and command values of the parameters (S204),
>
> determining the short wavelength $\lambda$S as the wavelength of the first pulse laser beam and the long wavelength $\lambda$L as the wavelength of the second pulse laser beam based on the wavelength difference target value $\delta\lambda$t (S205), and
>
> outputting a wavelength setting signal to the laser apparatus 100 to cause emission of the pulse laser beams including the first pulse laser beam having the short wavelength $\lambda$S and the second pulse laser beam having the long wavelength $\lambda$L, and exposing the semiconductor wafer to the pulse laser beams (S207).

With this configuration, since data for each parameter is prepared in advance, it is possible to determine an appropriate value for the wavelength difference target value $\delta\lambda$t in accordance with the command values of the parameters and to expose the semiconductor wafer.

According to the first embodiment, the parameters include at least one of the parameter IL(m) of the illumination optical system 201 of the exposure apparatus 200 configured to expose the semiconductor wafer, the parameter PJ(n) of the projection optical system 202 of the exposure apparatus 200, and the parameter M(o) of a mask for exposing the semiconductor wafer.

Since an optimum wavelength difference is different depending on the parameters IL(m), PJ(n), and M(o), it is possible to determine an appropriate value for the wavelength difference target value $\delta\lambda$t by using at least one of the parameters IL(m), PJ(n), and M(o).

According to the first embodiment, the above-described data associates the parameters IL(m), PJ(n), and M(o) with the optimum wavelength difference $\delta\lambda$b(m, n, o) with which the focal point depth DOF(k) when the semiconductor wafer is exposed by using the parameters IL(m), PJ(n), and M(o) is maximum.

With this configuration, it is possible to increase the focal point depth when the semiconductor wafer is exposed. For example, when a resist film having a large film thickness is exposed, it is possible to maintain imaging performance in the thickness direction of the resist film.

According to the first embodiment, the exposure method further includes setting the parameters IL(m), PJ(n), and M(o) by the lithography control processor 310 (S332). The exposure method further includes setting, by the lithography control processor 310, a plurality of values as the wavelength difference $\delta\lambda$(k) and calculating, for each of the values, the focal point depth DOF(k) when the semiconductor wafer is exposed by using the parameters IL(m), PJ(n), and M(o) (S341 to S346). The lithography control processor 310 calculates the optimum wavelength difference $\delta\lambda$b(m, n, o) with which the focal point depth DOF(k) is maximum (S348) and produces the above-described data.

With this configuration, since the optimum wavelength difference $\delta\lambda$b(m, n, o) with which the focal point depth DOF(k) when the semiconductor wafer is exposed by using the parameters IL(m), PJ(n), and M(o) is maximum is calculated, it is possible to increase the focal point depth in actual exposure.

According to the first embodiment, the lithography control processor 310 calculates the focal point depth DOF(k) for each of the values as the wavelength difference $\delta\lambda$(k) by using the parameters IL(m), PJ(n), and M(o) and the short wavelength $\lambda$S(k) and the long wavelength $\lambda$L(k) set based on the standard wavelength $\lambda$cs of the laser apparatus 100 (S342 to S344).

With this configuration, since data is produced by using the short wavelength $\lambda$S(k) and the long wavelength $\lambda$L(k) set based on the standard wavelength $\lambda$cs, it is not needed to produce data by using a wavelength other than the standard wavelength $\lambda$cs. Moreover, it is possible to prevent increase of the amount of data.

According to the first modification, the lithography control processor 310 reads information on the exposure process PR(r) (S331a) and sets the parameters IL(r), PJ(r), and M(r) in accordance with the exposure process PR (r) (S332a).

With this configuration, since the parameters IL(r), PJ(r), and M(r) are set in accordance with the exposure process PR(r), a smaller amount of calculation is needed than in a case in which data is produced for all combinations of the values of the parameters IL(m), PJ(n), and M(o). Moreover, it is possible to prevent increase of the amount of data.

According to the second modification, the lithography control processor 310 determines whether to calculate the optimum wavelength difference $\delta\lambda$b(m, n, o) with which the focal point depth DOF(k) is maximum (S333b), and calculates the optimum wavelength difference $\delta\lambda$b(m, n, o) in accordance with a result of the determination.

With this configuration, since calculation is performed in accordance with a result of the determination of whether to calculate the optimum wavelength difference $\delta\lambda$b(m, n, o), a smaller amount of calculation is needed than in a case in which data is produced for all combinations of the values of the parameters IL(m), PJ(n), and M(o). Moreover, it is possible to prevent increase of the amount of data.

According to the first embodiment, the first pulse laser beam and the second pulse laser beam are emitted as a temporally overlapping pulse to the semiconductor wafer.

With this configuration, it is possible to reduce necessity for high-speed wavelength control.

According to the first embodiment, the exposure system further includes the memory 312 in which the optimum wavelength difference table is stored. The optimum wavelength difference table associates the parameters IL(m), PJ(n), and M(o) with the optimum wavelength difference $\delta\lambda$b(m, n, o) with which the focal point depth DOF(k) when the semiconductor wafer is exposed by using the parameters IL(m), PJ(n), and M(o) is maximum.

With this configuration, by reading data for each parameter from the memory 312, it is possible to determine an appropriate value for the wavelength difference target value $\delta\lambda$t in accordance with the command values of the parameters and to expose the semiconductor wafer.

As for any other point, the first embodiment is the same as the comparative example.

3. Exposure System Configured to Calculate Optimum Wavelength Difference Based on Test Exposure Result

3.1 Configuration

FIG. 14 schematically illustrates the configuration of an exposure system in a second embodiment. The exposure system includes a wafer inspection system 700 in addition to the laser apparatus 100, the exposure apparatus 200, and the lithography control processor 310. The wafer inspection system 700 includes an inspection device 701 and a wafer inspection processor 710.

The inspection device 701 is, for example, a device configured to emit a laser beam to a non-illustrated semiconductor wafer disposed on the workpiece table WT, to detect reflected light or diffracted light of the laser beam, and to measure the dimensions of a minute pattern formed on the semiconductor wafer. Alternatively, the inspection device 701 may be a device including a high-resolution scanning electron microscope (SEM) and configured to measure the dimensions of the minute pattern by capturing an image of the semiconductor wafer.

The wafer inspection processor 710 is a processing device including a memory 712 in which a control program is stored and a CPU 711 configured to execute the control program. The wafer inspection processor 710 is specially configured or programmed to execute various kinds of processing included in the present disclosure. The wafer inspection processor 710 is connected to each of the inspection device 701 and the lithography control processor 310 and transmits and receives various kinds of data and various signals to and from each of the inspection device 701 and the lithography control processor 310.

In the second embodiment, the lithography control processor 310 may be connected to the laser control processor 130 in addition to each of the exposure control processor 210 and the wafer inspection processor 710.

3.2 Operation

3.2.1 Data Production by Lithography Control Processor 310

Figure 15:
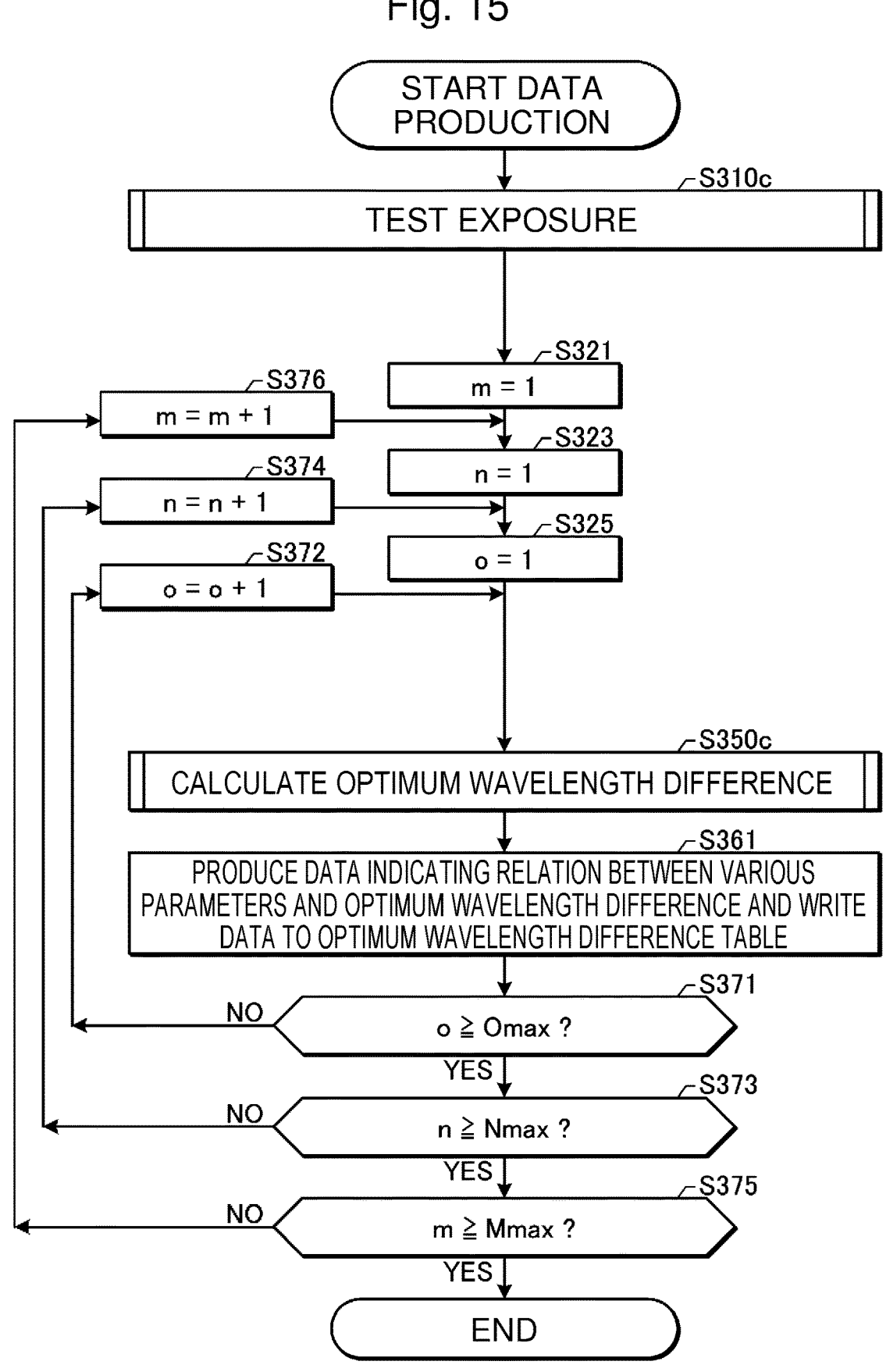
FIG. 15 is a flowchart illustrating processing of data production by a lithography control processor of the second embodiment.

FIG. 15 is a flowchart illustrating processing of data production by the lithography control processor 310 of the second embodiment.

At S310c, the lithography control processor 310 performs test exposure of the semiconductor wafer. Details of the test exposure will be described later with reference to FIG. 16.

Processes at S321 to S325 are the same as the corresponding processes in FIG. 6.

At S350c, the lithography control processor 310 calculates the optimum wavelength difference δλb(m, n, o). Details of S350c will be described later with reference to FIG. 18.

Processes at S361 and the following steps are the same as the corresponding processes in FIG. 6, and an optimum wavelength difference table in the same format as that described above with reference to FIG. 7 is produced through the processes.

3.2.2 Test Exposure

FIG. 16 is a flowchart illustrating processing of the test exposure in the second embodiment. The processing illustrated in FIG. 16 corresponds to a subroutine of S310c in FIG. 15. Through processing described below, the lithography control processor 310 performs the test exposure of the semiconductor wafer and writes a result of the test exposure to a test exposure table.

At S311, the lithography control processor 310 controls the exposure apparatus 200 and the laser apparatus 100 to perform the test exposure while changing a wavelength difference δλ(p) and a focus position F(q) in addition to the parameters IL(m), PJ(n), and M(o). The wavelength difference δλ(p) is the wavelength difference between the short wavelength λS and the long wavelength λL. The number of set values of the wavelength difference δλ(p) is Pmax, and p is an integer of one to Pmax. The focus position F(q) is a position at which a pulse laser beam having the standard wavelength λcs forms an image on the semiconductor wafer. The number of set values of the focus position F(q) is Qmax, and q is an integer of one to Qmax. The test exposure is performed with different values of the wavelength difference δλ(p) and the focus position F(q) in addition to the parameters IL(m), PJ(n), and M(o) for each region referred to as a scanning field SF of the semiconductor wafer. The scanning field SF will be described later with reference to FIGS. 26 to 28.

At S312, the lithography control processor 310 transmits, to the wafer inspection system 700, a signal that instructs measurement of a critical dimension (CD) value CD(m, n, o, p, q) of the semiconductor wafer. The CD value CD(m, n, o, p, q) of the semiconductor wafer is the dimensions of the minute pattern formed on the semiconductor wafer.

At S313, the lithography control processor 310 waits for completion of the measurement of the CD value CD(m, n, o, p, q) of the semiconductor wafer. When the measurement of the CD value CD(m, n, o, p, q) of the semiconductor wafer is completed, the lithography control processor 310 advances processing to S314.

At S314, the lithography control processor 310 receives a result of the measurement of the CD value CD(m, n, o, p, q) in each scanning field SF from the wafer inspection system 700.

At S315, the lithography control processor 310 receives the parameters IL(m), PJ(n), and M(o), the wavelength difference δλ(p), and the focus position F(q) in each scanning field SF from the exposure apparatus 200.

At S316, the lithography control processor 310 writes the parameters IL(m), PJ(n), and M(o), the wavelength difference δλ(p), the focus position F(q), and the measurement result of the CD value CD(m, n, o, p, q) to the test exposure table.

After S316, the lithography control processor 310 ends processing of the present flowchart and returns to the processing illustrated in FIG. 15.

FIG. 17 illustrates an example of the test exposure table. The test exposure table is stored in the memory 312. The test exposure table associates the measurement result of the CD value CD(m, n, o, p, q) with a combination of values indicating the parameters IL(m), PJ(n), and M(o), the wavelength difference δλ(p), and the focus position F(q). The CD value CD (m, n, o, p, q) is calculated for each combination of values indicating the parameters IL(m), PJ(n), and M(o), the wavelength difference δλ(p), and the focus position F(q). When C2 represents the number of combinations of values indicating the parameters IL(m), PJ(n), and M(o), the wavelength difference δλ(p), and the focus position F(q), C2 is given by an expression below.

$$C2 = M\ max \times N\ max \times O\ max \times P\ max \times Q\ max$$

3.2.3 Optimum Wavelength Difference Calculation

Figure 18:
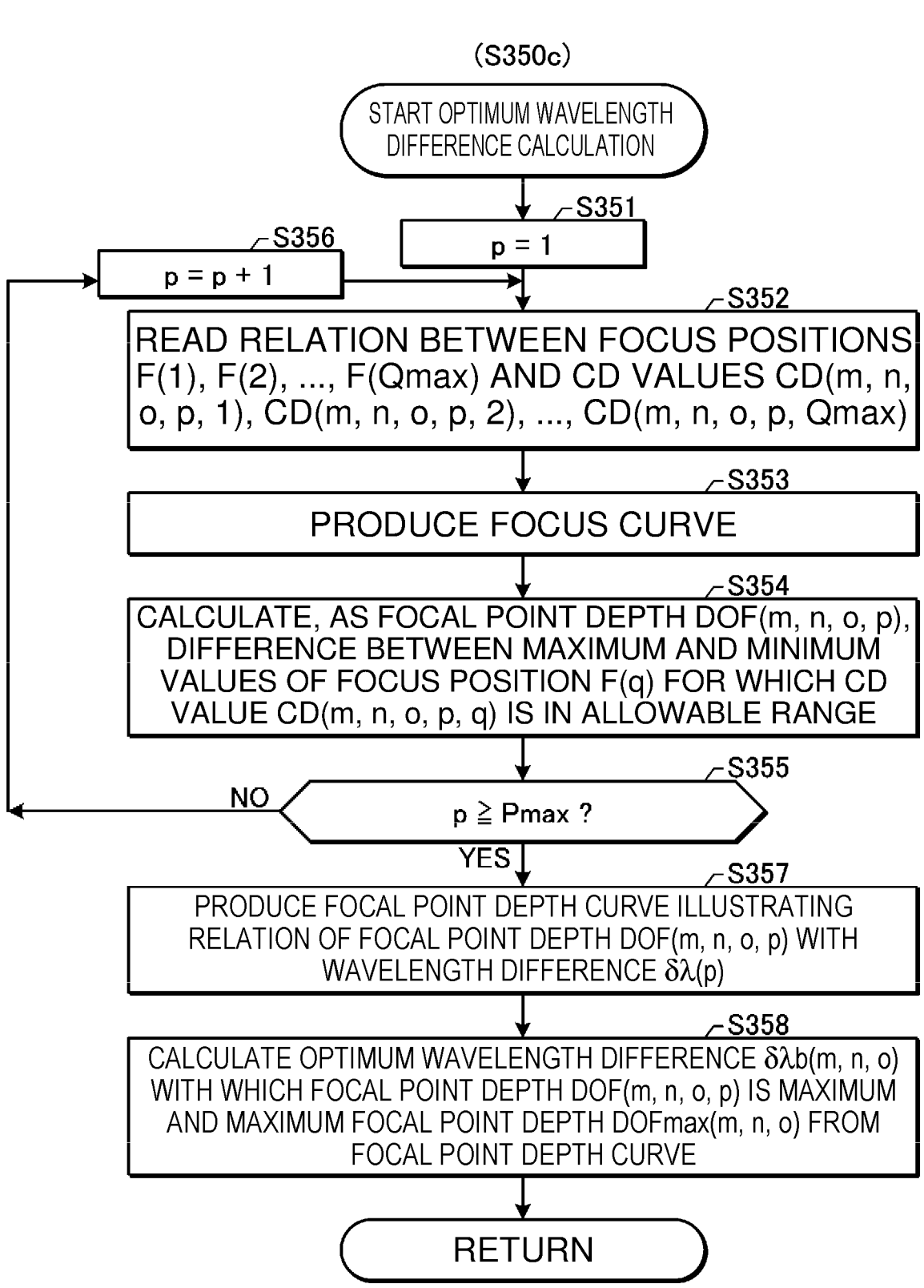
FIG. 18 is a flowchart illustrating processing of optimum wavelength difference calculation in the second embodiment.

FIG. 18 is a flowchart illustrating processing of calculation of the optimum wavelength difference $\delta\lambda b(m, n, o)$ in the second embodiment. The processing illustrated in FIG. 18 corresponds to a subroutine of S350$c$ in FIG. 15. The lithography control processor 310 calculates, in accordance with a combination of the values of the parameters IL(m), PJ(n), and M(o) related to exposure conditions, a wavelength difference with which the focal point depth when a semiconductor wafer is exposed is maximum, as the optimum wavelength difference $\delta\lambda b(m, n, o)$.

At S351, the lithography control processor 310 sets, to one, a counter p for specifying an individual value of the wavelength difference $\delta\lambda(p)$.

At S352, the lithography control processor 310 reads the relation between the focus position F(q) and the CD value CD(m, n, o, p, q). The values of the counters m, n, o, and p are each set to one value through processing at S321, S323, S325, S372, S374, and S376 (refer to FIG. 15), S351, and S356 to be described later. Thus, the relation between Qmax focus positions F(1), F(2), . . . , F(Qmax) and Qmax CD values CD(m, n, o, p, 1), CD(m, n, o, p, 2), . . . , CD(m, n, o, p, Qmax) is read at S352.

At S353, the lithography control processor 310 produces a focus curve illustrating the relation of the CD value CD(m, n, o, p, q) with the focus position F(q).

Figure 19:
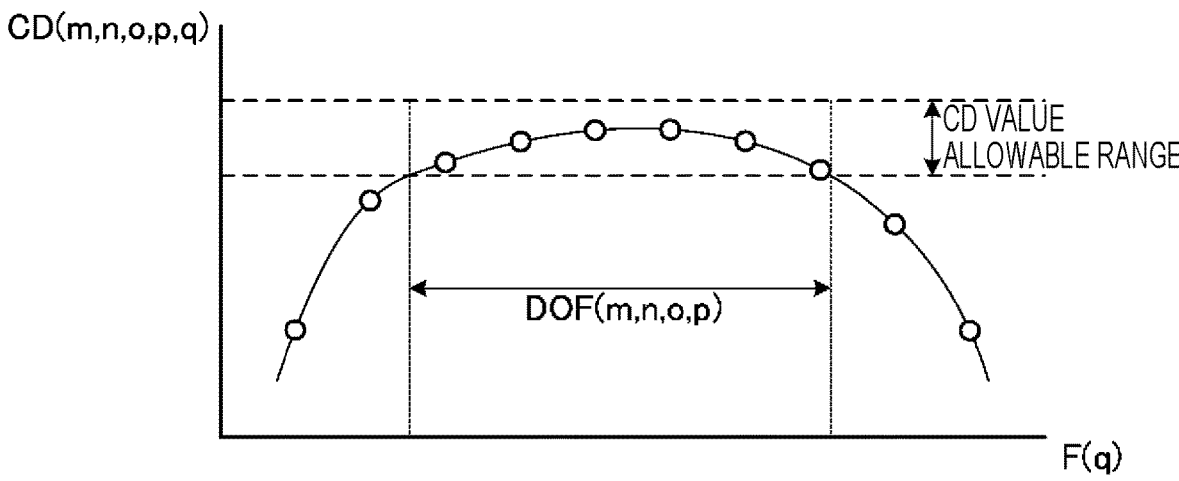
FIG. 19 illustrates an exemplary focus curve.

FIG. 19 illustrates an exemplary focus curve. In FIG. 19, the horizontal axis represents the focus position F(q), and the vertical axis represents the CD value CD(m, n, o, p, q). The focus curve may be illustrated as a broken line graph or may be illustrated as an approximate curve as in FIG. 19.

At S354 in FIG. 18, the lithography control processor 310 calculates a focal point depth DOF(m, n, o, p) based on the range of the focus position F(q) for which the CD value CD(m, n, o, p, q) is in an allowable range.

FIG. 19 illustrates an exemplary allowable range of the CD value CD(m, n, o, p, q). The focal point depth DOF(m, n, o, p) is the size of the range of the focus position F(q) at a part where the CD value CD(m, n, o, p, q) is in the allowable range on the focus curve.

At S355 in FIG. 18, the lithography control processor 310 determines whether the value of the counter p is equal to or larger than Pmax. When the value of the counter p is smaller than Pmax (NO at S355), the lithography control processor 310 advances processing to S356. At S356, the lithography control processor 310 adds one to the value of the counter p and thereafter, returns processing to S352. When the value of the counter p is equal to or larger than Pmax (YES at S355), the lithography control processor 310 advances processing to S357. Each time YES determination is performed at S355, Pmax pieces of the wavelength difference $\delta\lambda(p)$ are set and Pmax focal point depths DOF(m, n, o, 1), DOF(m, n, o, 2), . . . , DOF(m, n, o, Pmax) are calculated for one combination of the values of the parameters IL(m), PJ(n), and M(o).

At S357, the lithography control processor 310 produces a graph of a focal point depth curve illustrating the relation of the focal point depth DOF(m, n, o, p) with the wavelength difference $\delta\lambda(p)$ for one combination of the values of the parameters IL(m), PJ(n), and M(o).

At S358, from the focal point depth curve, the lithography control processor 310 calculates, as the optimum wavelength difference $\delta\lambda b(m, n, o)$, a wavelength difference with which the focal point depth is maximum, and calculates the maximum focal point depth DOFmax(m, n, o).

After S358, the lithography control processor 310 ends processing of the present flowchart and returns to the processing illustrated in FIG. 15.

3.3 Effect

According to the second embodiment, the exposure method further includes setting a plurality of focus positions F(q) by the lithography control processor 310, and performing, by the exposure apparatus 200, test exposure of a semiconductor wafer with a plurality of pulse laser beams for each of the focus positions F(q) (S311). The exposure method further includes measuring, by the wafer inspection system 700, the CD value CD(m, n, o, p, q) of the semiconductor wafer subjected to the test exposure (S312). The lithography control processor 310 produces the above-described data based on the focus positions F(q) and the CD value CD(m, n, o, p, q) (S351 to S358).

With this configuration, since data is produced by using actual values, it is possible to determine an appropriate value for the wavelength difference target value $\delta\lambda t$ by using the data.

According to the second embodiment, the lithography control processor 310 calculates the focal point depth DOF(m, n, o, p) based on the range of the focus position F(q) with which the CD value CD(m, n, o, p, q) is in an allowable range among the focus positions F(q) (S354).

With this configuration, since the focal point depth DOF(m, n, o, p) is calculated by measuring a semiconductor wafer actually exposed, it is possible to obtain data appropriate for determining the wavelength difference target value $\delta\lambda t$.

As for any other point, the second embodiment is the same as the first embodiment.

4. Line Narrowing Device 14d Configured to Perform Wavelength Selection of Three Wavelengths or More

4.1 Configuration

Figure 20:
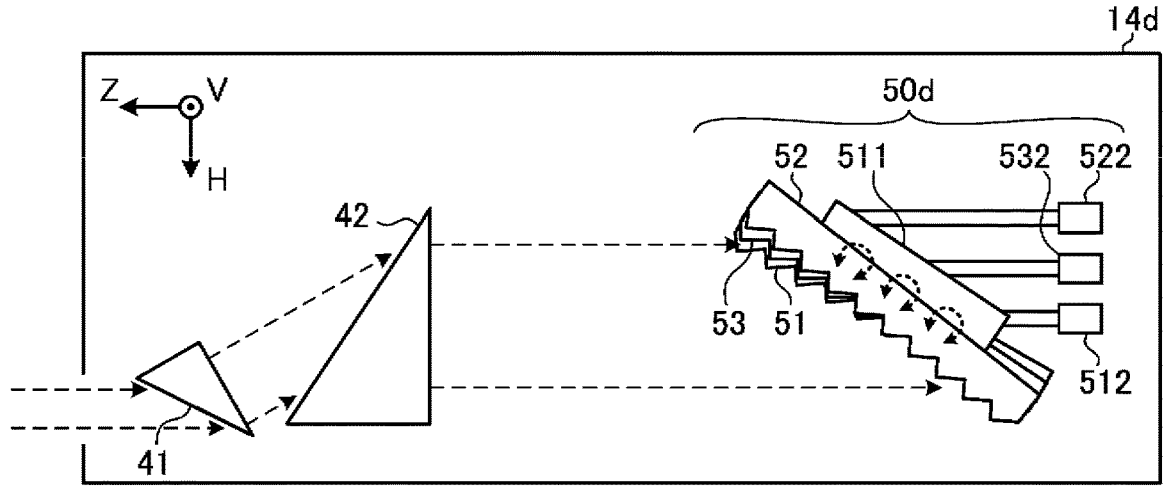
FIG. 20 schematically illustrates the configuration of a line narrowing device in a third embodiment.
Figure 21:
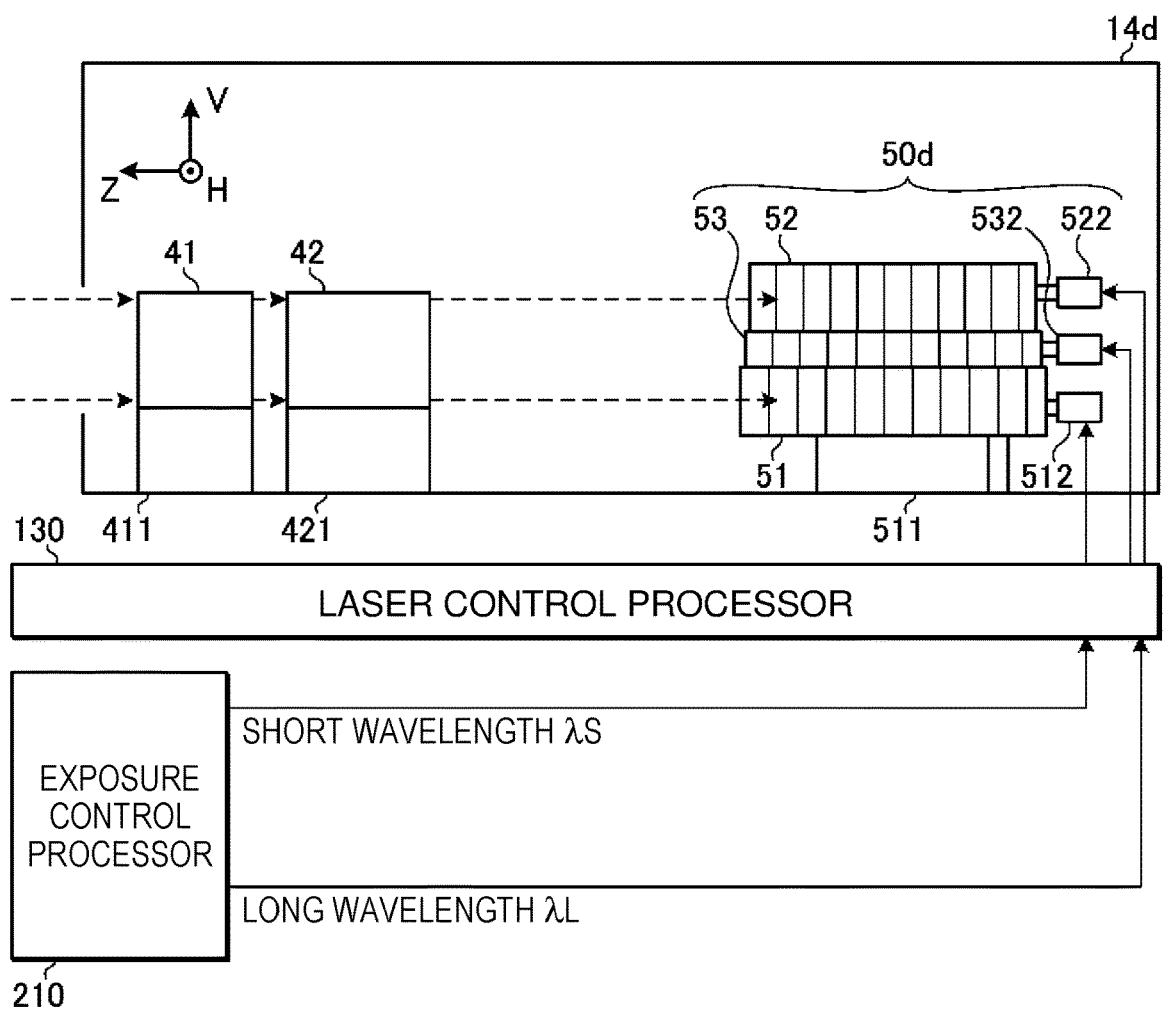
FIG. 21 schematically illustrates the configuration of the line narrowing device in the third embodiment.

FIGS. 20 and 21 schematically illustrate the configuration of a line narrowing device 14$d$ in a third embodiment. FIG. 20 illustrates the line narrowing device 14$d$ when viewed in the negative V direction, and FIG. 21 illustrates the line narrowing device 14$d$ when viewed in the negative H direction.

The line narrowing device 14$d$ includes a grating system 50$d$ in place of the grating system 50 described above with reference to FIGS. 3 and 4. The grating system 50$d$ includes a grating 53 in addition to the gratings 51 and 52.

The configurations of the gratings 51 and 52 and the rotation mechanism 522 are the same as the corresponding configurations in FIGS. 3 and 4. However, the grating 51 is rotatable about an axis parallel to the V axis by a rotation mechanism 512.

The grating 53 is disposed alongside the gratings 51 and 52 in the direction of the V axis on the optical path of an optical beam having passed through the second prism 42. The grating 53 is positioned between the gratings 51 and 52. The direction of grooves of the grating 53 aligns with the direction of the V axis. The grating 53 is supported by the holder 511. The grating 53 is rotatable about an axis parallel to the V axis by a rotation mechanism 532.

The second prism 42 described above with reference to FIGS. 3 and 4 is rotatable by the rotation stage 422, but in the third embodiment, the second prism 42 may be fixed in a state being supported by the holder 421.

4.2 Operation

4.2.1 Operation of Laser Apparatus 100

Light having passed through the second prism 42 is incident over the gratings 51, 52, and 53. The grating 51 is disposed in Littrow arrangement such that the incident angle of an optical beam incident on the grating 51 from the second prism 42 matches the diffracting angle of diffracted light of a desired short wavelength λS. The grating 52 is disposed in Littrow arrangement such that the incident angle of an optical beam incident on the grating 52 from the second prism 42 matches the diffracting angle of diffracted light of the desired the long wavelength λL. The grating 53 is disposed in Littrow arrangement such that the incident angle of an optical beam incident on the grating 53 from the second prism 42 matches the diffracting angle of diffracted light of a desired middle wavelength λM. The middle wavelength λM corresponds to a third wavelength in the present disclosure.

The rotation mechanisms 512, 522, and 532 are controlled by the laser control processor 130.

As the rotation mechanisms 512, 522, and 532 slightly rotate the gratings 51, 52, and 53, respectively, the incident angles of respective optical beams incident on the gratings 51, 52, and 53 from the second prism 42 slightly change. Accordingly, the short wavelength λS, the long wavelength λL, and the middle wavelength λM change, respectively.

The exposure control processor 210 transmits the values of the short wavelength λS and the long wavelength λL to the laser control processor 130. The laser control processor 130 controls the rotation mechanisms 512, 522, and 532 based on the values. The middle wavelength λM is calculated by the laser control processor 130 as described later with reference to FIG. 22.

Through the above-described configuration and operation, optical beams having the short wavelength λS, the long wavelength λL, and the middle wavelength λM are selected from among optical beams output through the window 10a of the laser chamber 10 and returned into the laser chamber 10. Accordingly, the laser apparatus 100 can perform three-wavelength oscillation.

A pulse laser beam subjected to three-wavelength oscillation and output from the laser apparatus 100 includes three wavelength components of the short wavelength λS, the long wavelength λL, and the middle wavelength λM. The pulse laser beam includes a pulse for which a first pulse laser beam having the short wavelength λS, a second pulse laser beam having the long wavelength λL, and a third pulse laser beam having the middle wavelength λM temporally and spatially overlap. Alternatively, the first to third pulse laser beams may temporally overlap but not spatially overlap.

FIGS. 20 and 21 illustrate the line narrowing device 14d when the laser apparatus 100 performs three-wavelength oscillation, but the present disclosure is not limited thereto. The number of gratings disposed alongside in the direction of the V axis may be increased to perform laser oscillation at a larger number of wavelengths than three wavelengths.

4.2.2 Operation of Laser Control Processor 130

FIG. 22 is a flowchart illustrating processing of laser control by the laser control processor 130 of the third embodiment. The laser control processor 130 sets three oscillation wavelengths or more through processing described below.

At S101, the laser control processor 130 sets laser parameters including the short wavelength λS and the long wavelength λL. The short wavelength λS and the long wavelength λL thus set may be included in a wavelength setting signal received from the exposure control processor 210.

At S102, the laser control processor 130 sets a wavelength shift amount δλs by an expression below.

$$\delta\lambda s = (\lambda L - \lambda S)/(W \max - 1)$$

In the expression, Wmax represents the number of oscillation wavelengths. For example, the value of Wmax is three in a case of three-wavelength oscillation.

At S103, the laser control processor 130 sets the value of a counter w to one.

At S104, the laser control processor 130 determines, by an expression below, a wavelength λ(w) set for each value of the counter w and controls the posture of the w-th grating.

$$\lambda(w) = \lambda S + (w-1) \cdot \delta\lambda s$$

When the value of the counter w is one, λ(w) is equal to the short wavelength λS, and for example, the posture of the grating 51 described above with reference to FIGS. 20 and 21 is controlled based on the wavelength λ(w).

When the value of the counter w is Wmax, λ(w) is equal to the long wavelength λL, and for example, the posture of the grating 52 described above with reference to FIGS. 20 and 21 is controlled based on the wavelength λ(w).

When the value of the counter w is larger than one and is smaller than Wmax, λ(w) is longer than the short wavelength λS and is shorter than the long wavelength λL. For example, when the value of Wmax is three and the value of the counter w is two, λ(w) is equal to the middle wavelength λM described above with reference to FIGS. 20 and 21 and the posture of the grating 53 is controlled based on the wavelength λ(w).

At S106, the laser control processor 130 determines whether the value of the counter w is equal to or larger than Wmax. When the value of the counter w is smaller than Wmax (NO at S106), the laser control processor 130 advances processing to S107. At S107, the laser control processor 130 adds one to the value of the counter w and thereafter, returns processing to S104. When the value of the counter w is equal to or larger than Wmax (YES at S106), the laser control processor 130 advances processing to S108. Accordingly, Wmax oscillation wavelengths λ(w) are set and the posture of a grating corresponding to each oscillation wavelength λ(w) is controlled.

At S108, the laser control processor 130 receives a trigger signal and transmits the trigger signal to the switch 13a of the pulse power module 13 to cause emission of a pulse laser beam from the laser apparatus 100.

At S130, the laser control processor 130 determines whether the laser parameters are to be updated. When the laser parameters are to be updated (YES at S130), the laser control processor 130 returns processing to S101. When the laser parameters are not to be updated (NO at S130), the laser control processor 130 returns processing to S108.

4.3 Other Exemplary Configurations

The description in the third embodiment is made on the case in which the laser control processor 130 calculates the middle wavelength λM, but the present disclosure is not limited thereto. For example, the exposure control processor 210 may calculate the middle wavelength λM and transmit the middle wavelength λM as a wavelength command value to the laser control processor 130.

4.4 Effect

According to the third embodiment, a plurality of pulse laser beams further include the third pulse laser beam having the middle wavelength $\lambda M$ that is longer than the short wavelength $\lambda S$ and is shorter than the long wavelength $\lambda L$.

With this configuration, it is possible to perform imaging at a large number of different positions in the thickness direction of the semiconductor wafer, thereby improving imaging performance.

5. Line Narrowing Device 14e Configured to Switch Selection Wavelength in the Units of Pulses

5.1 Configuration

Figure 23:
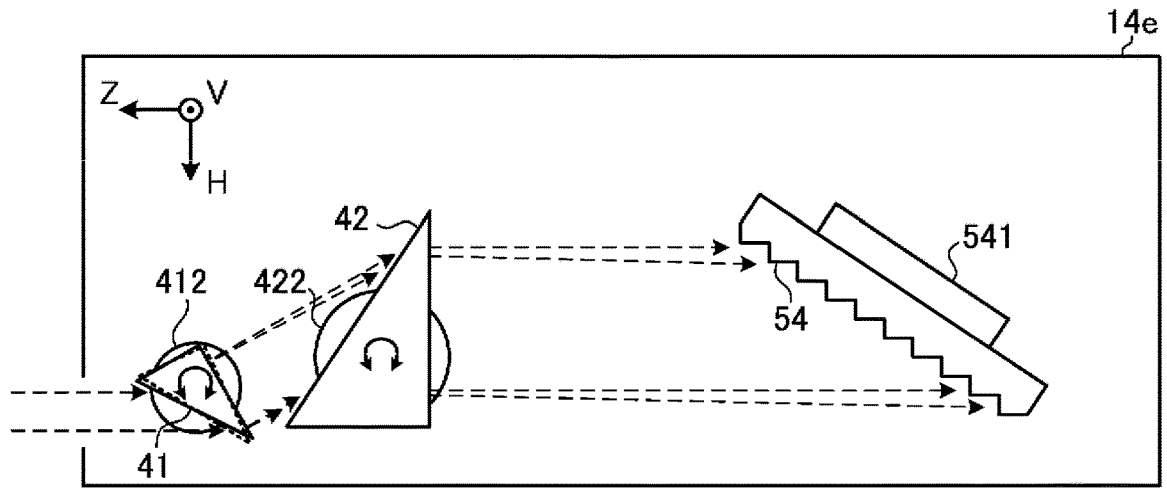
FIG. 23 schematically illustrates the configuration of a line narrowing device in a fourth embodiment FIG. 24 schematically illustrates the configuration of the line narrowing device in the fourth embodiment.
Figure 24:
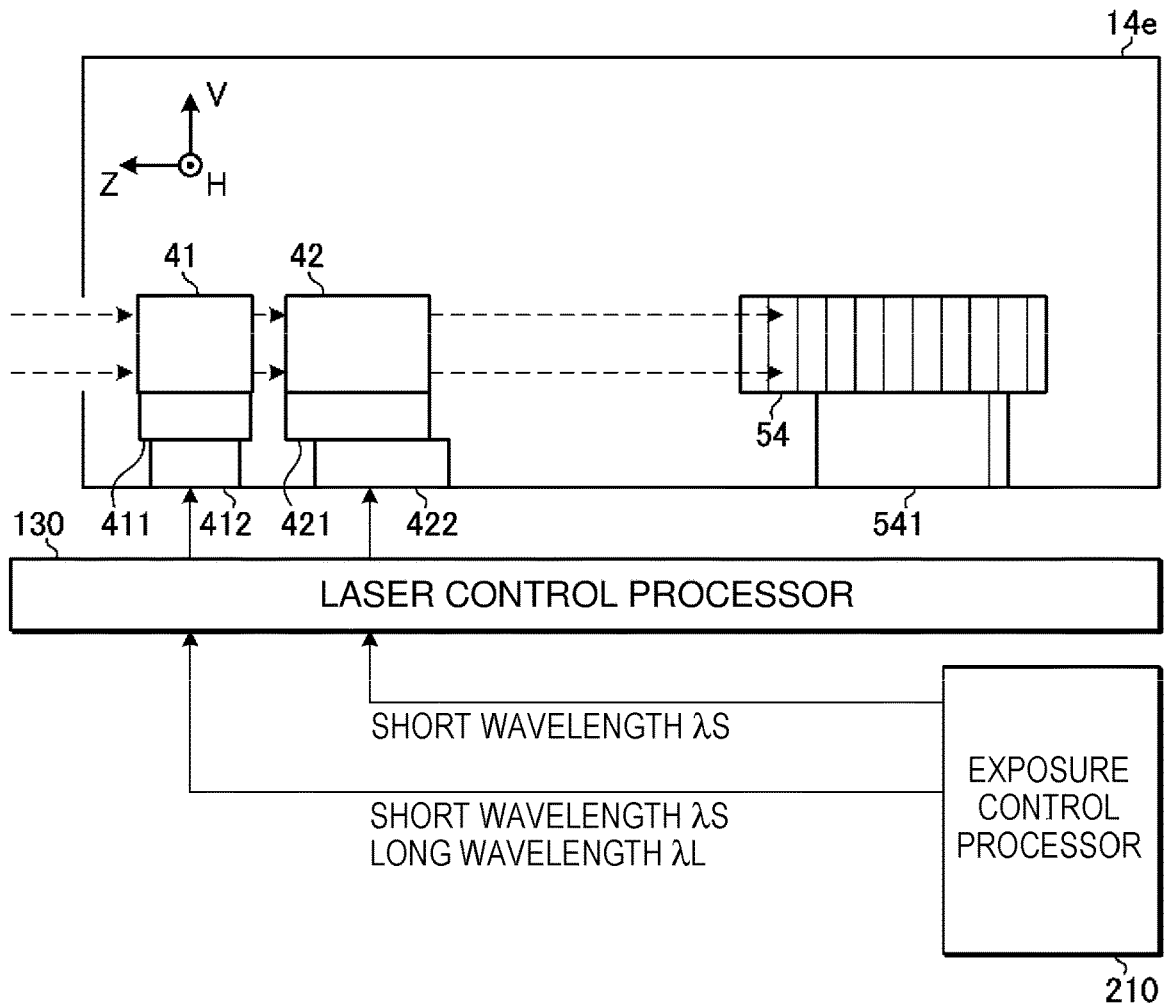

FIGS. 23 and 24 schematically illustrate the configuration of a line narrowing device 14e in a fourth embodiment. FIG. 23 illustrates the line narrowing device 14e when viewed in the negative V direction, and FIG. 24 illustrates the line narrowing device 14e when viewed in the negative H direction.

The line narrowing device 14e includes a grating 54 in place of the grating system 50 described above with reference to FIGS. 3 and 4. The grating 54 is disposed on the optical path of an optical beam having passed through the second prism 42 and is supported by a holder 541 to maintain a constant posture. The direction of grooves of the grating 54 aligns with the direction of the V axis.

The first prism 41 included in the line narrowing device 14e is rotatable about an axis parallel to the V axis by a rotation stage 412. The rotation stage 412 is, for example, a high-response rotation stage configured to be rotated by a piezoelectric element.

5.2 Operation 5.2.1 Operation of Laser Apparatus 100

An optical beam output through the window 10a passes through the first and second prisms 41 and 42 and is incident on the grating 54. The wavelength of light returned from the grating 54 to the laser chamber 10 through the second and first prisms 42 and 41 is adjusted by the postures of the prisms.

The laser control processor 130 controls the rotation stage 422 of the second prism 42 based on the short wavelength $\lambda S$ received from the exposure control processor 210.

The laser control processor 130 controls the rotation stage 412 of the first prism 41 based on both the short wavelength $\lambda S$ and the long wavelength $\lambda L$ received from the exposure control processor 210 or based on the difference between the wavelengths. As the posture of the first prism 41 is changed by the rotation stage 412, the state of an optical beam is switched between a first state in which the optical beam having passed through the first prism 41 is incident on the grating 54 at the first incident angle and a second state in which the optical beam having passed through the first prism 41 is incident on the grating 54 at the second incident angle. FIG. 23 illustrates the optical paths of two kinds of optical beams in the first state and the second state. The laser control processor 130 controls the rotation stage 412 to periodically switch the posture of the first prism 41 in a set number N of pulses per cycle. Accordingly, the wavelength of a pulse laser beam is periodically switched between the short wavelength $\lambda S$ and the long wavelength $\lambda L$ in the number N of pulses per cycle.

Since the first prism 41 is disposed at a position before the second prism 42 in the direction of beam width enlargement, the first prism 41 has a small size and can be controlled at high speed.

The description in the present embodiment is made on the example in which the rotation stage 422 of the second prism 42 is controlled based on the short wavelength $\lambda S$, but the present disclosure is not limited thereto. No rotation control of the second prism 42 may be performed when the oscillation wavelength can be adjusted to the short wavelength $\lambda S$ and the long wavelength $\lambda L$ only by rotation control of the first prism 41.

Figure 25:
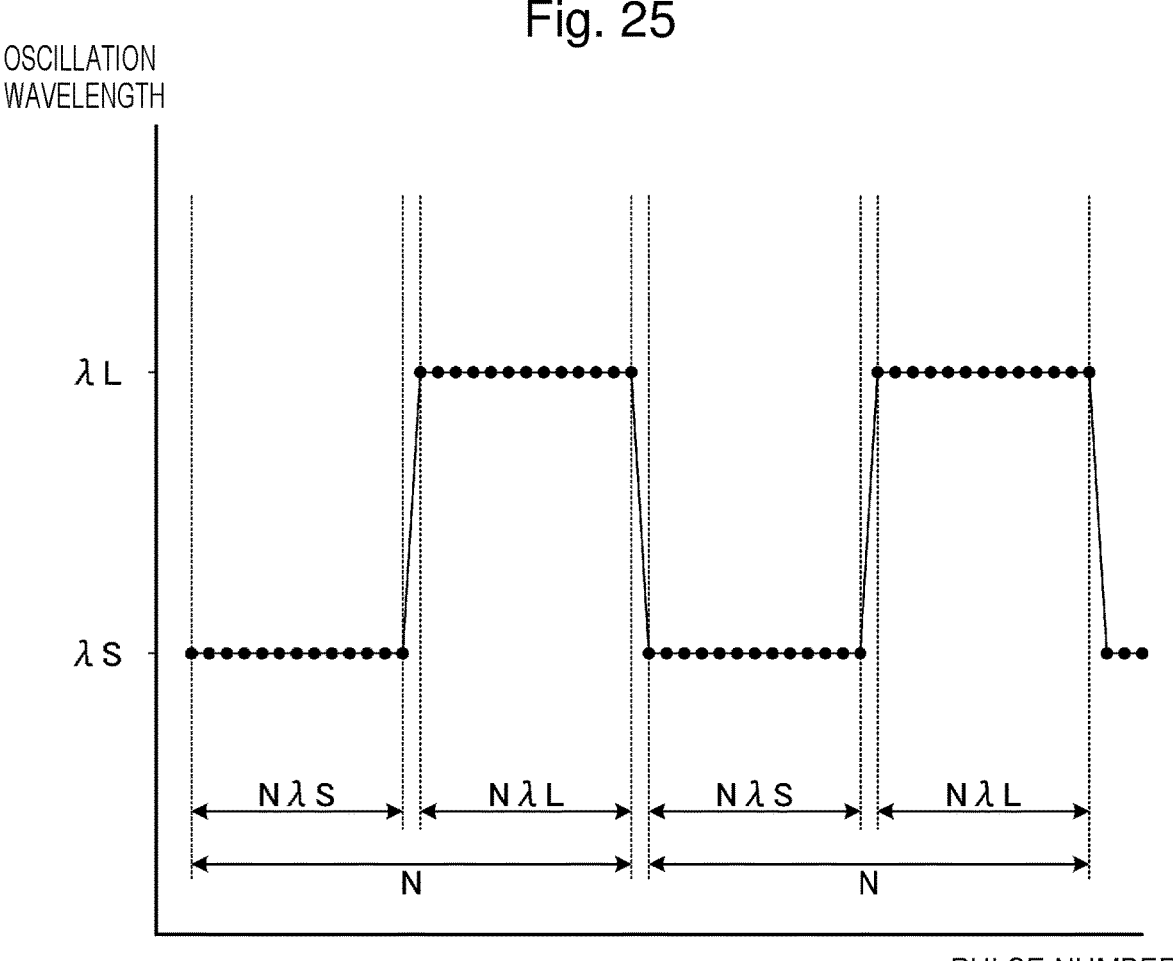
FIG. 25 is a graph illustrating oscillation wavelength change in the fourth embodiment.

FIG. 25 is a graph illustrating oscillation wavelength change in the fourth embodiment. In FIG. 25, the horizontal axis represents the pulse number, and the vertical axis represents the oscillation wavelength.

In the example illustrated in FIG. 25, pulses of the short wavelength $\lambda S$ and pulses of the long wavelength $\lambda L$ are periodically switched in the set number N of pulses per cycle and output. Specifically, the first pulse laser beam of $N\lambda S$ pulses having the short wavelength $\lambda S$ is continuously output, and the second pulse laser beam of $N\lambda L$ pulses having the long wavelength $\lambda L$ is continuously output. The wavelengths are periodically switched in a cycle of outputting of the first pulse laser beam of $N\lambda S$ pulses and the second pulse laser beam of $N\lambda L$ pulses. The number N of pulses per cycle is equal to a value obtained by adding $N\lambda S$ and $N\lambda L$. The first pulse laser beam and the second pulse laser beam are emitted to the semiconductor wafer at timings that are different from each other.

FIGS. 26 to 28 illustrate a situation in which the position of the scanning field SF of the semiconductor wafer changes relative to the position of a beam section B of a pulse laser beam. The scanning field SF of the semiconductor wafer corresponds to, for example, a region in which some semiconductor chips among a large number of semiconductor chips formed on the semiconductor wafer are formed. The width of the scanning field SF in an X axial direction is equal to the width of the beam section B of a pulse laser beam in the X axial direction at the position of the semiconductor wafer. The width of the scanning field SF in a Y axial direction is larger than a width W of the beam section B of a pulse laser beam in the Y axial direction at the position of the semiconductor wafer.

The procedure of exposing the scanning field SF to a pulse laser beam is performed in the order of FIGS. 26 27, and 28. First, as illustrated in FIG. 26, the workpiece table WT is positioned such that an end SFy+ of the scanning field SF in the positive Y direction is positioned at a predetermined distance in the negative Y direction from the position of an end By− of the beam section B in the negative Y direction. Then, the workpiece table WT is accelerated in the positive Y direction to achieve a speed V until the end SFy+ of the scanning field SF in the positive Y direction reaches the position of the end By− of the beam section B in the negative Y direction. As illustrated in FIG. 27, the workpiece table WT is moved to perform uniform linear motion of the position of the scanning field SF at the speed V relative to the position of the beam section B. As illustrated in FIG. 28, exposure of the scanning field SF ends after the workpiece table WT is moved until an end SFy− of the scanning field SF in the negative Y direction passes by the position of an end By+ of the beam section B in the positive Y direction. In this manner, exposure is performed while the scanning field SF is moved relative to the position of the beam section B.

A required time "Time" taken for the scanning field SF to move at the speed V by a distance equal to the width W of the beam section B is given by an expression below.

$$Time=W/V$$

A summed number Ns of pulses of the first and second pulse laser beams emitted to one optional place in the scanning field SF is equal to the number of pulses of a pulse laser beam generated in the required time "Time" and is given by an expression below.

$$Ns=F\cdot Time$$

$$=F\cdot W/V$$

In the expression, F represents the repetition frequency of the pulse laser beam.

The summed number Ns of pulses is also referred to as an N-slit pulse number.

The number N of pulses per wavelength switching cycle is set so that the N-slit pulse number Ns is equal to an integer multiple of the number N of pulses per cycle. Accordingly, the same ratio of the number of pulses of the first pulse laser beam and the number of pulses of the second pulse laser beam can be obtained at all places in the scanning field SF. For example, the number N of pulses per cycle is set to be equal to the N-slit pulse number Ns. Accordingly, the first pulse laser beam of $N\lambda S$ pulses and the second pulse laser beam of $N\lambda L$ pulses are emitted to one optional place in the scanning field SF.

5.2.2 Operation of Laser Control Processor 130

FIG. 29 is a flowchart illustrating processing of laser control by the laser control processor 130 of the fourth embodiment. The laser control processor 130 switches the short wavelength $\lambda S$ and the long wavelength $\lambda L$ through processing described below.

At S111, the laser control processor 130 sets laser parameters including the short wavelength $\lambda S$, the long wavelength $\lambda L$, and the number N of pulses per wavelength switching cycle. The short wavelength $\lambda S$, the long wavelength $\lambda L$, and the number N of pulses per cycle thus set may be included in a wavelength setting signal received from the exposure control processor 210.

At S112, the laser control processor 130 calculates a number $N\lambda S$ of pulses of the first pulse laser beam having the short wavelength $\lambda S$ and a number $N\lambda L$ of pulses of the second pulse laser beam having the long wavelength $\lambda L$ in the number N of pulses per cycle. The calculation of these numbers of pulses is performed as described below, for example.

$$N\lambda S=ROUND(N/2)$$

$$N\lambda L=N-N\lambda S$$

The function ROUND(X) provides a value obtained by rounding X.

At S113, the laser control processor 130 starts reception of a trigger signal from the exposure control processor 210.

At S114, the laser control processor 130 controls the line narrowing device 14e so that the oscillation wavelength becomes closer to the short wavelength $\lambda S$. The laser control processor 130 continues this processing until the laser apparatus 100 outputs a pulse laser beam of $N\lambda S$ pulses.

At S115, the laser control processor 130 controls the line narrowing device 14e so that the oscillation wavelength becomes closer to the long wavelength $\lambda L$. The laser control processor 130 continues this processing until the laser apparatus 100 outputs a pulse laser beam of $N\lambda L$ pulses.

At S130, the laser control processor 130 determines whether the laser parameters are to be updated. When the laser parameters are to be updated (YES at S130), the laser control processor 130 returns processing to S111. When the laser parameters are not to be updated (NO at S130), the laser control processor 130 returns processing to S114.

5.3 Other Exemplary Configurations

The description in the fourth embodiment is made on the case in which the laser control processor 130 sets the numbers $N\lambda S$ and $N\lambda L$ of pulses, but the present disclosure is not limited thereto. For example, the exposure control processor 210 may set the numbers $N\lambda S$ and $N\lambda L$ of pulses and transmit a wavelength command value to the laser control processor 130 at each pulse.

The description in the fourth embodiment is made on the case in which the posture of the first prism 41 is switched in each number N of pulses per cycle, but the present disclosure is not limited thereto. For example, the posture of the second prism 42 or the grating 54 may be switched in the number N of pulses per cycle.

5.4 Effect

According to the fourth embodiment, the first pulse laser beam and the second pulse laser beam are emitted to the semiconductor wafer at timings that are different from each other.

With this configuration, it is possible to expose the semiconductor wafer at a plurality of wavelengths without complication of the configuration of the line narrowing device 14e.

6. Line Narrowing Device 14e Configured to Perform Wavelength Switching of Three Wavelengths or More In a fifth embodiment of the present disclosure, wavelength switching of three wavelengths or more is performed with the same configuration as that of the line narrowing device 14e according to the fourth embodiment described above with reference to FIGS. 23 and 24.

6.1 Operation 6.1.1 Operation of Laser Apparatus 100

Figure 30:
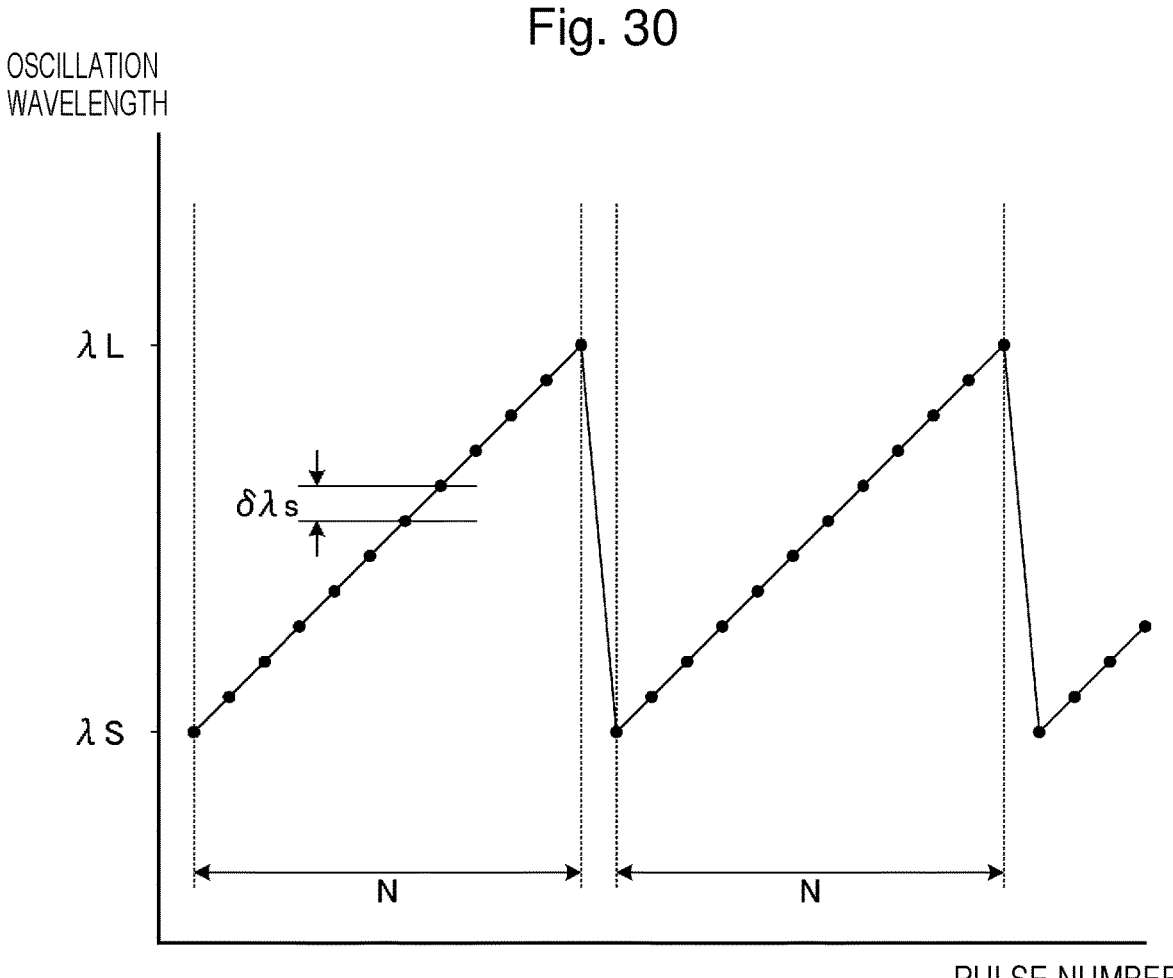
FIG. 30 is a graph illustrating oscillation wavelength change in a fifth embodiment.

FIG. 30 is a graph illustrating oscillation wavelength change in the fifth embodiment. In FIG. 30, the horizontal axis represents the pulse number, and the vertical axis represents the oscillation wavelength.

The laser control processor 130 controls the rotation stage 422 of the second prism 42 based on the short wavelength $\lambda S$ received from the exposure control processor 210.

The laser control processor 130 controls the rotation stage 412 of the first prism 41 to slightly rotate the first prism 41 each time one pulse of a pulse laser beam is output. Accordingly, a wavelength selected by the line narrowing device 14e slightly increases per pulse. A wavelength shift amount per pulse is denoted by $\delta\lambda s$.

When the selected wavelength has reached the long wavelength $\lambda L$ received from the exposure control processor 210, the laser control processor 130 rotates the first prism 41 in the opposite direction and controls the rotation stage 412 to return the selected wavelength to the short wavelength $\lambda S$. When the selected wavelength is returned to the short wavelength $\lambda S$, the laser control processor 130 slightly increases the selected wavelength again each time one pulse of a pulse laser beam is output.

In this manner, the laser control processor 130 controls the rotation stage 412 to change the posture of the first prism 41 for each pulse and to periodically change the posture of the first prism 41 in each set number N of pulses per cycle. Accordingly, the wavelength of a pulse laser beam changes at multiple stages between the short wavelength λS and the long wavelength λL and periodically changes in each set number N of pulses per cycle. Pulses in the number N of pulses are emitted to the semiconductor wafer at timings that are different from one another.

6.1.2 Operation of Laser Control Processor 130

Figure 31:
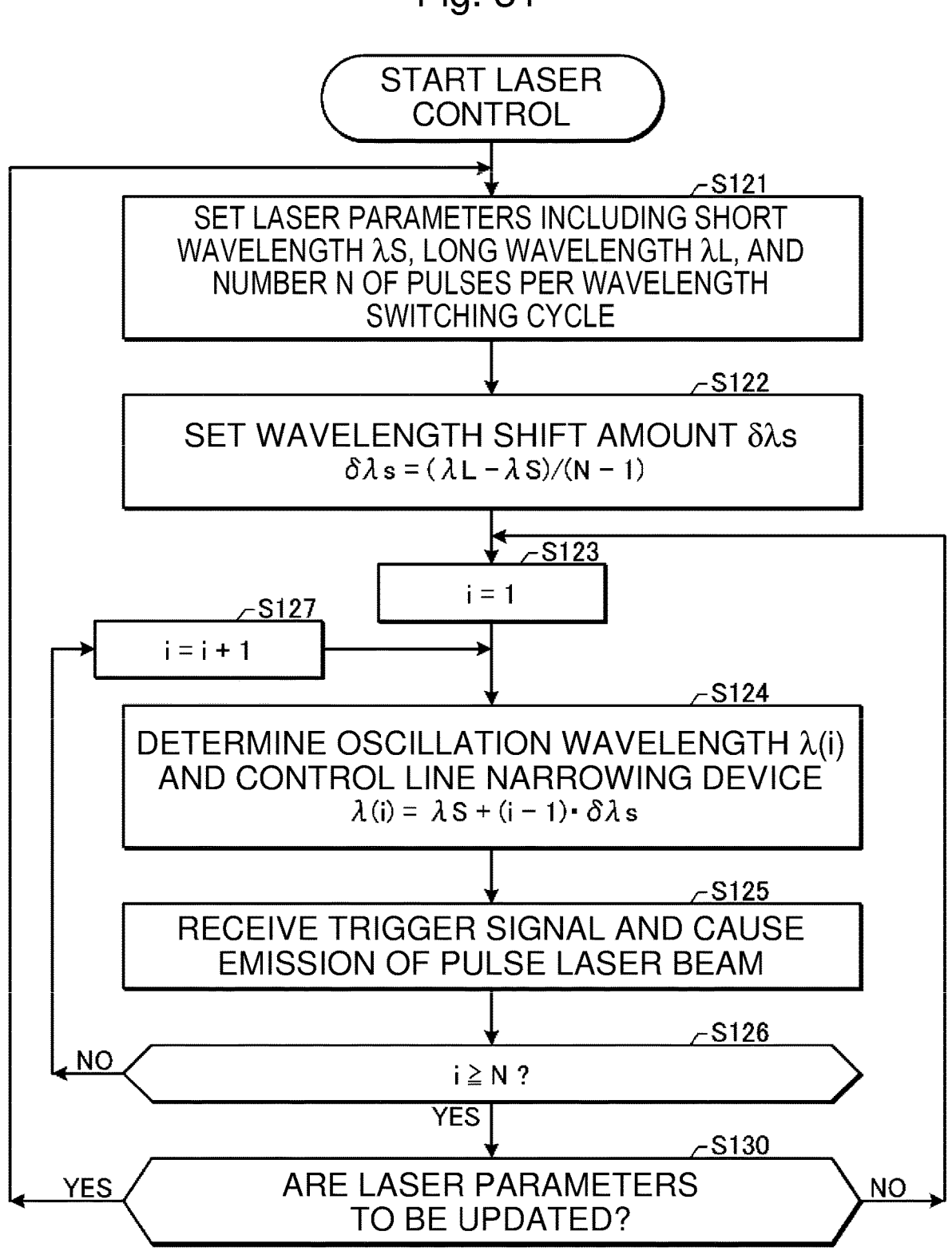
FIG. 31 is a flowchart illustrating processing of laser control by a laser control processor of the fifth embodiment.

FIG. 31 is a flowchart illustrating processing of laser control by the laser control processor 130 of the fifth embodiment. The laser control processor 130 switches the selected wavelength at multiple stages through processing described below.

At S121, the laser control processor 130 sets laser parameters including the short wavelength λS, the long wavelength λL, and the number N of pulses per wavelength switching cycle. The short wavelength λS, the long wavelength λL, and the number N of pulses per cycle thus set may be included in a wavelength setting signal received from the exposure control processor 210.

At S122, the laser control processor 130 sets the wavelength shift amount δλs by an expression below.

$$\delta\lambda s=(\lambda L-\lambda S)/(N-1)$$

At S123, the laser control processor 130 sets the value of a counter i to one.

At S124, the laser control processor 130 determines a wavelength λ(i) set for each value of the counter i by an expression below and controls the posture of the first prism 41 of the line narrowing device 14*e*.

$$\lambda(i)=\lambda S+(i-1)\cdot\delta\lambda s$$

When the value of the counter i is one, λ(i) is equal to the short wavelength λS.

When the value of the counter i is N, λ(i) is equal to the long wavelength λL.

When the value of the counter i is larger than one and is smaller than N, λ(i) is longer than the short wavelength λS and is shorter than the long wavelength λL. The wavelength λ(i) that is longer than the short wavelength λS and is shorter than the long wavelength λL corresponds to the third wavelength in the present disclosure, and a pulse laser beam having the third wavelength corresponds to a third pulse laser beam in the present disclosure.

At S125, the laser control processor 130 receives a trigger signal and transmits the trigger signal to the switch 13*a* of the pulse power module 13 to cause emission of a pulse laser beam from the laser apparatus 100.

At S126, the laser control processor 130 determines whether the value of the counter i is equal to or larger than N. When the value of the counter i is smaller than N (NO at S126), the laser control processor 130 advances processing to S127. At S127, the laser control processor 130 adds one to the value of the counter i and thereafter, returns processing to S124. When the value of the counter i is equal to or larger than N (YES at S126), the laser control processor 130 advances processing to S130. Accordingly, N pieces of the oscillation wavelength λ(i) are sequentially set and the posture of the first prism 41 is controlled.

At S130, the laser control processor 130 determines whether the laser parameters are to be updated. When the laser parameters are to be updated (YES at S130), the laser control processor 130 returns processing to S121. When the laser parameters are not to be updated (NO at S130), the laser control processor 130 returns processing to S123.

6.2 Other Exemplary Configurations

The description in the fifth embodiment is made on the case in which the laser control processor 130 sets the wavelength shift amount δλs, but the present disclosure is not limited thereto. For example, the exposure control processor 210 may set the wavelength shift amount δλs, determine the oscillation wavelength for each pulse based on the wavelength shift amount δλs, and transmit a wavelength command value to the laser control processor 130 at each pulse.

The description in the fifth embodiment is made on the case in which the posture of the first prism 41 is changed at each pulse, but the present disclosure is not limited thereto. For example, the posture of the second prism 42 or the grating 54 may be changed at each pulse.

6.3 Effect

According to the fifth embodiment, a plurality of pulse laser beams further include the third pulse laser beam having the third wavelength that is longer than the short wavelength λS and is shorter than the long wavelength λL.

With this configuration, it is possible to perform imaging at a large number of different positions in the thickness direction of the semiconductor wafer, thereby improving imaging performance. This is effective for exposure of a resist film having a large film thickness and also provides a process margin even for a thin resist film with a step on a pattern, thereby achieving yield improvement.

7. Master Oscillator MO Including Solid-State Laser

7.1 Configuration

FIG. 32 schematically illustrates the configuration of a laser apparatus 100*f* in a sixth embodiment. The laser apparatus 100*f* includes a master oscillator MO, an amplifier PA, the optical detector 17, and the laser control processor 130. The master oscillator MO includes a solid-state laser, and the amplifier PA includes an excimer laser.

7.1.1 Master Oscillator MO

The master oscillator MO includes a semiconductor laser system 60, a titanium sapphire amplifier 71, a wavelength conversion system 72, a pumping laser 73, and a solid-state laser control processor 180.

The semiconductor laser system 60 includes a distributed-feedback semiconductor laser DFB. Details of the semiconductor laser system 60 will be described later with reference to FIG. 33.

The titanium sapphire amplifier 71 includes a titanium sapphire crystal.

The pumping laser 73 is a laser apparatus configured to output the second harmonic of an yttrium-lithium-fluoride (YLF) laser to excite the titanium sapphire crystal of the titanium sapphire amplifier 71.

The wavelength conversion system 72 includes a lithium triborate (LBO) crystal and a potassium beryllium fluoroborate (KBBF) crystal and outputs the fourth harmonic of incident light.

The solid-state laser control processor 180 is a processing device including a memory 182 in which a control program is stored and a CPU 181 configured to execute the control program. The solid-state laser control processor 180 is specially configured or programmed to execute various kinds of processing included in the present disclosure. The solid-state laser control processor 180 is connected to each of the semiconductor laser system 60, the wavelength conversion system 72, and the pumping laser 73 and is configured to control these components.

7.1.2 Amplifier PA

The amplifier PA is an ArF excimer laser apparatus including the laser chamber 10, the charger 12, the pulse power module 13, a concave mirror 18, and a convex mirror 19. The configurations of the laser chamber 10, the charger 12, and the pulse power module 13 included in the amplifier PA are the same as the corresponding configurations in the laser apparatus 100 described above with reference to FIG. 2.

The convex mirror 19 is disposed on the optical path of a pulse laser beam output from the master oscillator MO and having passed through the laser chamber 10.

The concave mirror 18 is disposed on the optical path of a pulse laser beam reflected by the convex mirror 19 and having passed through the laser chamber 10 again.

7.1.3 Optical Detector 17 and Laser Control Processor 130

The configurations of the optical detector 17 and the laser control processor 130 are the same as the corresponding configurations in the laser apparatus 100 described above with reference to FIG. 2.

7.2 Operation

In the master oscillator MO, the semiconductor laser system 60 outputs a pulse laser beam having a wavelength of 773.6 nm approximately, and the titanium sapphire amplifier 71 amplifies and outputs the pulse laser beam. The wavelength conversion system 72 converts a pulse laser beam having a wavelength of 773.6 nm approximately into a pulse laser beam having a wavelength of 193.4 nm approximately and outputs the pulse laser beam toward the amplifier PA.

The pulse laser beam incident on the amplifier PA passes through the discharge space in the laser chamber 10 and then is reflected by the convex mirror 19 and provided with a beam spread angle in accordance with the curvature of the convex mirror 19. The pulse laser beam passes through the discharge space in the laser chamber 10 again.

The pulse laser beam reflected by the convex mirror 19 and having passed through the laser chamber 10 is reflected as substantially parallel light by the concave mirror 18. The pulse laser beam passes through the discharge space in the laser chamber 10 again and is output from the laser apparatus 100*f* through the optical detector 17.

High voltage is applied to the electrodes 11*a* and 11*b* so that discharge starts in the discharge space in the laser chamber 10 when a pulse laser beam is incident on the laser chamber 10 from the master oscillator MO. The beam width of the pulse laser beam is enlarged by the convex mirror 19 and the concave mirror 18, and the pulse laser beam is amplified while passing through the discharge space three times and then is output from the laser apparatus 100*f*.

7.3 Semiconductor Laser System 60

7.3.1 Configuration

Figure 33:
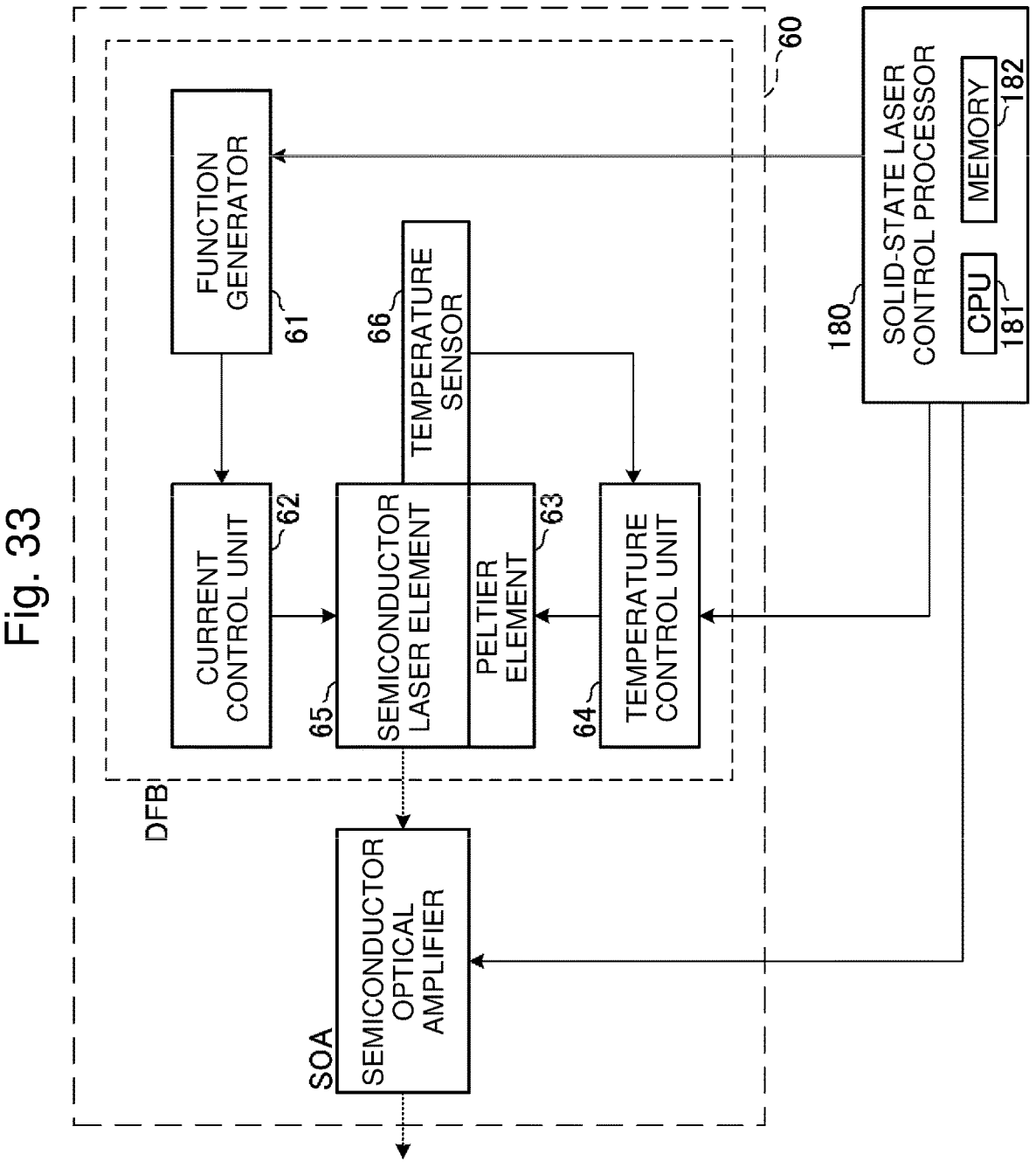
FIG. 33 schematically illustrates the configuration of a semiconductor laser system in the sixth embodiment.

FIG. 33 schematically illustrates the configuration of the semiconductor laser system 60 in the sixth embodiment. The semiconductor laser system 60 includes the distributed-feedback semiconductor laser DFB and a semiconductor optical amplifier SOA.

The distributed-feedback semiconductor laser DFB includes a function generator 61, a current control unit 62, a Peltier element 63, a temperature control unit 64, a semiconductor laser element 65, and a temperature sensor 66.

The semiconductor laser element 65 is a laser element, the oscillation wavelength of which is changeable by temperature or a current value. The current control unit 62 is connected to the semiconductor laser element 65. The Peltier element 63 and the temperature sensor 66 are fixed to the semiconductor laser element 65.

7.3.2 Operation

The semiconductor laser element 65 outputs a continuous wave (CW) laser beam having a wavelength of 773.6 nm approximately.

The temperature control unit 64 supplies current to the Peltier element 63 in accordance with a set temperature output from the solid-state laser control processor 180. The Peltier element 63 cools or heats the semiconductor laser element 65 by moving thermal energy in a direction from one of surfaces of the Peltier element 63 toward the other surface in accordance with the current supplied from the temperature control unit 64. The temperature sensor 66 detects the temperature of the semiconductor laser element 65. The temperature control unit 64 performs feedback control of current supplied to the Peltier element 63 based on the set temperature output from the solid-state laser control processor 180 and the temperature detected by the temperature sensor 66. The wavelength of the CW laser beam output from the semiconductor laser element 65 can be maintained at a value near 773.6 nm by controlling the semiconductor laser element 65 to the set temperature.

The function generator 61 generates an electric signal having a periodic waveform in accordance with a control signal output from the solid-state laser control processor 180. The current control unit 62 periodically changes current supplied to the semiconductor laser element 65 in accordance with the waveform of the electric signal generated by the function generator 61. Accordingly, the wavelength of the CW laser beam output from the semiconductor laser element 65 periodically changes.

The semiconductor optical amplifier SOA amplifies, into pulses, the CW laser beam output from the semiconductor laser element 65 and outputs a pulse laser beam.

Figure 34:
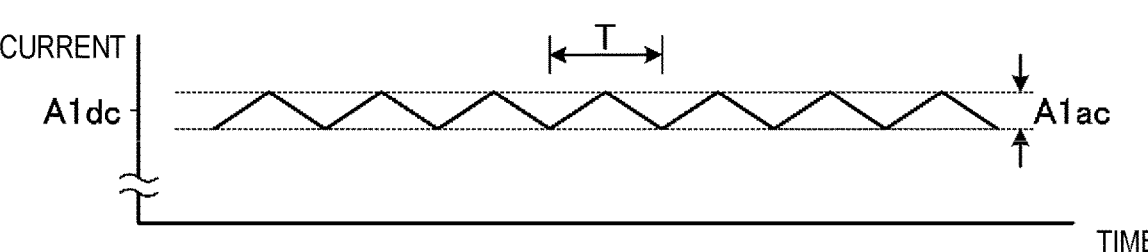
FIG. 34 is a graph illustrating the time waveform of current supplied to a semiconductor laser element in the sixth embodiment.

FIG. 34 is a graph illustrating the time waveform of current supplied to the semiconductor laser element 65 in the sixth embodiment. The current supplied from the current control unit 62 to the semiconductor laser element 65 includes a direct-current component A1dc and an alternating-current component of an amplitude A1ac and has a time waveform in the shape of triangular waves.

Figure 35:
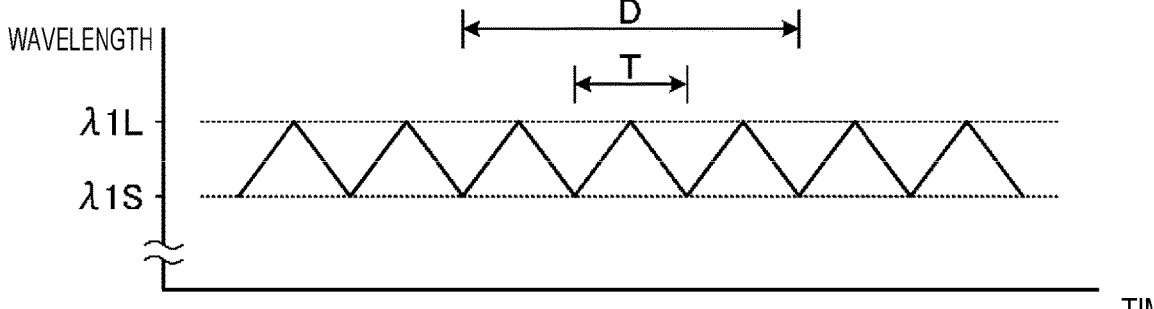
FIG. 35 is a graph illustrating temporal change of the wavelength of a CW laser beam output from the semiconductor laser element in the sixth embodiment.

FIG. 35 is a graph illustrating temporal change of the wavelength of the CW laser beam output from the semiconductor laser element 65 in the sixth embodiment. The semiconductor laser element 65 changes the wavelength of the CW laser beam between a short wavelength λ1S and a long wavelength λ1L in a variation period T in accordance with the current supplied from the current control unit 62. The short wavelength λ1S and the long wavelength λ1L are four times longer than the short wavelength λS and the long wavelength λL, respectively, of a pulse laser beam to be output from the wavelength conversion system 72. The variation period T of the wavelength of the CW laser beam is equal to the variation period T of the current illustrated in FIG. 34. The wavelength of the CW laser beam can be changed between the short wavelength λ1S and the long wavelength λ1L by controlling the direct-current component A1dc and the amplitude A1ac of the current supplied from the current control unit 62. For example, the semiconductor laser element 65 outputs the CW laser beam having the short wavelength λ1S when supplied with current obtained by subtracting half of the amplitude A1ac from the direct-current component A1dc, and outputs the CW laser beam having the long wavelength λ1L when supplied with current obtained by adding half of the amplitude A1ac to the direct-current component A1dc.

Figure 36:
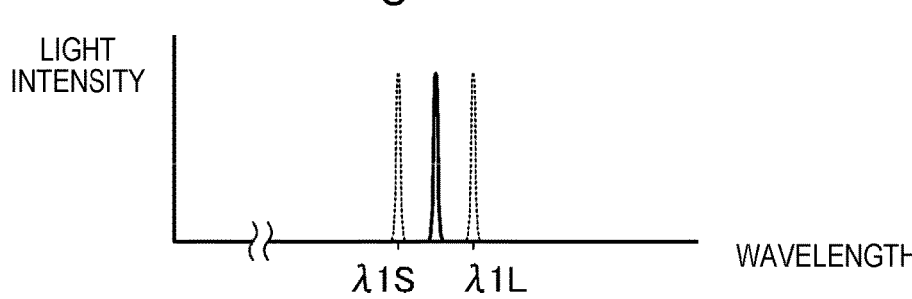
FIG. 36 is a graph illustrating the spectrum waveform of the CW laser beam output from the semiconductor laser element in the sixth embodiment.

FIG. 36 is a graph illustrating the spectrum waveform of the CW laser beam output from the semiconductor laser element 65 in the sixth embodiment. The spectrum waveform of the CW laser beam includes an abrupt peak, and the central wavelength thereof changes between the short wavelength λ1S and the long wavelength λ1L in accordance with the current supplied from the current control unit 62. Although FIG. 36 illustrates three spectrum waveforms as the spectrum waveform of the CW laser beam, the central wavelength of the CW laser beam continuously changes between the short wavelength λ1S and the long wavelength λ1L as described above with reference to FIG. 35.

Figure 37:
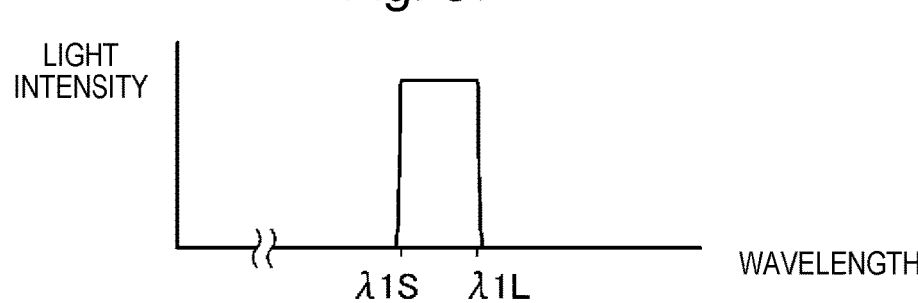
FIG. 37 is a graph illustrating a result of integration of the spectrum waveform of the CW laser beam output from the semiconductor laser element in the sixth embodiment over a wavelength variation period T.

FIG. 37 is a graph illustrating a result of integration of the spectrum waveform of the CW laser beam output from the semiconductor laser element 65 in the sixth embodiment over the wavelength variation period T. The integration of the spectrum waveform of the CW laser beam over a time equal to the wavelength variation period T or an integer multiple thereof obtains a spectrum waveform in a substantially flat top shape.

A pulse time width D (refer to FIG. 35) of a pulse laser beam output from the semiconductor optical amplifier SOA preferably has the following relation with the wavelength variation period T.

$$D=n\cdot T$$

In the above expression, n represents an integer equal to one or larger.

In this case, light of n periods in the CW laser beam having a wavelength that changes in the variation period T is extracted and amplified by the semiconductor optical amplifier SOA. Accordingly, the pulse laser beam having a spectrum waveform in a substantially flat top shape can be output from the semiconductor optical amplifier SOA.

The wavelength variation period T is preferably shorter than the pulse time width D of the pulse laser beam output from the semiconductor optical amplifier SOA. The wavelength variation period T is preferably equal to or shorter than a time taken for rising of the pulse laser beam output from the semiconductor optical amplifier SOA.

7.4 Other Exemplary Configurations

The description in the sixth embodiment is made on the case in which the semiconductor laser system 60 outputs a pulse laser beam having a wavelength of 773.6 nm approximately and the wavelength conversion system 72 converts the pulse laser beam into fourth harmonic, but the present disclosure is not limited thereto. The semiconductor laser system 60 may output a pulse laser beam having a wavelength of 1547.2 nm approximately, and the wavelength conversion system 72 may convert the pulse laser beam into eighth harmonic.

The description in the sixth embodiment is made on the case in which a pulse laser beam output from the wavelength conversion system 72 is amplified by the amplifier PA including no optical resonator, but the present disclosure is not limited thereto. The pulse laser beam output from the wavelength conversion system 72 may be amplified by a power oscillator (PO) including an optical resonator.

The description in the sixth embodiment is made on the case in which the oscillation wavelength changes in the variation period T in the pulse time width D of one pulse of a pulse laser beam output from the semiconductor optical amplifier SOA, but the present disclosure is not limited thereto. In other words, the oscillation wavelength does not necessarily need to change in the pulse time width D of one pulse of a pulse laser beam output from the semiconductor optical amplifier SOA. Similarly to the wavelength control in the fourth and fifth embodiments, the oscillation wavelength may be changed for each pulse. In this case, the distributed-feedback semiconductor laser DFB does not necessarily need to include the function generator 61, and current in accordance with a target oscillation wavelength may be caused to flow through the distributed-feedback semiconductor laser DFB.

7.5 Effect

According to the sixth embodiment, the laser apparatus 100f includes the master oscillator MO including a solid-state laser, and the amplifier PA including an excimer laser.

With this configuration, wavelength control can be performed at high speed and high accuracy by using the solid-state laser.

According to the sixth embodiment, the solid-state laser includes the distributed-feedback semiconductor laser DFB and the semiconductor optical amplifier SOA. The wavelength of a CW laser beam output from the distributed-feedback semiconductor laser DFB is changed by current supplied to the distributed-feedback semiconductor laser DFB. The semiconductor optical amplifier SOA amplifies the CW laser beam into pulses and outputs a pulse laser beam.

With this configuration, wavelength control can be speeded up by using the distributed-feedback semiconductor laser DFB, the oscillation wavelength of which is changed by the supplied current, and using the semiconductor optical amplifier SOA for pulse extraction.

According to the sixth embodiment, the current supplied to the distributed-feedback semiconductor laser DFB is controlled such that the wavelength variation period T of the CW laser beam output from the distributed-feedback semiconductor laser DFB is shorter than the pulse time width D of the pulse laser beam output from the semiconductor optical amplifier SOA.

With this configuration, since the wavelength is changed at high speed in one pulse of the pulse laser beam output from the semiconductor optical amplifier SOA, a semiconductor wafer can be exposed by using a pulse having a spectrum waveform in a flat top shape in effect.

8. Semiconductor Laser System 60g Including a Plurality of Distributed-Feedback Semiconductor Lasers DFB

8.1 Configuration

Figure 38:
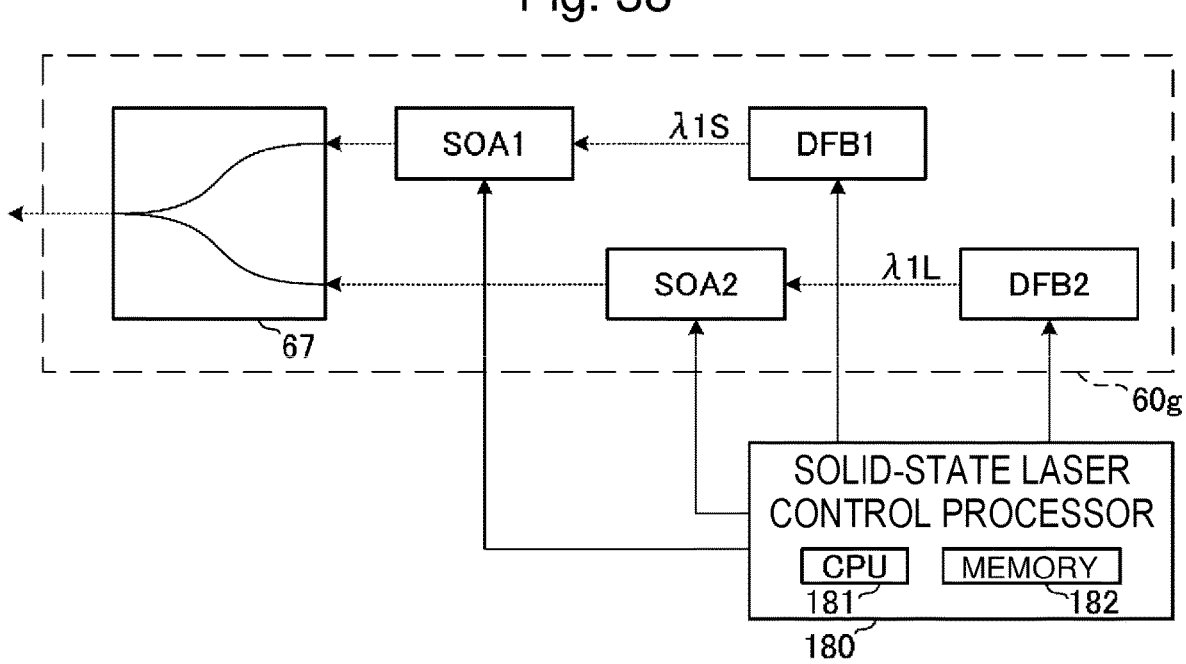
FIG. 38 schematically illustrates the configuration of a semiconductor laser system in a seventh embodiment.

FIG. 38 schematically illustrates the configuration of a semiconductor laser system 60g in a seventh embodiment. The semiconductor laser system 60g includes two distributed-feedback semiconductor lasers DFB1 and DFB2, two semiconductor optical amplifiers SOA1 and SOA2, and a beam combiner 67.

The distributed-feedback semiconductor lasers DFB1 and DFB2 are each the same as the distributed-feedback semiconductor laser DFB described above with reference to FIG. 33. However, the distributed-feedback semiconductor lasers DFB1 and DFB2 may each include no function generator 61. The semiconductor optical amplifiers SOA1 and SOA2 are each the same as the semiconductor optical amplifier SOA described above with reference to FIG. 33.

8.2 Operation

The distributed-feedback semiconductor laser DFB1 outputs a CW laser beam having the short wavelength $\lambda 1S$. The distributed-feedback semiconductor laser DFB2 outputs a CW laser beam having the long wavelength $\lambda 1L$. The CW laser beam output from the distributed-feedback semiconductor laser DFB1 is amplified into pulses by the semiconductor optical amplifier SOA1 and incident as a first pulse laser beam on the beam combiner 67. The CW laser beam output from the distributed-feedback semiconductor laser DFB2 is amplified into pulses by the semiconductor optical amplifier SOA2 and incident as a second pulse laser beam on the beam combiner 67. The beam combiner 67 aligns the optical paths of the first and second pulse laser beams and outputs the first and second pulse laser beams from the semiconductor laser system 60g.

Figure 39:
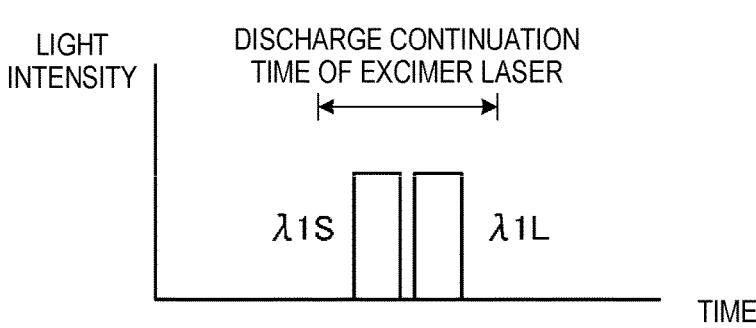
FIG. 39 illustrates a synthesis waveform of first and second pulse laser beams output from respective semiconductor optical amplifiers SOA1 and SOA2 in the seventh embodiment.

FIG. 39 illustrates a synthesis waveform of the first and second pulse laser beams output from the respective semiconductor optical amplifiers SOA1 and SOA2 in the seventh embodiment. The pulse time waveforms of the first and second pulse laser beams preferably do not temporally overlap, and the time width of the synthesis waveform thereof is preferably shorter than the discharge continuation time of the amplifier PA configured as an excimer laser. For example, the pulse widths of the first and second pulse laser beams are each 20 ns, and an interval time from falling of the pulse time waveform of the first pulse laser beam to rising of the pulse time waveform of the second pulse laser beam is 1 ns. The time width of the synthesis waveform obtained by synthesizing these pulse time waveforms is 41 ns, which is shorter than the discharge continuation time of the excimer laser. Such first and second pulse laser beams are combined at the beam combiner 67, subjected to wavelength conversion at the wavelength conversion system 72 (refer to FIG. 32), and amplified at the amplifier PA, and accordingly, a pulse laser beam including two wavelength components of the short wavelength $\lambda S$ and the long wavelength $\lambda L$ can be output from the laser apparatus 100f.

8.3 Other Exemplary Configurations

The description in the seventh embodiment is made on the case in which the semiconductor laser system 60g includes the two distributed-feedback semiconductor lasers DFB1 and DFB2, but the present disclosure is not limited thereto. CW laser beams having wavelengths different from one another may be output from three distributed-feedback semiconductor lasers or more, and a pulse laser beam having three wavelengths or more may be output from the semiconductor laser system.

The description in the seventh embodiment is made on the case in which the time width of the synthesis waveform of the first and second pulse laser beams output from the respective semiconductor optical amplifiers SOA1 and SOA2 is shorter than the discharge continuation time of the amplifier PA, but the present disclosure is not limited thereto. The first pulse laser beam may be output from the semiconductor optical amplifier SOA1 in accordance with one discharge timing at the amplifier PA, and the second pulse laser beam may be output from the semiconductor optical amplifier SOA2 in accordance with another discharge timing at the amplifier PA. In this case, similarly to the wavelength control in the fourth embodiment, the wavelength may be changed for each pulse.

As described above with reference to FIG. 11, the exposure control processor 210 determines the short wavelength $\lambda S$ and the long wavelength $\lambda L$ based on the wavelength difference target value $\delta \lambda t$ determined from the optimum wavelength difference table and the command values of the various parameters. In the third to seventh embodiments, the optimum wavelength difference table may be produced according to any of the first embodiment or the modifications thereof or may be produced according to the second embodiment.

8.4 Effect

According to the seventh embodiment, the solid-state laser includes the distributed-feedback semiconductor lasers DFB1 and DFB2 and the semiconductor optical amplifiers SOA1 and SOA2. The distributed-feedback semiconductor lasers DFB1 and DFB2 output CW laser beams having wavelengths different from each other. The semiconductor optical amplifiers SOA1 and SOA2 amplify, into pulses, the CW laser beams output from the respective distributed-feedback semiconductor lasers DFB1 and DFB2.

With this configuration, a semiconductor wafer can be exposed by using a pulse laser beam of the short wavelength $\lambda S$ and the long wavelength $\lambda L$ without changing the oscillation wavelengths of the respective distributed-feedback semiconductor lasers DFB1 and DFB2 at high speed.

According to the seventh embodiment, the semiconductor optical amplifiers SOA1 and SOA2 are controlled such that the pulse time waveforms output from the respective semiconductor optical amplifiers SOA1 and SOA2 do not overlap with each other and the time width of the synthesis waveform obtained by synthesizing the pulse time waveforms is shorter than the discharge continuation time of the excimer laser.

With this configuration, one pulse of a pulse laser beam output from the amplifier PA configured as the excimer laser can include the short wavelength $\lambda S$ and the long wavelength $\lambda L$.

9. Other

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. An exposure method comprising:
reading data indicating a relation between parameters and a wavelength difference between a first pulse laser beam and a second pulse laser beam, the parameters being related to exposure conditions under which a semiconductor wafer is exposed to a plurality of pulse laser beams including the first pulse laser beam and the second pulse laser beam;
determining a target value of the wavelength difference based on the data and command values of the parameters;
determining a first wavelength of the first pulse laser beam and a second wavelength of the second pulse laser beam based on the target value of the wavelength difference;
outputting a wavelength setting signal to a laser apparatus to cause emission of the pulse laser beams including the first pulse laser beam having the first wavelength and the second pulse laser beam having the second wavelength; and
exposing the semiconductor wafer to the pulse laser beams.

2. The exposure method according to claim 1, wherein the parameters include at least one of
a parameter of an illumination optical system of an exposure apparatus configured to expose the semiconductor wafer,
a parameter of a projection optical system of the exposure apparatus, and
a parameter of a mask for exposing the semiconductor wafer.

3. The exposure method according to claim 1, wherein the data associates the parameters with the wavelength difference with which a focal point depth when the semiconductor wafer is exposed by using the parameters is maximum.

4. The exposure method according to claim 1, further comprising calculating the wavelength difference with which a focal point depth when the semiconductor wafer is exposed by using the parameters is maximum and producing the data by setting the parameters, setting a plurality of values as the wavelength difference, and calculating the focal point depth for each of the values.

5. The exposure method according to claim 4, wherein the focal point depth is calculated for each of the values by using the parameters, the first wavelength, and the second wavelength, the first wavelength and the second wavelength being set based on a standard wavelength of the laser apparatus.

6. The exposure method according to claim 4, wherein information on an exposure process is read and the parameters are set in accordance with the exposure process.

7. The exposure method according to claim 4, wherein whether to calculate the wavelength difference with which the focal point depth is maximum is determined, and the wavelength difference is calculated in accordance with a result of the determination.

8. The exposure method according to claim 4, further comprising setting a plurality of focus positions, performing test exposure of the semiconductor wafer with the pulse laser beams for each of the focus positions, and measuring a CD value of the semiconductor wafer subjected to the test exposure, wherein the data is produced based on the focus positions and the CD value.

9. The exposure method according to claim 8, wherein the focal point depth is calculated based on a range of a focus position for which the CD value is in an allowable range among the focus positions.

10. The exposure method according to claim 1, wherein the first pulse laser beam and the second pulse laser beam are emitted as a temporally overlapping pulse to the semiconductor wafer.

11. The exposure method according to claim 1, wherein the pulse laser beams further include a third pulse laser beam having a third wavelength that is longer than the first wavelength and is shorter than the second wavelength.

12. The exposure method according to claim 1, wherein the first pulse laser beam and the second pulse laser beam are emitted to the semiconductor wafer at timings that are different from each other.

13. The exposure method according to claim 1, wherein the laser apparatus includes a master oscillator and an amplifier, the master oscillator including a solid-state laser, the amplifier including an excimer laser.

14. The exposure method according to claim 13, wherein the solid-state laser includes a distributed-feedback semiconductor laser and a semiconductor optical amplifier, the distributed-feedback semiconductor laser being configured to output a CW laser beam having a wavelength that changes with supplied current, the semiconductor optical amplifier being configured to amplify the CW laser beam into pulses and output a pulse laser beam.

15. The exposure method according to claim 14, wherein the current is controlled such that a wavelength variation period of the CW laser beam output from the distributed-feedback semiconductor laser is shorter than a pulse time width of the pulse laser beam output from the semiconductor optical amplifier.

16. The exposure method according to claim 13, wherein the solid-state laser includes a plurality of distributed-feedback semiconductor lasers and a plurality of semiconductor optical amplifiers, the distributed-feedback semiconductor lasers being configured to output CW laser beams having wavelengths different from each other, the semiconductor optical amplifiers being configured to amplify, into pulses, the respective CW laser beams output from the distributed-feedback semiconductor lasers.

17. The exposure method according to claim 16, wherein the semiconductor optical amplifiers are controlled such that a plurality of pulse time waveforms output from the respective semiconductor optical amplifiers do not overlap with each other and a time width of a synthesis waveform obtained by synthesizing the pulse time waveforms is shorter than a discharge continuation time of the excimer laser.

18. An exposure system comprising:
a processor configured to
read data indicating a relation between parameters and a wavelength difference between a first pulse laser beam and a second pulse laser beam, the parameters being related to exposure conditions under which a semiconductor wafer is exposed to a plurality of pulse laser beams including the first pulse laser beam and the second pulse laser beam,
determine a target value of the wavelength difference based on the data and command values of the parameters, determine a first wavelength of the first pulse laser beam and a second wavelength of the second pulse laser beam based on the target value of the wavelength difference, and output a wavelength setting signal to a laser apparatus to cause emission of the pulse laser beams including the first pulse laser beam having the first wavelength and the second pulse laser beam having the second wavelength; and an optical system configured to expose the semiconductor wafer to the pulse laser beams.

19. The exposure system according to claim 18, further comprising a memory storing a table that associates the parameters with the wavelength difference with which a focal point depth when the semiconductor wafer is exposed by using the parameters is maximum.

20. An electronic device manufacturing method comprising:

reading data indicating a relation between parameters and a wavelength difference between a first pulse laser beam and a second pulse laser beam, the parameters being related to exposure conditions under which a semiconductor wafer is exposed to a plurality of pulse laser beams including the first pulse laser beam and the second pulse laser beam;

determining a target value of the wavelength difference based on the data and command values of the parameters;

determining a first wavelength of the first pulse laser beam and a second wavelength of the second pulse laser beam based on the target value of the wavelength difference;

outputting a wavelength setting signal to a laser apparatus to cause emission of the pulse laser beams including the first pulse laser beam having the first wavelength and the second pulse laser beam having the second wavelength to an exposure apparatus; and exposing the semiconductor wafer to the pulse laser beams in the exposure apparatus to manufacture an electronic device.

* * * * *